US011960856B1

(12) United States Patent
Ware

(10) Patent No.: US 11,960,856 B1
(45) Date of Patent: Apr. 16, 2024

(54) MULTIPLIER-ACCUMULATOR PROCESSING PIPELINE USING FILTER WEIGHTS HAVING GAUSSIAN FLOATING POINT DATA FORMAT

(71) Applicant: Flex Logix Technologies, Inc., Mountain View, CA (US)

(72) Inventor: Frederick A. Ware, Los Altos Hills, CA (US)

(73) Assignee: Flex Logix Technologies, Inc., Mountain View, CA (US)

( * ) Notice: Subject to any disclaimer, the term of this patent is extended or adjusted under 35 U.S.C. 154(b) by 431 days.

(21) Appl. No.: 17/140,169

(22) Filed: Jan. 4, 2021

Related U.S. Application Data

(60) Provisional application No. 62/961,627, filed on Jan. 15, 2020.

(51) Int. Cl.
*G06F 7/544* (2006.01)
*H03M 7/24* (2006.01)

(52) U.S. Cl.
CPC ............ *G06F 7/5443* (2013.01); *H03M 7/24* (2013.01)

(58) Field of Classification Search
CPC ...... G06F 7/5443; G06F 17/15; G06F 17/153; G06F 17/16; H03M 7/24; G06N 3/06; G06N 3/063
See application file for complete search history.

(56) References Cited

U.S. PATENT DOCUMENTS

| | | |
|---|---|---|
| 4,958,312 A | 9/1990 | Ang et al. |
| 6,115,729 A | 9/2000 | Matheny et al. |
| 6,148,101 A | 11/2000 | Tanaka et al. |
| 6,298,366 B1 | 10/2001 | Gatherer et al. |
| 7,107,305 B2 | 9/2006 | Deng et al. |

(Continued)

FOREIGN PATENT DOCUMENTS

| | | |
|---|---|---|
| EP | 0405726 | 3/1999 |
| EP | 2280341 | 6/2013 |

OTHER PUBLICATIONS

Liang Yun, et al., "Evaluating Fast Algorithms for Convolutional Neural Networks on FPGAs", IEEE Transactions on Computer-Aided Design of Integrated Circuits and Systems, vol. 39, No. 4, Feb. 5, 2019, 14 pages.

(Continued)

*Primary Examiner* — Andrew Caldwell
*Assistant Examiner* — Carlo Waje
(74) *Attorney, Agent, or Firm* — Charles Shemwell

(57) ABSTRACT

A system and/or an integrated circuit including a multiplier-accumulator execution pipeline which includes a plurality of MACs to implement a plurality of multiply and accumulate operations. A first memory stores filter weights having a Gaussian floating point ("GFP") data format and a first bit length. A data format conversion circuitry includes circuitry to convert the filter weights from the GFP data format and the first bit length to filter weights having the data format and bit length that are different from the GFP data format and the first bit length. The converted filter weights are output to the MACs, wherein in operation, the MACs are configured to perform the plurality of multiply operations using (a) the input data and (b) the filter weights having the data format and bit length that are different from the GFP data format and the first bit length, respectively.

20 Claims, 29 Drawing Sheets

(56) References Cited

U.S. PATENT DOCUMENTS

| | | | |
|---|---|---|---|
| 7,299,342 | B2 | 11/2007 | Nilsson et al. |
| 7,346,644 | B1 | 3/2008 | Langhammer et al. |
| 7,698,358 | B1 | 4/2010 | Langhammer et al. |
| 8,051,124 | B2 | 11/2011 | Salama et al. |
| 8,645,450 | B1 | 2/2014 | Choe et al. |
| 8,751,551 | B2 | 6/2014 | Streicher et al. |
| 8,788,562 | B2 | 7/2014 | Langhammer et al. |
| 9,600,278 | B1 | 3/2017 | Langhammer |
| 2003/0172101 | A1 | 9/2003 | Liao et al. |
| 2007/0239967 | A1 | 10/2007 | Dally et al. |
| 2008/0211827 | A1 | 9/2008 | Donovan et al. |
| 2009/0094303 | A1 | 4/2009 | Katayama |
| 2014/0019727 | A1 | 1/2014 | Zhu et al. |
| 2017/0011288 | A1 | 1/2017 | Brothers et al. |
| 2017/0115958 | A1 | 4/2017 | Langhammer |
| 2017/0116693 | A1 | 4/2017 | Rae et al. |
| 2017/0214929 | A1 | 7/2017 | Susnow et al. |
| 2017/0315778 | A1 | 11/2017 | Sano |
| 2017/0322813 | A1 | 11/2017 | Langhammer |
| 2017/0344876 | A1 | 11/2017 | Brothers |
| 2018/0052661 | A1 | 2/2018 | Langhammer |
| 2018/0081632 | A1 | 3/2018 | Langhammer |
| 2018/0081633 | A1 | 3/2018 | Langhammer |
| 2018/0157961 | A1 | 6/2018 | Henry et al. |
| 2018/0189651 | A1 | 7/2018 | Henry et al. |
| 2018/0300105 | A1 | 10/2018 | Langhammer |
| 2018/0321909 | A1 | 11/2018 | Langhammer |
| 2018/0321910 | A1 | 11/2018 | Langhammer et al. |
| 2018/0341460 | A1 | 11/2018 | Langhammer |
| 2018/0341461 | A1 | 11/2018 | Langhammer |
| 2019/0042191 | A1 | 2/2019 | Langhammer |
| 2019/0042244 | A1 | 2/2019 | Henry et al. |
| 2019/0042544 | A1 | 2/2019 | Kashyap et al. |
| 2019/0079728 | A1 | 3/2019 | Langhammer et al. |
| 2019/0196786 | A1 | 6/2019 | Langhammer |
| 2019/0250886 | A1 | 8/2019 | Langhammer |
| 2019/0286417 | A1 | 9/2019 | Langhammer |
| 2019/0294413 | A1* | 9/2019 | Vantrease .............. G06F 7/5095 |
| 2019/0310828 | A1 | 10/2019 | Langhammer et al. |
| 2019/0324722 | A1 | 10/2019 | Langhammer |
| 2019/0340489 | A1 | 11/2019 | Mills |
| 2020/0004506 | A1 | 1/2020 | Langhammer et al. |
| 2020/0026493 | A1 | 1/2020 | Streicher et al. |
| 2020/0097799 | A1 | 3/2020 | Divakar et al. |
| 2020/0174750 | A1 | 6/2020 | Langhammer |
| 2020/0279153 | A1* | 9/2020 | Fowers .................. G06N 3/045 |
| 2020/0326948 | A1 | 10/2020 | Langhammer |

OTHER PUBLICATIONS

Priyanka Nain, "Multiplier-Accumulator (MAC) Unit", IJDACR, vol. 5, Issue 3, Oct. 2016, 4 pages.

Jebashini et al., "A Survey and Comparative Analysis of Multiply-Accumulate (MAC) Block for Digital Signal Processing Application on ASIC and FPGA", Journal of Applied Science, vol. 15, Issue 7, pp. 934-946, Jul. 2015.

Agrawal et al., "A 7nm 4-Core AI Chip with 25.6TFLOPS Hybrid FP8 Training, 102.4TOPS INT4 Inference and Workload-Aware Throttling", ISSCC, pp. 144-145, 2021.

Linley Gwennap, "IBM Demonstrates New AI Data Types", Microprocessor Report, Apr. 2021.

Choi et al., "Accurate and Efficient 2-Bit Quantized Neural Networks", Proceedings of $2^{nd}$ SysML Conf, 2019, 12 pages.

Sun et al., "Hybrid 8-bit Floating Point (HFP8) Training and Inference for Deep Neural Networks", NeurIPS 2019, 10 pages.

"nVidia A100 Tensor Core GPU Architecture", v1.0, 2020, 82 pages.

Papadantonakis et al., "Pipelining Saturated Accumulation", IEEE, vol. 58, No. 2, pp. 208-219, Feb. 2009.

* cited by examiner

FIG. 2B

Exemplary Floating point number space – Floating Point Data Format (FP16)

| Positive space | | | |
|---|---|---|---|
| S | E[7:0] | F0 F[1:7] | |
| 0 | 1111 1111 | - not 0000000 | NAN (not-a-number) |
| 0 | 1111 1111 | - 0000000 | INF (+ infinity) |
| 0 | 1111 1110 | 1 1111111 | NRM (+ max)  $+(255/128) * 2^{254-127}$ |
| 0 | 1111 1110 | 1 1111110 | NRM  $+(255/128) * 2^{254-127}$ |
| ... | ... | ... | ... |
| 0 | 0111 1111 | 1 0000001 | NRM  $+(129/128) * 2^{127-127}$ |
| 0 | 0111 1111 | 1 0000000 | NRM (+ 1.0)  $+(128/128) * 2^{127-127}$ |
| 0 | 0111 1110 | 1 1111111 | NRM  $+(255/128) * 2^{126-127}$ |
| ... | ... | ... | ... |
| 0 | 0000 0001 | 1 0000001 | NRM  $+(129/128) * 2^{01-127}$ |
| 0 | 0000 0001 | 1 0000000 | NRM (+ min)  $+(128/128) * 2^{01-127}$ |
| 0 | 0000 0000 | 1 1111111 | DNRM (+ max)  $+(127/128) * 2^{01-127}$ |
| 0 | 0000 0000 | 1 1111110 | DNRM  $+(126/128) * 2^{01-127}$ |
| ... | ... | ... | ... |
| 0 | 0000 0000 | 0 0000010 | DNRM  $+(002/128) * 2^{01-127}$ |
| 0 | 0000 0000 | 0 0000001 | DNRM (+ min)  $+(001/128) * 2^{01-127}$ |
| 0 | 0000 0000 | - 0000000 | ZRO (+ 0.0) |

| Negative space | | | |
|---|---|---|---|
| S | E[7:0] | F0 F[1:7] | |
| 1 | 0000 0000 | - 0000000 | ZRO (- 0.0) |
| 1 | 0000 0000 | 0 0000001 | DNRM (- min)  $-(001/128) * 2^{01-127}$ |
| 1 | 0000 0000 | 0 0000010 | DNRM  $-(002/128) * 2^{01-127}$ |
| ... | ... | ... | ... |
| 1 | 0000 0000 | 0 1111110 | DNRM  $-(126/128) * 2^{01-127}$ |
| 1 | 0000 0000 | 0 1111111 | DNRM (- max)  $-(127/128) * 2^{01-127}$ |
| 1 | 0000 0001 | 1 0000000 | NRM (- min)  $-(128/128) * 2^{01-127}$ |
| 1 | 0000 0001 | 1 0000001 | NRM  $-(129/128) * 2^{01-127}$ |
| ... | ... | ... | ... |
| 1 | 0111 1110 | 1 1111111 | NRM  $-(255/128) * 2^{126-127}$ |
| 1 | 0111 1111 | 1 0000000 | NRM (- 1.0)  $-(128/128) * 2^{127-127}$ |
| 1 | 0111 1111 | 1 0000001 | NRM  $-(129/128) * 2^{127-127}$ |
| ... | ... | ... | ... |
| 1 | 1111 1110 | 1 1111111 | NRM  $-(255/128) * 2^{254-127}$ |
| 1 | 1111 1111 | - 0000000 | INF (- infinity) |
| 1 | 1111 1111 | - not 0000000 | NAN (not-a-number) |

FIG. 7

Exemplary Gaussian Floating Point Format (GFP8x)

MULTIPLIER-ACCUMULATOR PROCESSING PIPELINE USING FILTER WEIGHTS HAVING GAUSSIAN FLOATING POINT DATA FORMAT

RELATED APPLICATION

This non-provisional application claims priority to and the benefit of U.S. Provisional Application No. 62/961,627, entitled "Multiplier-Accumulator Processing Pipeline using Filter Weights having Gaussian Floating Point Data Format", filed Jan. 15, 2020. The '627 provisional application is hereby incorporated herein by reference in its entirety.

INTRODUCTION

There are many inventions described and illustrated herein. The present inventions are neither limited to any single aspect nor embodiment thereof, nor to any combinations and/or permutations of such aspects and/or embodiments. Importantly, each of the aspects of the present inventions, and/or embodiments thereof, may be employed alone or in combination with one or more of the other aspects of the present inventions and/or embodiments thereof. All combinations and permutations thereof are intended to fall within the scope of the present inventions.

In one aspect, the present inventions are directed to one or more integrated circuits having multiplier-accumulator circuitry (and methods of operating such circuitry) including processing or execution pipeline(s) for processing data (e.g., filtering image data) wherein the filter coefficients or weights, employed in the multiply operations, are converted from a first data format (i.e., Gaussian floating point data format; notably, Gaussian floating point is referred to herein, at times, as "GFP") to a second data format (e.g., fixed point data format or floating point data format), via data format conversion circuitry. The bit length/width of the filter weight having first data format may be the same as or different from the bit length/width of the filter weight having the second data format. For example, the filter weights, having the first data format, may be an 8 bit Gaussian floating point data format, and, after data format conversion, the filter weights, having a second data format, may be an 8 bit fixed point data format (e.g., integer or block-scaled fraction) or a 16 bit floating point data format.

The filter coefficients or weights, having the first format (i.e., Gaussian floating point data format), may be stored in memory resident on the one or more integrated circuits having multiplier-accumulator circuitry. Here, the multiplier-accumulator circuitry includes a plurality of multiplier-accumulator circuits (referred to herein, at times, as "MACs" or "MAC circuits" and singly as "MAC" or "MAC circuit") and may be configured or interconnected (for example, in a serially) to form one or more data processing pipeline which implement the multiply and accumulate operations. The filter coefficients or weights having a Gaussian floating point data format include a more symmetrical distribution from a maximum center-value (relative to other data formats, e.g., fixed point data format or floating point data format) and, as such, may provide a suitable tradeoff between range and precision. Moreover, the symmetrically distributive nature of the Gaussian floating point data format may reduce the memory allocation/size attributed to the filter weights to a number of bits, in view of the available memory on the one or more integrated circuits, that provides an appropriate range and precision thereof in connection with the filtering operations (e.g., image filtering).

In one embodiment, the filter coefficients or weights, having an initial data format (e.g., a fixed point data format or floating point data format) that is different from Gaussian floating point data format, are provided to and received by the one or more integrated circuits from, for example, a system host or external processor. Thereafter, the data format of the filter coefficients or weights is converted to Gaussian floating point data format, via data format conversion circuitry, and stored in memory. For example, the filter coefficients or weights having the Gaussian floating point data format are stored in memory (e.g., L2, L1 and/or L0 memory) that is resident on the one or more integrated circuits having multiplier-accumulator circuitry of the execution pipeline(s).

In another embodiment, the one or more integrated circuits having multiplier-accumulator circuitry of the execution pipeline(s) receives filter coefficients or weights having a Gaussian floating point data format. In one embodiment, after receiving the filter coefficients in a Gaussian floating point data format, the filter coefficients may be stored in memory (e.g., L2, L1 or L0 memory) that is resident on the one or more integrated circuits for subsequent use by the multiplier-accumulator circuitry in connection with the data processing operations. Here again, storing the filter weights in a Gaussian floating point data format in the resident memory may reduce the memory allocation/size necessary or employed to store the filter weights while also providing and/or maintaining a suitable range and precision of the filter weights in relation to the filtering (e.g., image filtering) operations of the multiplier-accumulator circuitry of the processing or execution pipeline(s).

Thus, the conversion process of the data format of the filter coefficients or weights may be implemented, via data format conversion circuitry, disposed in the host computer (e.g., via a processor) and/or in/on the one or more integrated circuits having the multiplier-accumulator processing circuitry (which includes the execution pipeline for filtering image data via the multiplier-accumulator circuitry). That is, in one embodiment, circuitry in the host computer may partially or fully perform implement the conversion processes from, for example, a floating point or fixed data format to a Gaussian floating point data format described and/or illustrated herein. Alternatively, circuitry in/on the integrated circuits of the multiplier-accumulator processing circuitry may partially or fully perform or implement the data format conversion processes to a Gaussian floating point data. All combinations and permutations of which circuitry implements or performs one or more, or all of the format conversion processes are intended to fall within the scope of the present inventions.

Notably, in one embodiment, the multiply-accumulate circuitry (and methods of operating such circuitry) include a plurality of execution or processing pipelines, each having a plurality of multiply-accumulate circuits. Such plurality of multiply-accumulate circuits may be serially connected to perform multiply and accumulate processes in a concatenated manner. The present inventions may employ any MAC and/or MAC processing pipeline(s) now known or later developed including the MACs and MAC processing pipelines described and/or illustrated in (1) U.S. patent application Ser. No. 16/545,345 and U.S. Provisional Patent Application No. 62/725,306, and/or (2) U.S. patent application Ser. No. 16/816,164 and U.S. Provisional Patent Application No. 62/831,413. The '345, '413, '164 and '413 applications are incorporated herein by referenced in their entirety.

As intimated above, prior to providing the filter weights to the multiplier-accumulator circuitry of the execution pipeline(s) in connection with implementing the multiply and accumulate operations of the processing operations, the filter weights stored in memory in the Gaussian floating point data format are read from memory (e.g., L2, L1 or L0 memory) and thereafter may be converted to a different data format (e.g., fixed point data format or floating point data format)—a data format that is employed by multiplier-accumulator circuitry while performing the multiply operations. Here, the filter weights are read from memory, provided to data format conversion circuitry resident on the one or more integrated circuits. The data format conversion circuitry convert the filter weights from the Gaussian floating point data format (e.g., 8 bit Gaussian floating point data format) to, a data format (e.g., a fixed point or floating point data format) and an appropriate data length that is consistent with the data processing of the multiplier-accumulator circuitry of the execution pipeline in connection with the multiply and accumulate operations. Thereafter, the filter weights in, for example, a floating point data format (e.g., 16 bit floating point data format), are provided to the multiplier-accumulator circuitry of the execution pipeline(s) in connection with the multiply and accumulate operations of the data processing (e.g., image data processing). The data format of the filter weights is typically consistent with the data format of the input data (e.g., image data) received by the multiplier-accumulator circuitry in connection with the multiply operations of the processing operations.

Indeed, in one embodiment, the format conversion circuitry employed to convert the filter weights from a Gaussian floating point data format (e.g., 8 bit Gaussian floating point data format) to a fixed point or floating point data format (e.g., 16 bit floating point) is disposed at the input of the multiplier-accumulator circuitry (i.e., the plurality of multiplier-accumulator circuits of the execution pipeline(s). In this embodiment, such format conversion circuitry converts the data format of the filter weights immediately prior to providing the filter weights to the multiplier-accumulator circuitry for implementation or performance of the multiply operations. That is, the conversion of the filter weights from a Gaussian floating point data format (e.g., 8 bit) to a fixed point or floating point data format (e.g., 16 bit floating point) is performed "on the fly" and thereafter directly/immediately input into the multiplier-accumulator circuitry during data processing.

In another embodiment, such format conversion circuitry is disposed between two memories (e.g., L1 and L0) wherein the filter weights having a Gaussian floating point data format are read from a first memory (e.g., L2 or L1), applied to format conversion circuitry, which converts the data format from Gaussian floating point data format to a fixed point or floating point data format and stores the filter weights having the new data format in a second memory (e.g., L1 or L0, respectively). Again, the format conversion circuitry may convert the data format of the filter weights to a format that employed by multiplier-accumulator circuitry to perform the multiply operations (e.g., a data format that is consistent with the data format of the input data (e.g., image data) received by the multiplier-accumulator circuitry in connection with the multiply operations of the filtering operations).

Notably, in one embodiment, the Gaussian floating point data format of the filter weights may be dynamically configurable, via control circuitry (which may be fully or partially external to the one or more integrated circuits (e.g., in a host computer or processor) or internal/resident thereon), between a plurality of configurations—for example, a first configuration (having a first precision and a first range) to a second configuration (having a second precision and a second range). For example, without changing the total number of bits assigned to or available for each filter weight (e.g., 8 bits), the configuration of the Gaussian floating point data format of the filter weights may be dynamically set by adjusting and/or changing number of bits of the fraction or mantissa field (collectively hereinafter "fraction field") and/or number of bits of the exponent field) wherein each configuration has the same number of bits and/or the same or relatively the same storage footprint/allocation in memory. Here, the precision of the filter weights may be modified (e.g., increased or decreased by assigning or using more or less, respectively, bits of the total number of bits for value of the fraction field) and/or the range of the filter weights may be modified (e.g., increased or decreased by assigning or using more or less, respectively, bits of the total number of bits for value of the exponent value) to, for example, modify and/or improve the processing operation based on the particular characteristics of the filter weights (e.g., the range of the filter weights). Thus, the Gaussian floating point data format of the filter weights having a total of x data bits (e.g., x=8) may be programmed (e.g., more than one time), modified or changed between a plurality of configurations assigning or allocating a number of bits to the fraction field and/or and to the exponent field—wherein each different configuration has the same total number of bits and/or the same or relatively the same storage footprint/allocation in memory.

The range and precision of each configuration may be controlled or adjusted by modifying or changing the allocation of the total number of bits (which, in one embodiment, is constant or fixed between the different configurations of the fields) of the Gaussian floating point data format of the filter weights to (1) the exponent field/value and (2) the fraction field/value. That is, the control circuitry may control, modify or change the configuration of the Gaussian floating point data format of the filter weights between (1) a first configuration, having a first number of bits allocated to the exponent field/value, a second number of bits allocated to fraction field/value, and one bit would be allocated to a sign, and (2) second configuration, having a third number of bits allocated to the exponent field/value, a fourth number of bits allocated to fraction field/value, and one bit would be allocated to a sign. For example, a Gaussian floating point data format of the filter weights having a total of 8 data bits may include a first configuration having 2 bits allocated to the exponent field/value and 5 bits allocated to the fraction field/value; and a second configuration may include 3 bits allocated to the exponent field/value and 4 bits allocated to the fraction field/value. Notably, in each instances, 1 bit would be allocated to the sign (i.e., defining a positive or negative value). Again, although the configuration of the Gaussian floating point data format of the filter weights changes, the amount of memory allocated to store each filter coefficient in memory (e.g., L2, L1 and/or L0) is constant or relatively constant between the configurations—notwithstanding the changes in configuration of the Gaussian floating point data format which may modify and/or improve the processing operation based on the particular characteristics of the filter weights (e.g., the range of the filter weights). Here, the allocation of the total number of bits is constant or fixed between the different configurations of the Gaussian floating point data format of each filter weight.

The configuration of the Gaussian floating point data format may be user or system defined and/or may be one-time programmable (e.g., at manufacture) or more than one-time programmable (e.g., (i) at or via power-up, start-up or performance/completion of the initialization sequence/process sequence, and/or (ii) in situ (i.e., during operation of the integrated circuit), at manufacture, and/or at or during power-up, start-up, initialization, re-initialization, configuration, re-configuration or the like. In one embodiment, control circuitry may evaluate the input data and, based thereon, implement or select a configuration of the Gaussian floating point data format to narrow/broaden the range and/or increase/decrease the precision of the resultant multiplication—with little to no change in the total number of bits (e.g., 8) of each filter weights and/or storage allocation therefor. In response, the conversion circuitry may receive configuration instruction signals from internal or external circuitry (i.e., external to the one or more integrated circuits—for example, a host computer/processor) including one or more data storage elements (e.g., one or more memory cells, register, flip-flop, latch, block/array of memory), one or more input pins/conductors, a look-up table LUT (of any kind), a processor or controller and/or discrete control logic. The conversion circuitry, in response thereto, may employ such signal(s) to implement the selected/defined configuration (e.g., in situ and/or at or during power-up, start-up, initialization, re-initialization, configuration, re-configuration or the like) of the data format of the Gaussian floating point filter weights.

Notably, the conversion circuitry may also, in addition to converting the data format of the filter weights to/from the Gaussian floating point data format, convert, adjust or modify the data width, length or size of the filter coefficients or weights (relative to the width and allocation of the Gaussian floating point data format) and/or the allocation of such bits, for example, between the fraction field and exponent field. For example, the filter coefficients or weights, having the Gaussian floating point data format (8 bits), may be converted and/or modified to a block-scaled-fraction format or floating point data format having a data length of the filter coefficients that is different (e.g., 12, 16 or 24 bits). In addition, the allocation of the bits between fraction and exponent fields, after conversion from Gaussian floating point data format to a new/different data format (e.g., floating point) may also change (e.g., more bits allocated to the fraction field/value and less bits allocated to the exponent field/value—or vice versa). The filter coefficients, having the new/different data format and modified or adjusted length, may be stored in memory (e.g., L0) and thereafter output to the multiplier-accumulator circuitry of the execution pipeline during implementation or performance of the multiply and accumulate operations. Alternatively, the filter coefficients having the new/different format and modified or adjusted length (relative to the Gaussian floating point data format) may be immediately available (i.e., "on the fly" data format conversion, as discussed herein) to the multiplier-accumulator circuitry of the execution pipeline in connection with the multiply and accumulate operations during data processing.

In one embodiment, the multiplier-accumulator circuitry, implementing one or more of the present inventions, may employ Winograd processing techniques to process the image data. Here, the conversion circuitry may convert the data format of the filter weights from the Gaussian floating point data format to a fixed data format (e.g., block-scaled-fraction data format) having appropriate characteristics that facilitate implementation Winograd processing techniques in connection with the multiplier-accumulator circuitry of the execution pipelines. For example, the circuitry and techniques of the present inventions may be implemented in Winograd processing circuitry and techniques to process the input data (e.g., image data) using filter weights, in a Winograd format, which may have a fixed point data format or a floating point data format—via circuitry, architectures, functions processes and operations of the multiplier-accumulator execution pipelines implementing Winograd processing techniques that are described and/or illustrated in: (1) U.S. Non-Provisional patent application Ser. No. 16/796,111, entitled "Multiplier-Accumulator Circuitry having Processing Pipelines and Methods of Operating Same", filed Feb. 20, 2020, (2) U.S. Provisional Patent Application No. 62/823,161, entitled "Multiplier-Accumulator Circuitry having Processing Pipeline and Methods of Operating and Using Same", filed Mar. 25, 2019, (3) U.S. Non-Provisional patent application Ser. No. 17/031,631, entitled "MAC Processing Pipeline having Conversion Circuitry, and Methods of Operating Same", filed Sep. 24, 2020, and/or (4) U.S. Provisional Patent Application No. 62/909,293, entitled "Multiplier-Accumulator Circuitry Processing Pipeline and Methods of Operating Same", filed Oct. 2, 2019). These four (4) applications are hereby incorporated herein by reference.

For example, the execution pipeline (having the multiplier-accumulator processing circuits) may concurrently process a plurality of associated input data/values (e.g., sixteen input data/values wherein the associated input data/values may be arranged in, input into the processing circuitry and/or employed as a matrix (e.g., a 4×4) or block using Winograd processing techniques. In this regard, a plurality of associated filter coefficients or weights are also arranged in or employed by and/or input into the processing circuitry in groups (e.g., 16 filter coefficients in each group wherein each group may be arranged in and/or employed as a 4×4 matrix)) wherein each group of input data/values is processed, via Winograd processing techniques and circuitry, using a group of associated filter weights. Such circuitry and techniques may be implemented in connection with the MAC pipelines including the data format conversion circuitry and processing of the present inventions. Notably, the '670 and '601 applications are incorporated herein by reference in their entirety.

Notably, in one embodiment, the filter coefficients, having an initial data format, may be generated by a host computer or processor and stored in memory (e.g., L3 memory such as DRAM). The initial data format may be an integer format (e.g., 8 bit) or floating point data format (e.g., 16 bit or 32 bit). After conversion of the data format of the filter coefficient to Gaussian floating point data format by conversion circuitry, the subsequent data format may be a Gaussian floating point data format (e.g., 8 bits). Indeed, in one embodiment, where a plurality of filter coefficients are associated (e.g., nine filter coefficients are associated in a 3×3 matrix or 4×4 matrix), the Gaussian floating point data format may include a sign, a value and an exponent (e.g., 8 bit) wherein the exponent is common to all of the associated filter coefficients. Here, the present inventions may use the techniques and circuitry described and/or illustrated in U.S. patent application Ser. No. 17/074,670 and U.S. Provisional Patent Application No. 62/930,601 to, for example, enhance the dynamic range of the filter weights or coefficients by using a common exponent associated with a group of filter weights (e.g., 9-3×3 or 16-4×4) wherein the input data associated with such group of filter weights is processed as a group together with the associated filter weights.

As mentioned above, the conversion processes of the format of the filter coefficients or weights from an initial data format to Gaussian floating point data format may be implemented, via conversion circuitry, in the host computer (e.g., via a processor) and/or in/on the one or more integrated circuits having multiplier-accumulator processing circuitry (which includes the execution pipeline for filtering image data via the multiplier-accumulator circuitry). Here, circuitry in the host computer and circuitry in the multiplier-accumulator processing circuitry may partially or fully implement one, some or all of the conversion processes to Gaussian floating point data format described and/or illustrated herein. All combinations and permutations of which circuitry implements or performs one or more, or all of the format and/or length conversion processes are intended to fall within the scope of the present inventions.

Indeed, in one embodiment, a processor of the host computer may, in addition to generating the initial filter weights or coefficients, having an initial format (e.g., an integer format), perform processes to convert the data format of the filter weights or coefficients to the Gaussian floating point data format and provide/output the filter weights having the Gaussian floating point data format to the multiplier-accumulator processing circuitry (which includes the execution pipeline for filtering image data via the multiplier-accumulator circuitry). In addition thereto, or in lieu thereof, a processor of the host computer may, generate the initial filter weights or coefficients, having an initial format (e.g., an integer format), perform processes to convert or modify the width, length or size of the filter weights or coefficients, as discussed herein. Here, the conversion circuitry may be a processor (as properly programmed) that also is employed to calculate/generate the initial filter weights or coefficients (for example, after the learning phase of the start-up or initialization processes of the system).

Notably, the present inventions may employ "improved" handling and generation of the filter coefficient values. For example, in one embodiment:

[1] A "training" system (e.g., a cloud/server based system) is utilized to generate optimized filter coefficient values FPxx in a higher precision, higher range format (e.g., FP32). In one embodiment, a cloud/server system converts the FPxx filter weights directly to Gaussian floating point data format. The filter coefficients, having Gaussian floating point data format, may thereafter be provided/output to the IC, and written to and stored in L3 memory, L2 memory and/or L1 memory (see FIGS. 5A and 8A).

[2] The filter weights, having Gaussian floating point data format, may then be converted, via data format conversion circuitry, to a floating point data format (e.g., FP16) when the filter weights are read from L2 memory and written to L1 memory and/or from L1 memory to L0 memory (see FIGS. 1A, 1B, 5A and 8A). Using a floating point data format (e.g., FP16) in L1/L0 memory and Gaussian floating point data format (e.g., GFP8) in L3 memory and/or L2 memory may provide a significant reduction in cost for an inference system with a relatively small reduction in accuracy.

Thus, the conversion circuitry that converts the filter weights to Gaussian floating point data format may be a processor or logic circuitry disposed in/on, for example, the host computer and/or an integrated circuit (which may or may not include the multiplier-accumulator circuitry employed to process the data using the filter weights or coefficients). All combinations and permutations of the location of the format and/or length conversion circuitry are intended to fall within the scope of the present inventions.

BRIEF DESCRIPTION OF THE DRAWINGS

The present inventions may be implemented in connection with embodiments illustrated in the drawings hereof. These drawings show different aspects of the present inventions and, where appropriate, reference numerals, nomenclature, or names illustrating like circuits, architectures, structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s).

Notably, the configurations, block/data width, data path width, bandwidths, data lengths, values, processes, pseudo-code, operations, and/or algorithms described herein and/or illustrated in the FIGURES, and text associated therewith, are exemplary. Indeed, the inventions are not limited to any particular or exemplary circuit, logical, block, functional and/or physical diagrams, number of multiplier-accumulator circuits employed in an execution pipeline, number of execution pipelines employed in a particular processing configuration, organization/allocation of memory, block/data width, data path width, bandwidths, values, processes, pseudo-code, operations, and/or algorithms illustrated and/or described in accordance with, for example, the exemplary circuit, logical, block, functional and/or physical diagrams.

Moreover, although the exemplary embodiments include a plurality of memories (e.g., L3 memory, L2 memory, L1 memory, L0 memory) which are assigned, allocated and/or used to store certain data and/or in certain organizations, one or more of memories may be added, and/or one or more memories may be omitted and/or combined/consolidated—for example, the L3 memory or L2 memory, and/or the organizations may be changed, supplemented and/or modified. The inventions are not limited to the exemplary embodiments of the memory organization and/or allocation set forth in the application. Again, the inventions are not limited to the exemplary embodiments set forth herein.

Figure 1A:
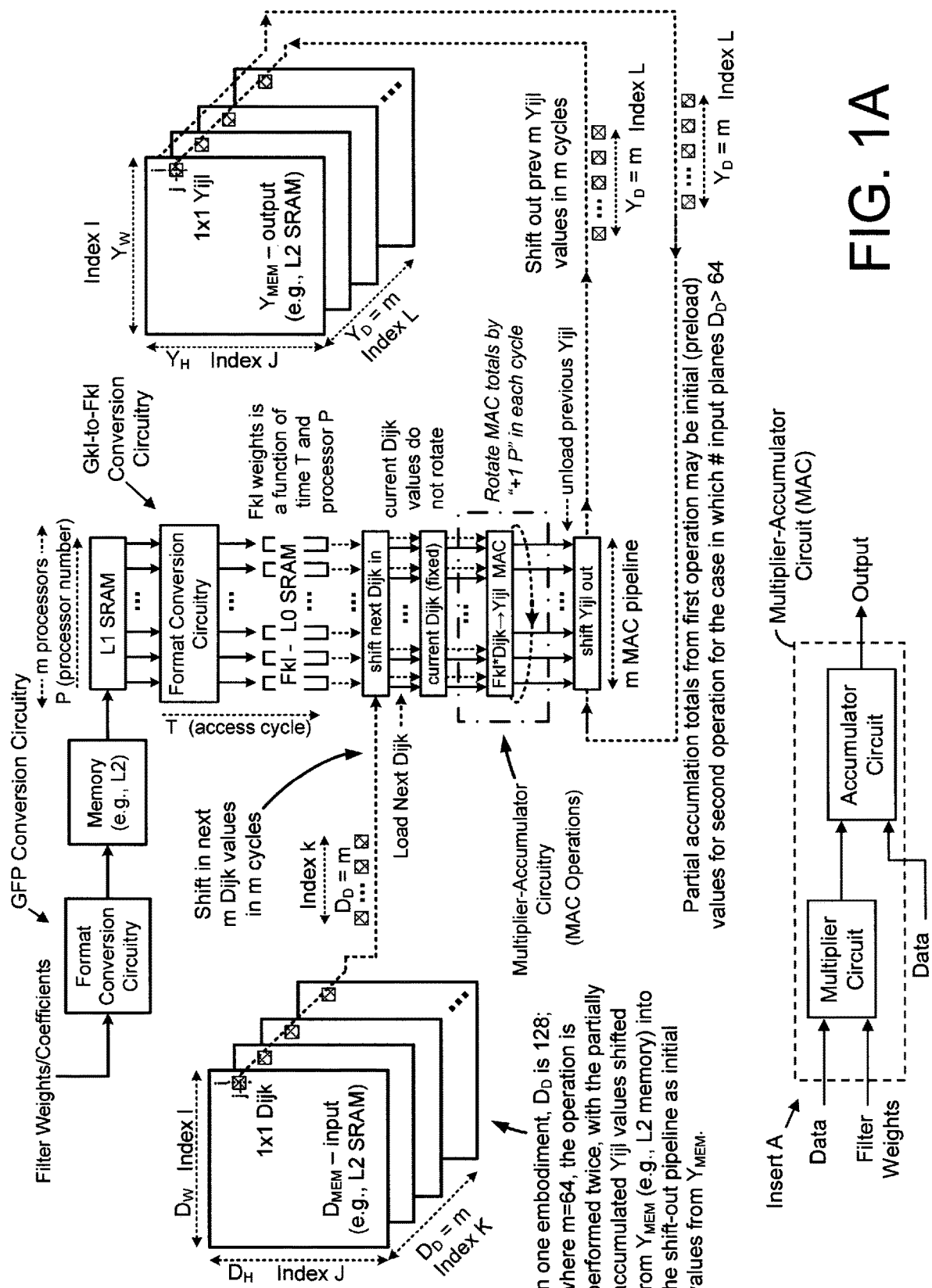
Figure 1B:
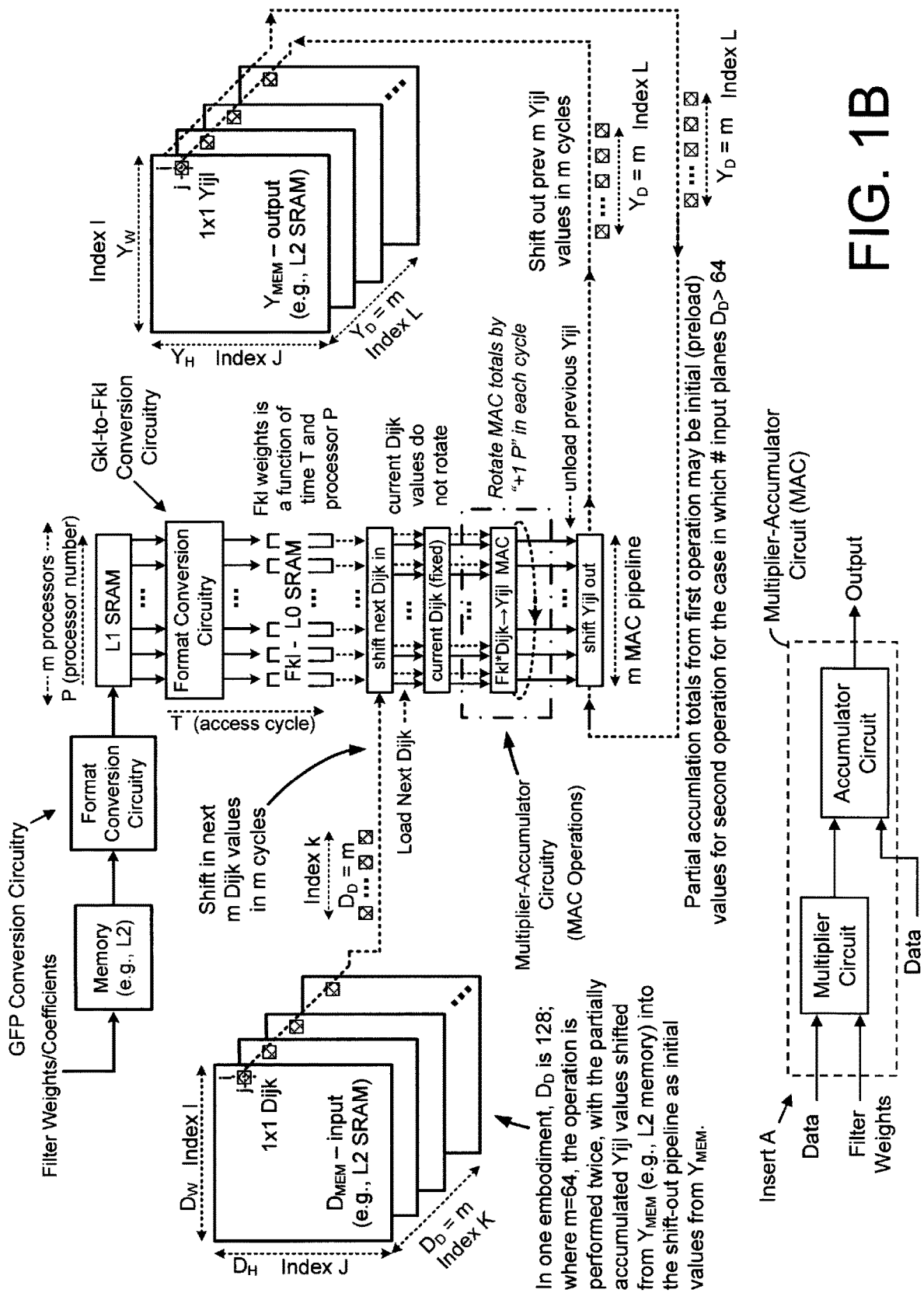
Figure 1C:
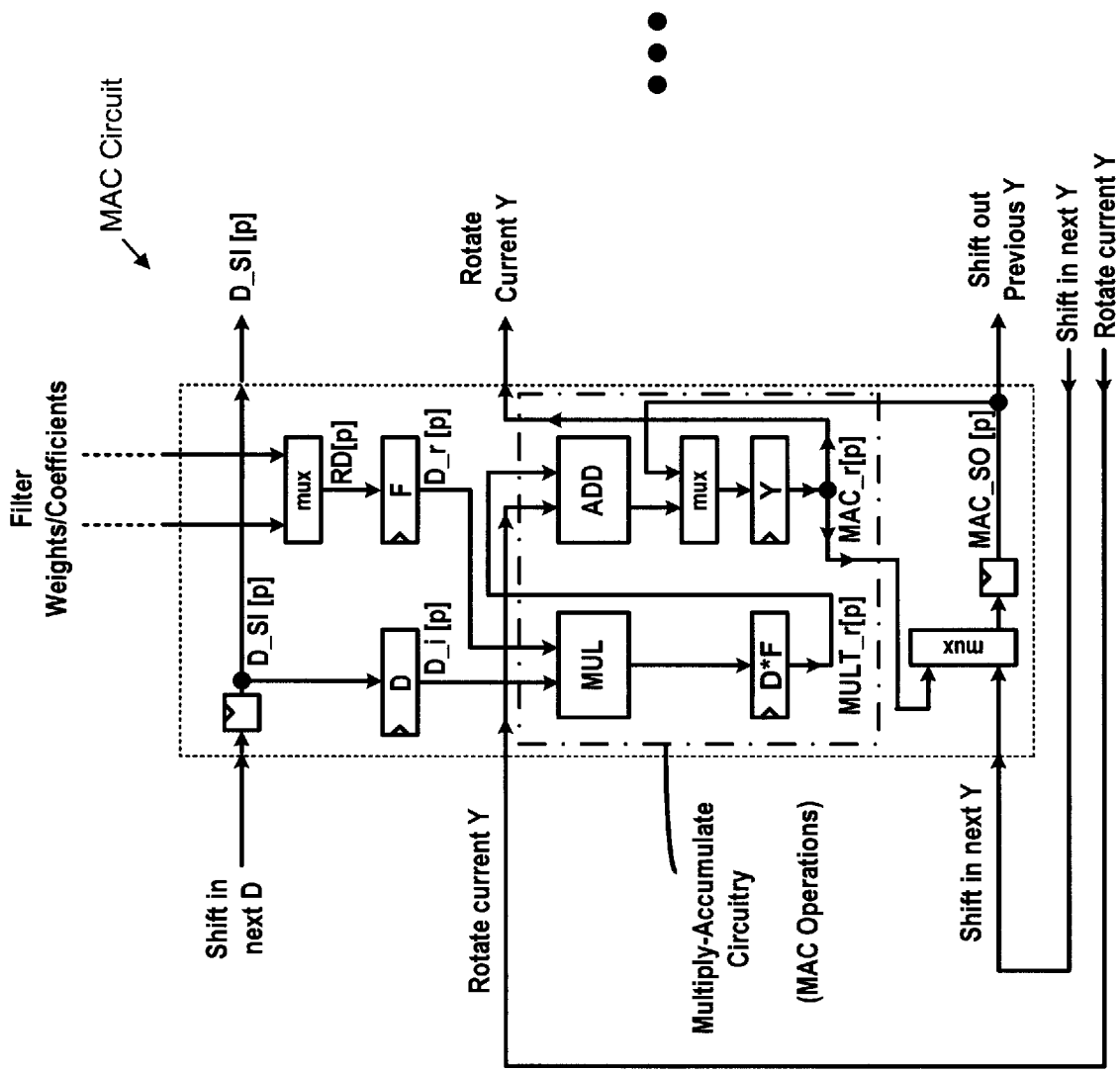
Figure 1D:
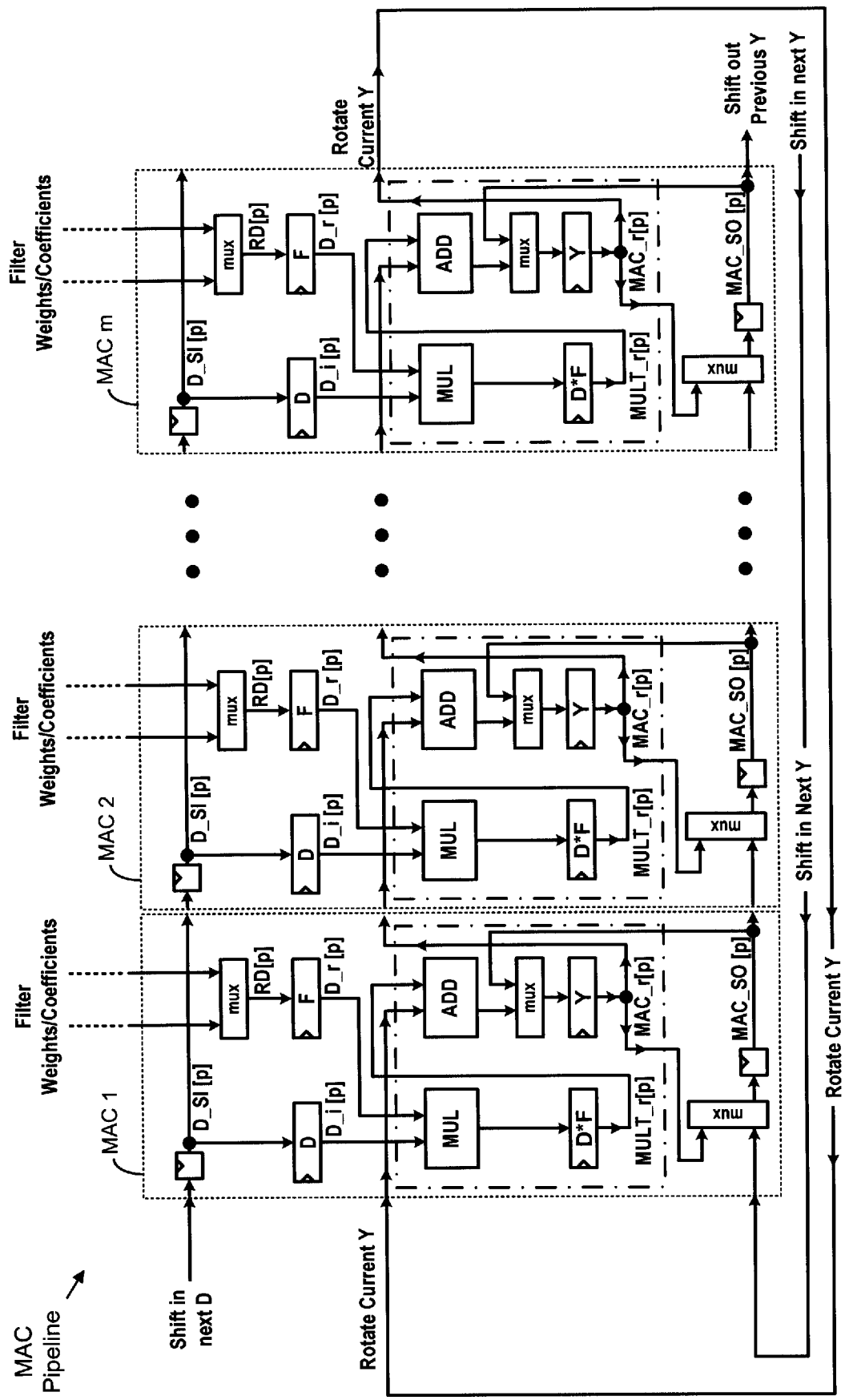
Figure 1E:
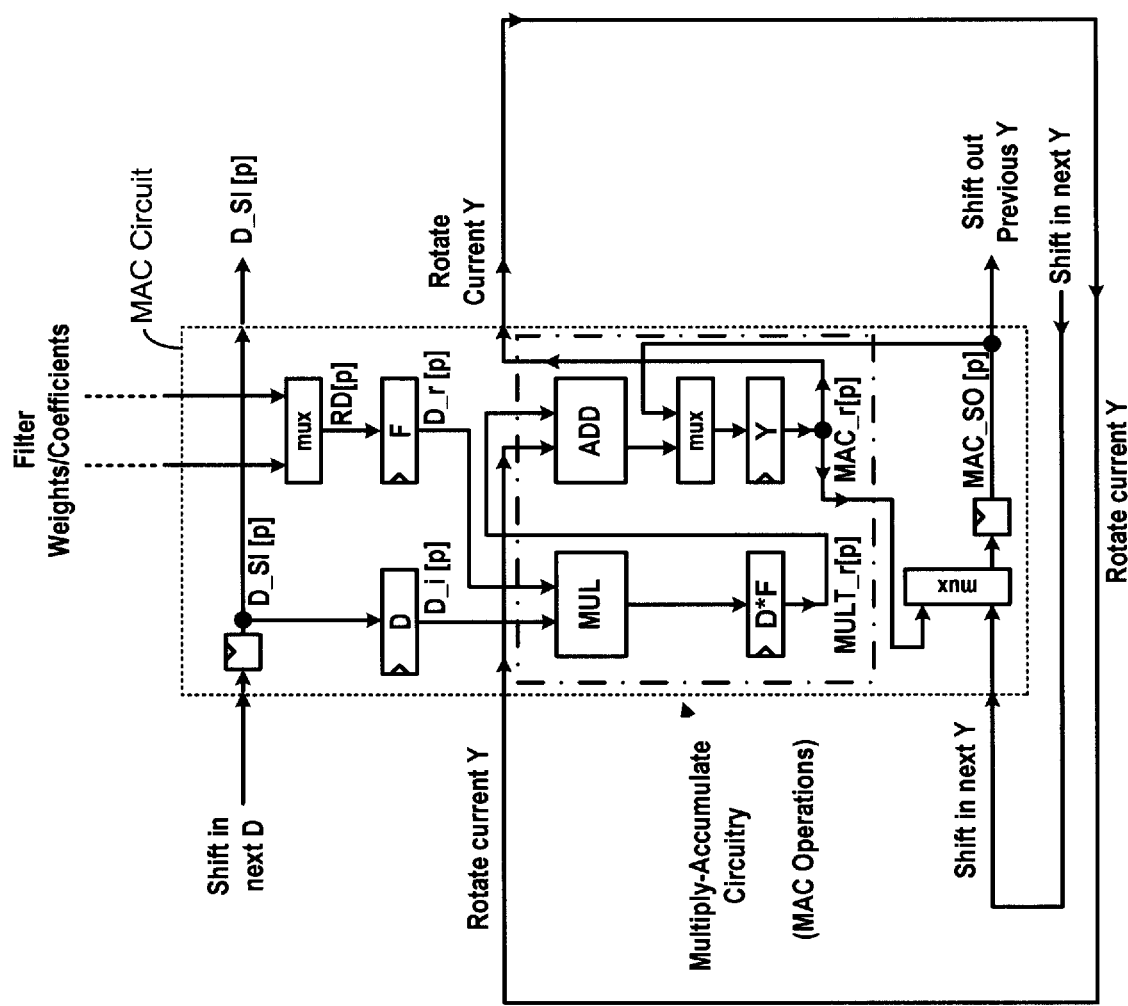
Figure 2A:
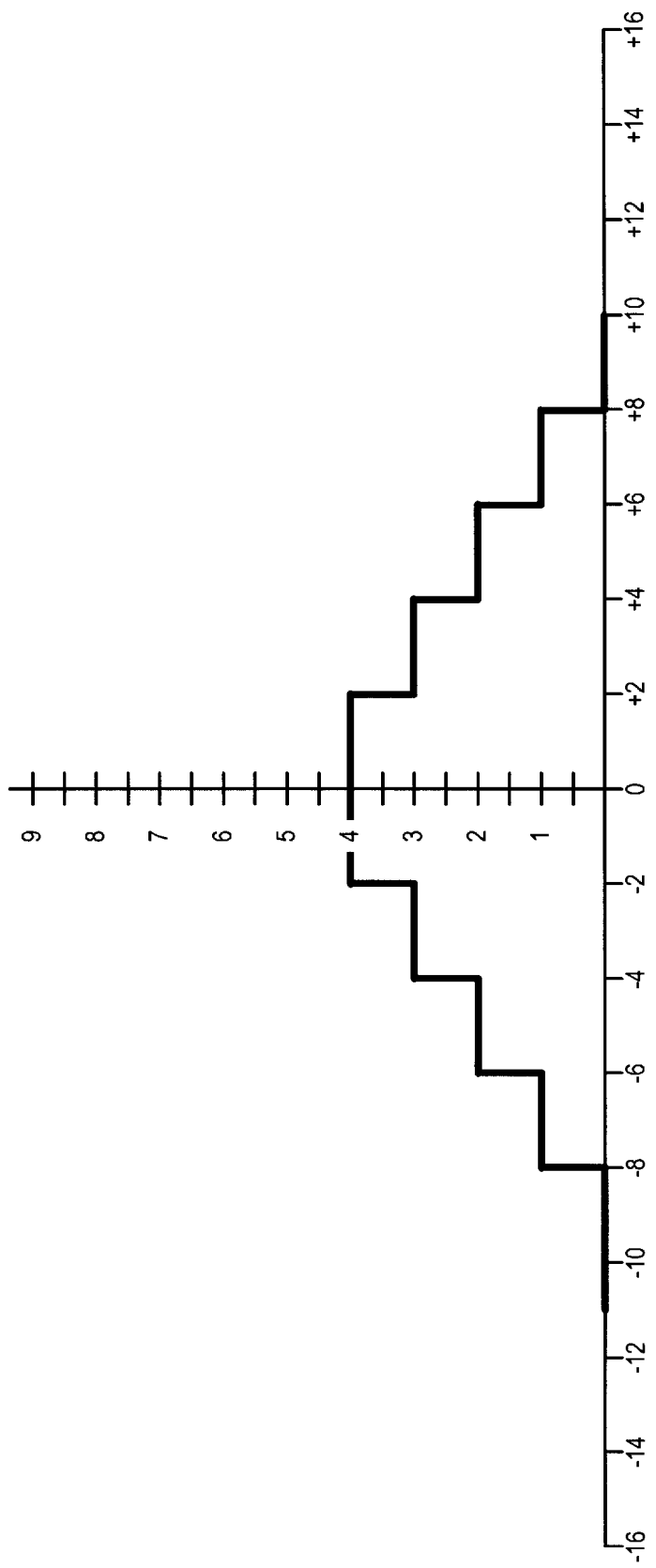
Figure 3:
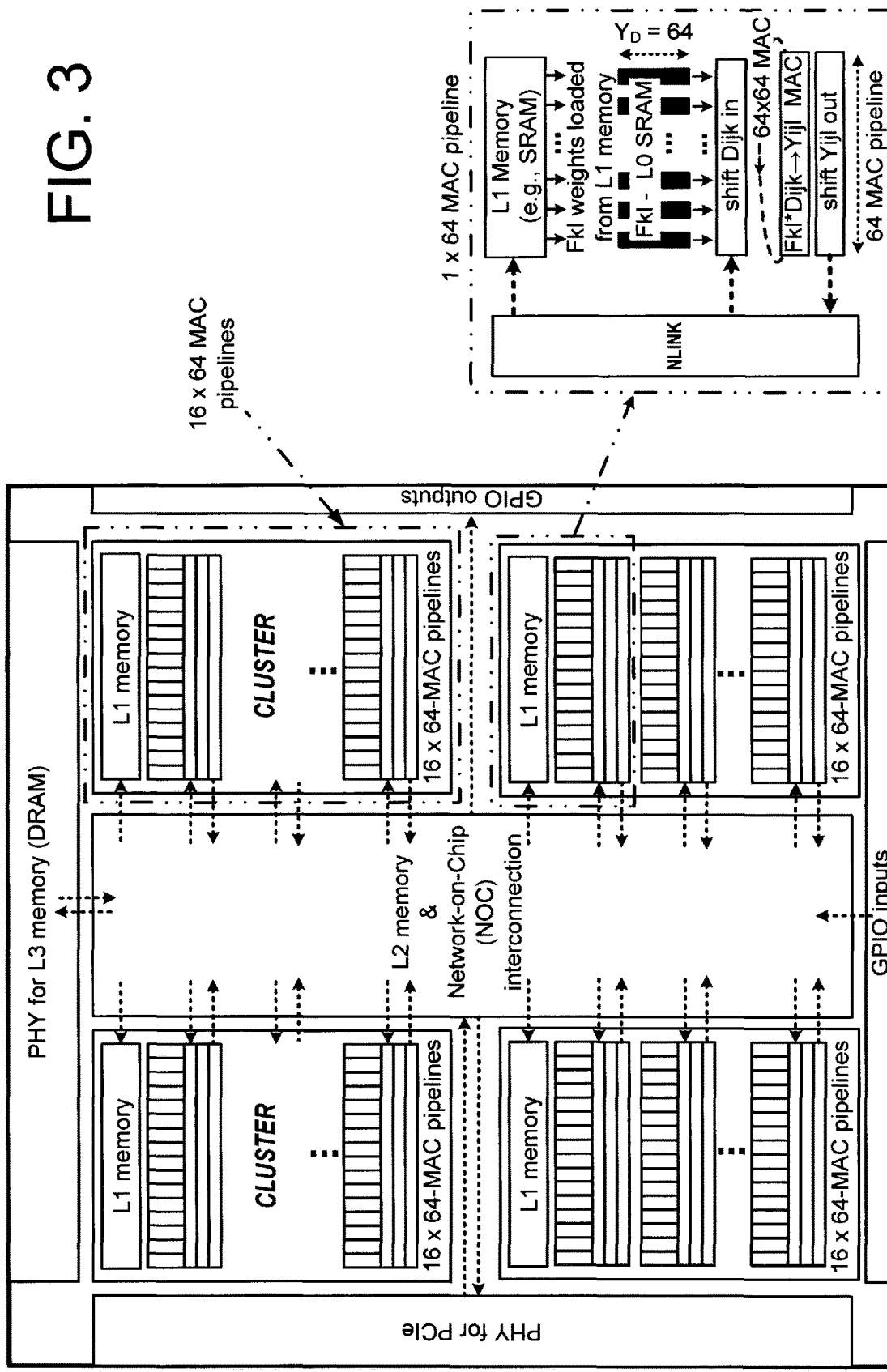
Figure 4A:
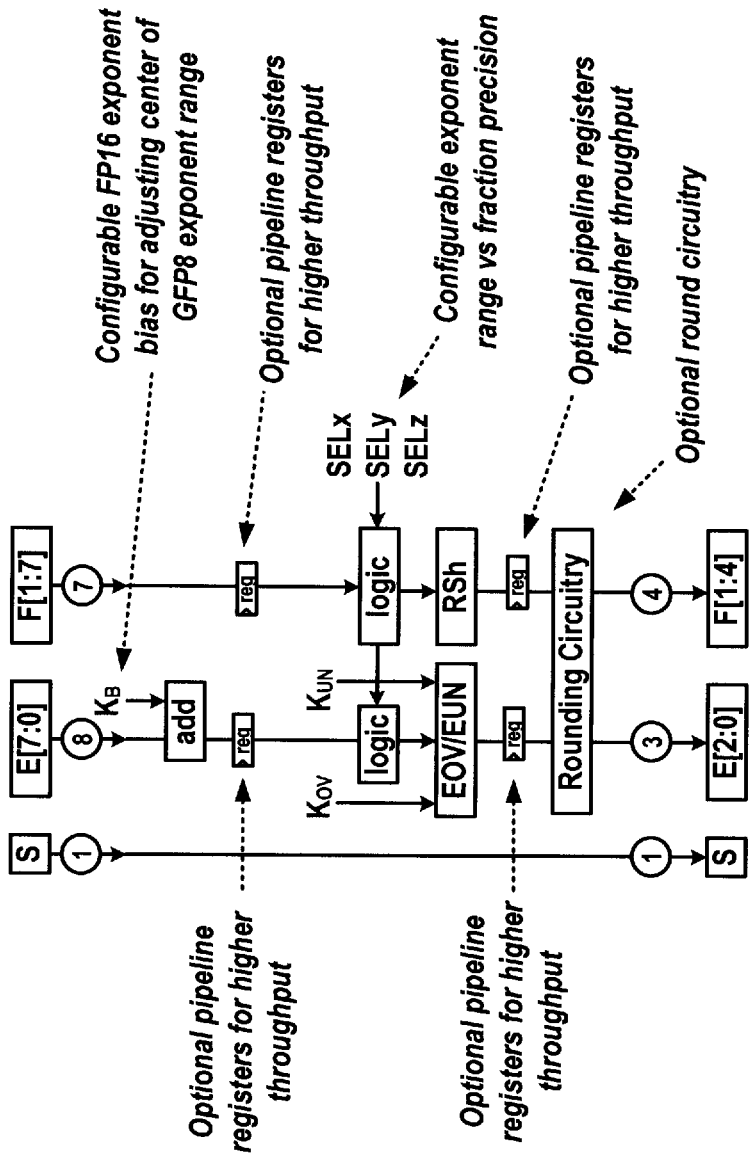
Figure 4B:
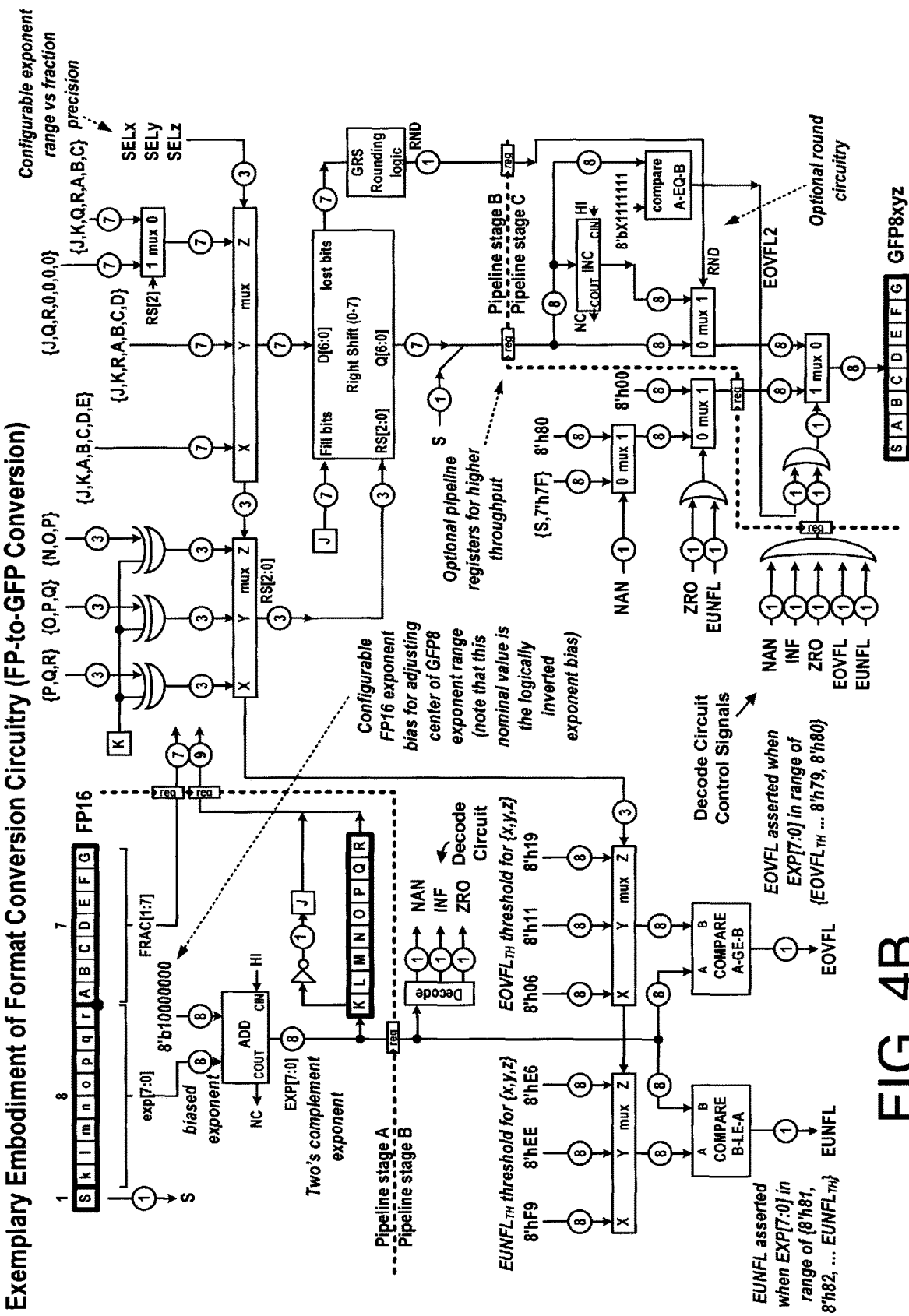
Figure 4C:
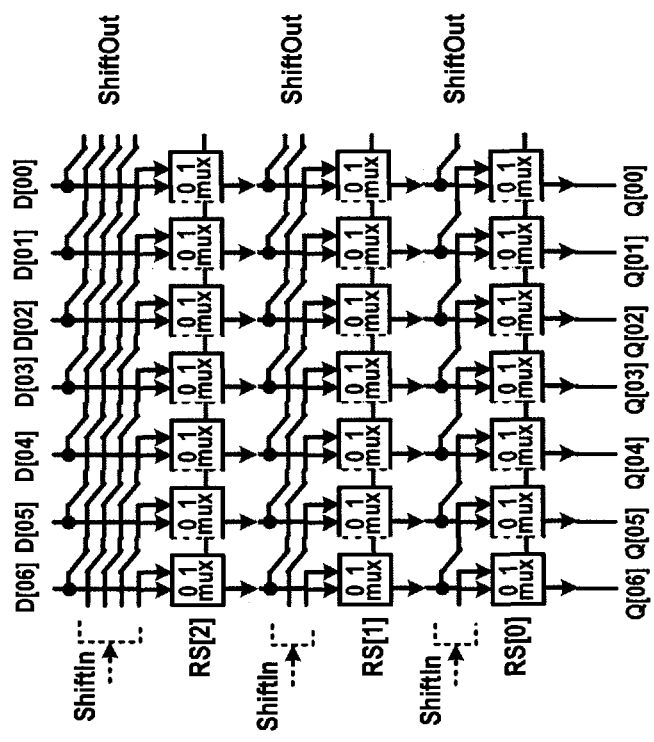
Figure 5A:
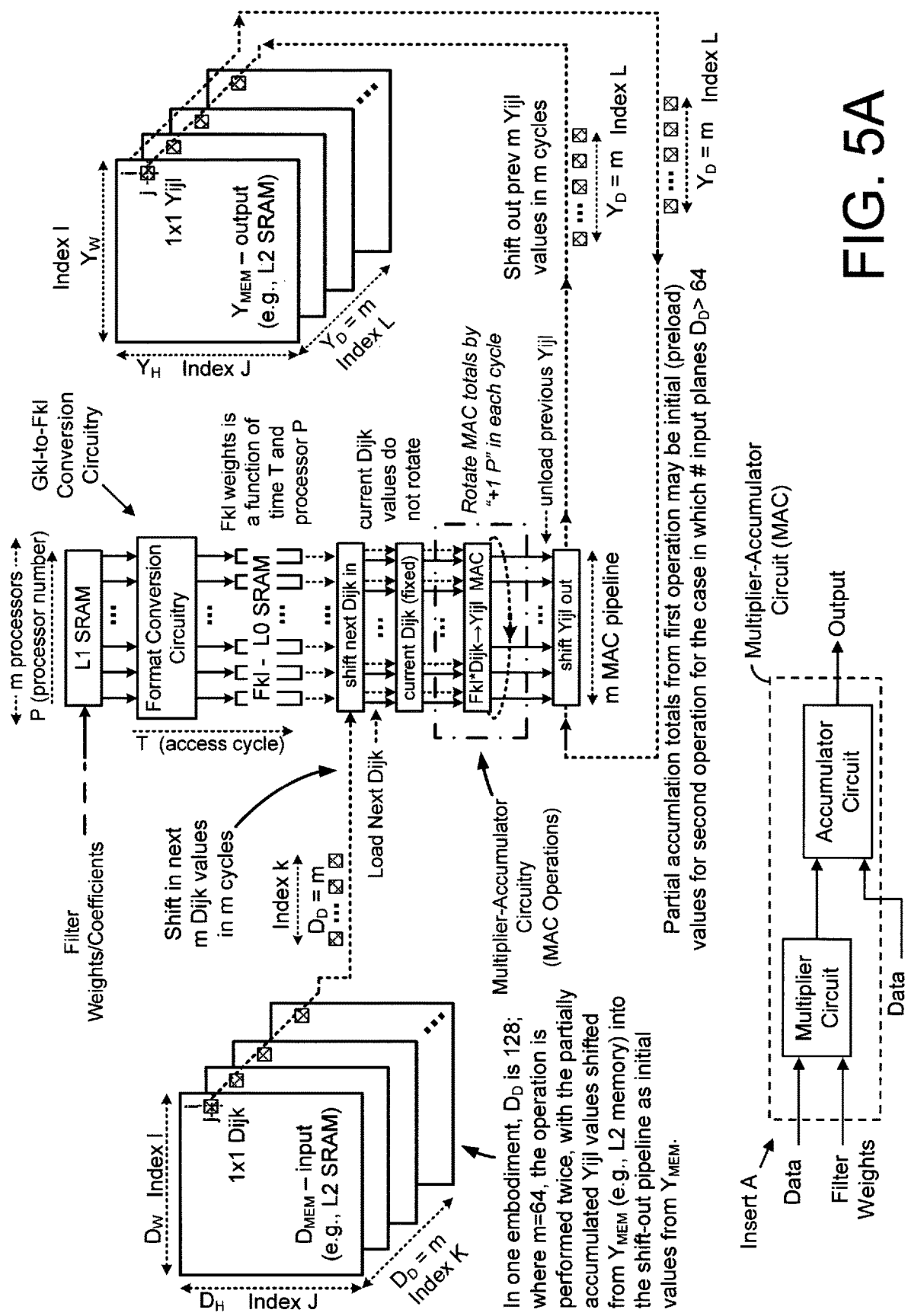
Figure 5B:
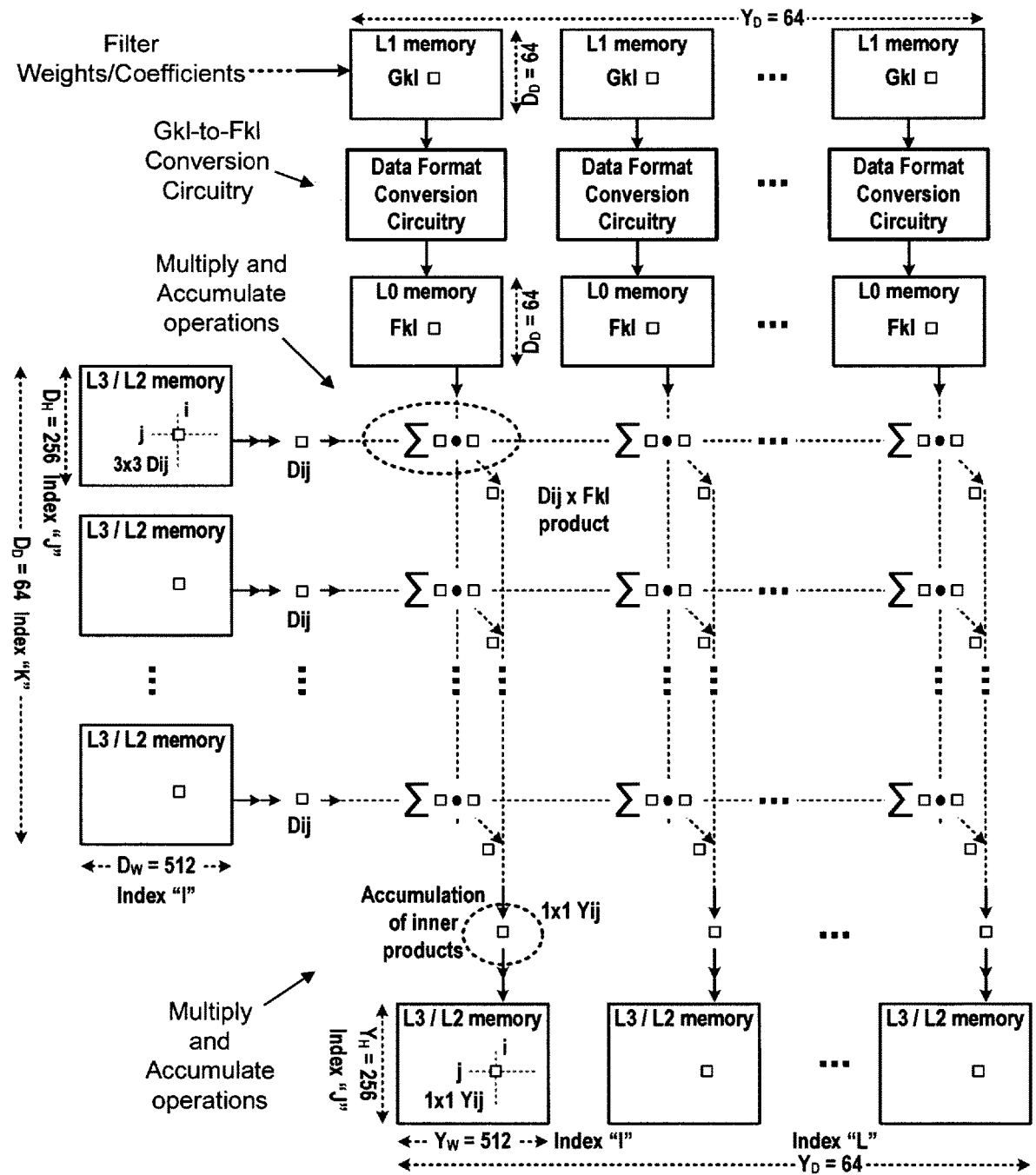
Figure 6A:
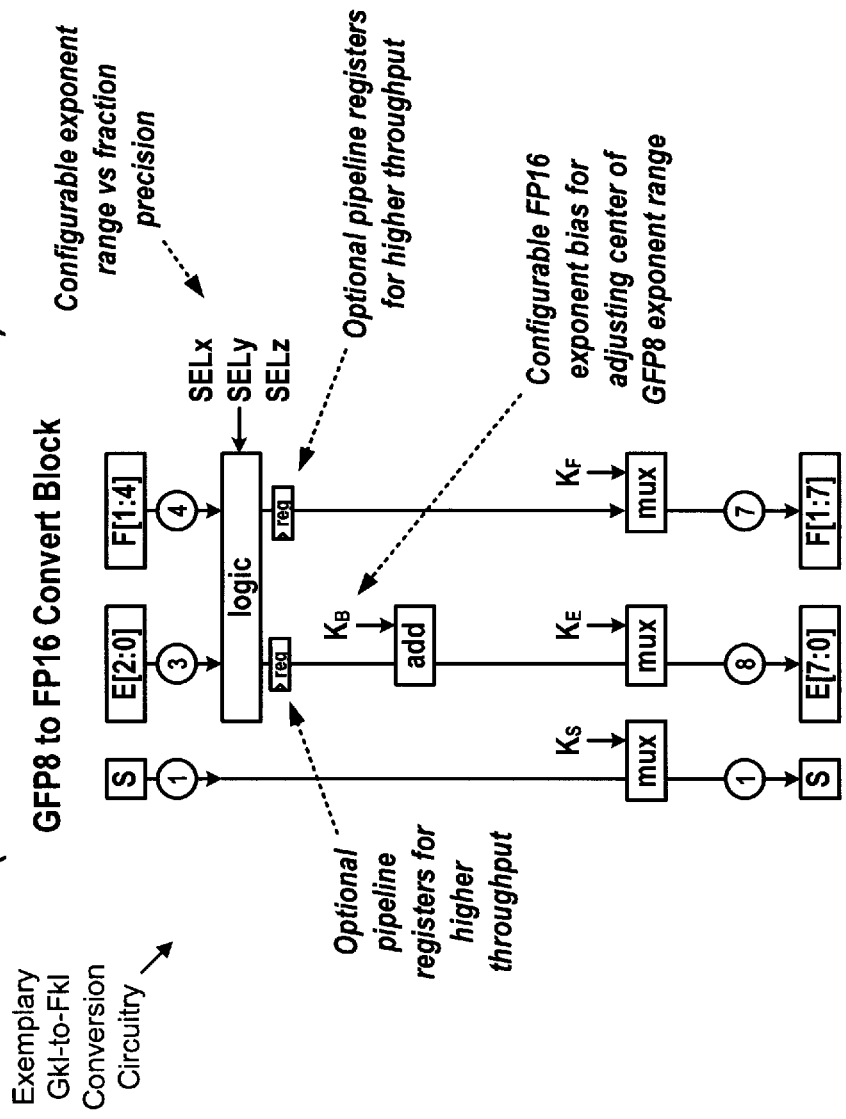
Figure 6B:
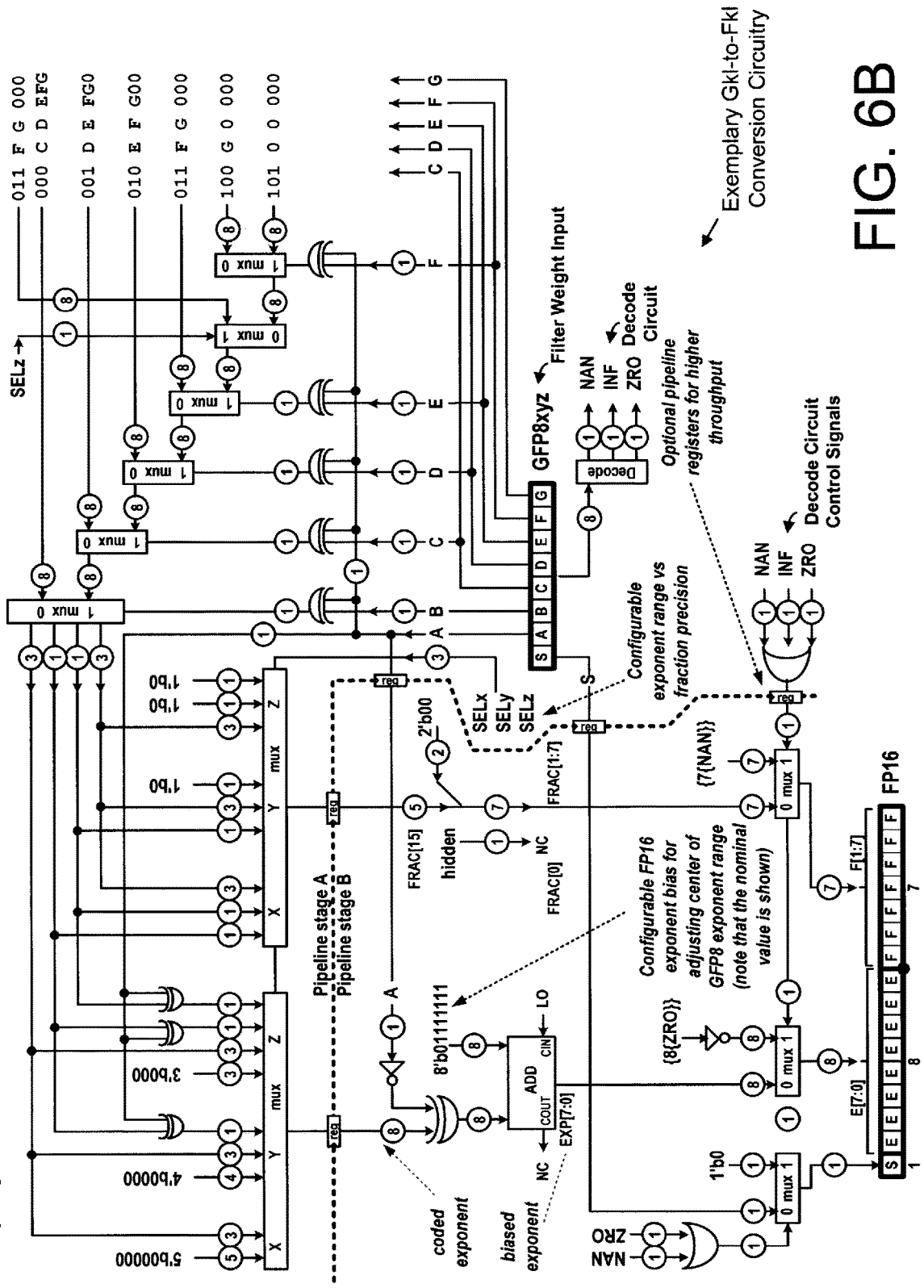
Figure 8A:
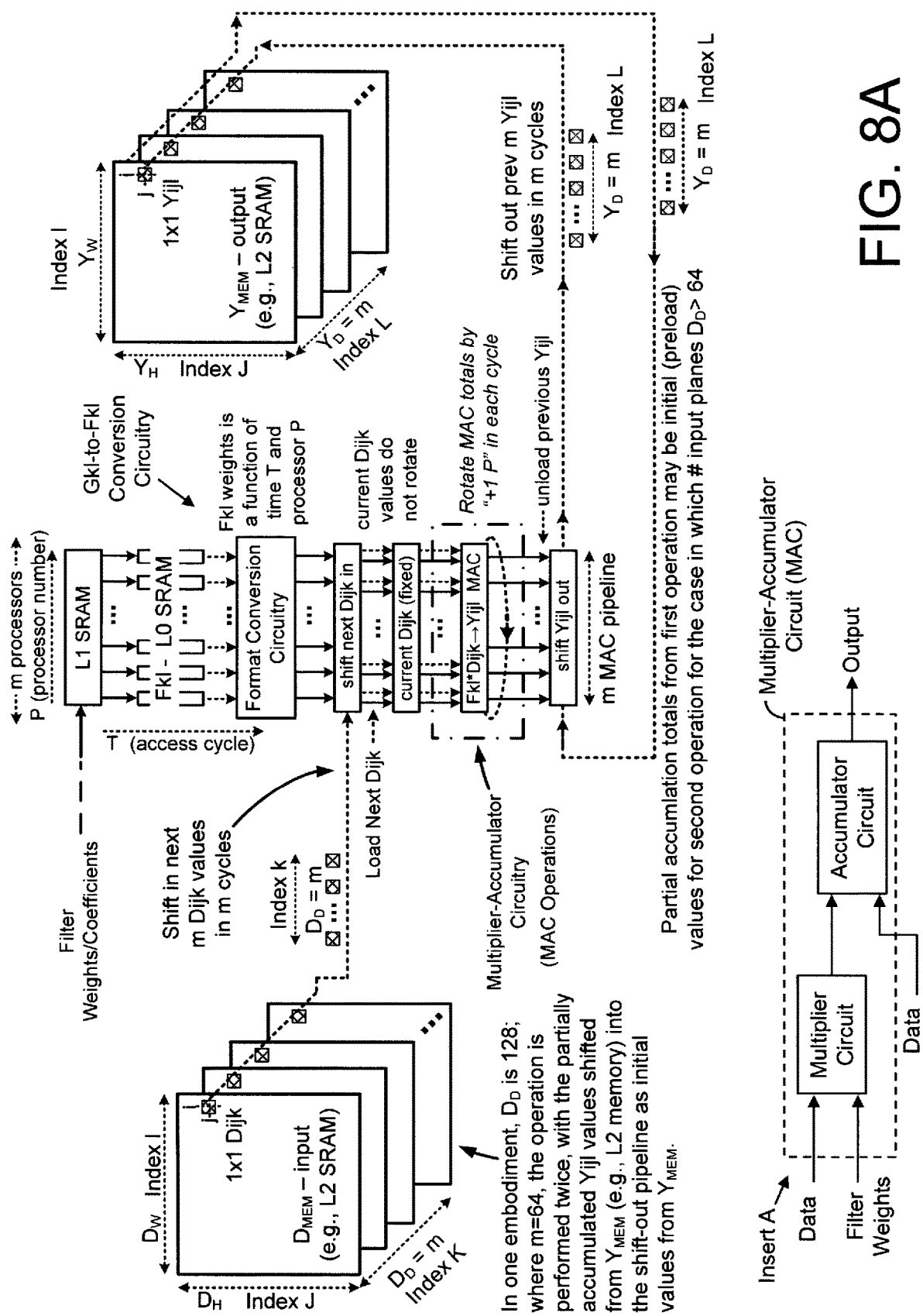
Figure 8B:
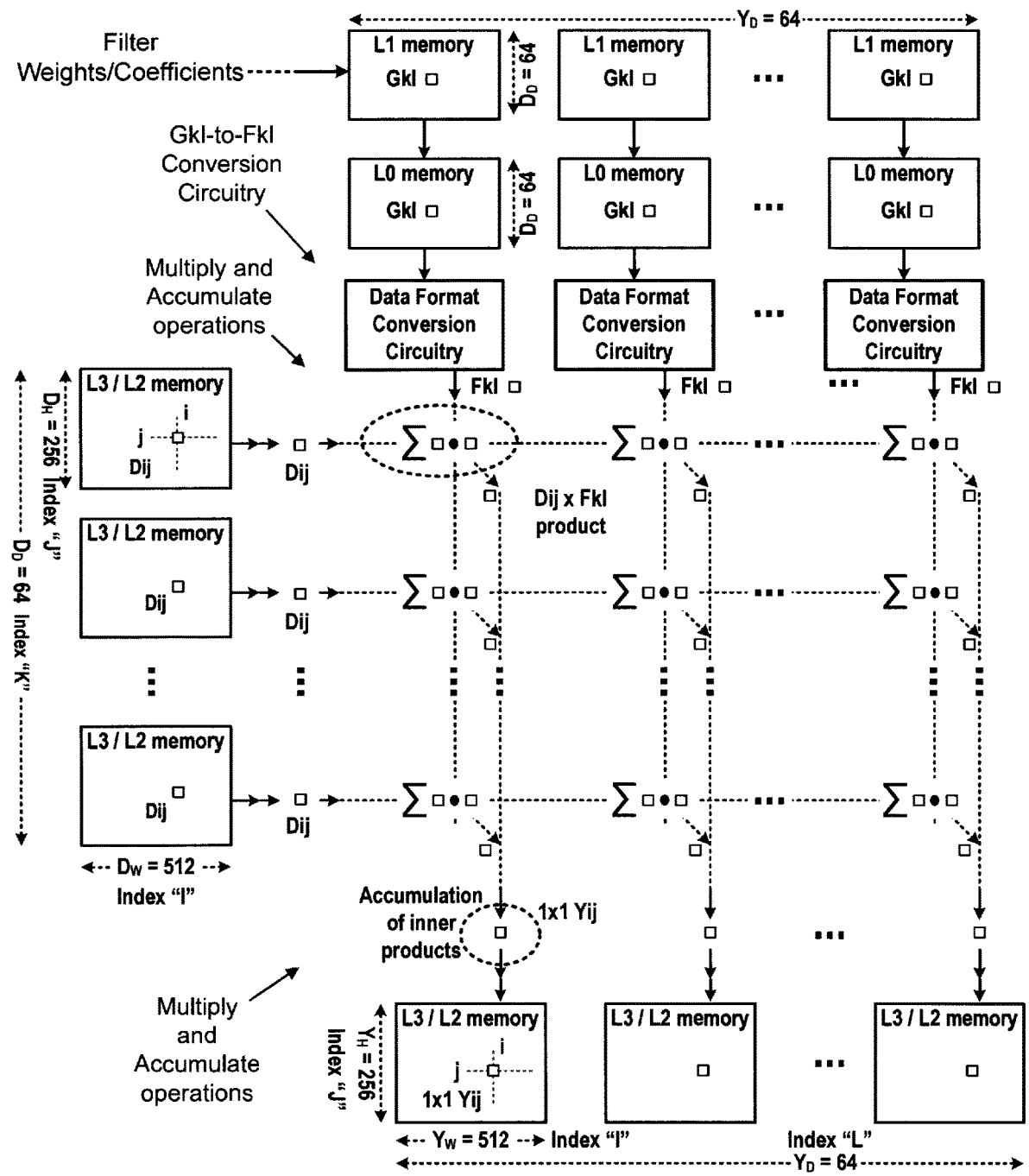
Figure 9A:
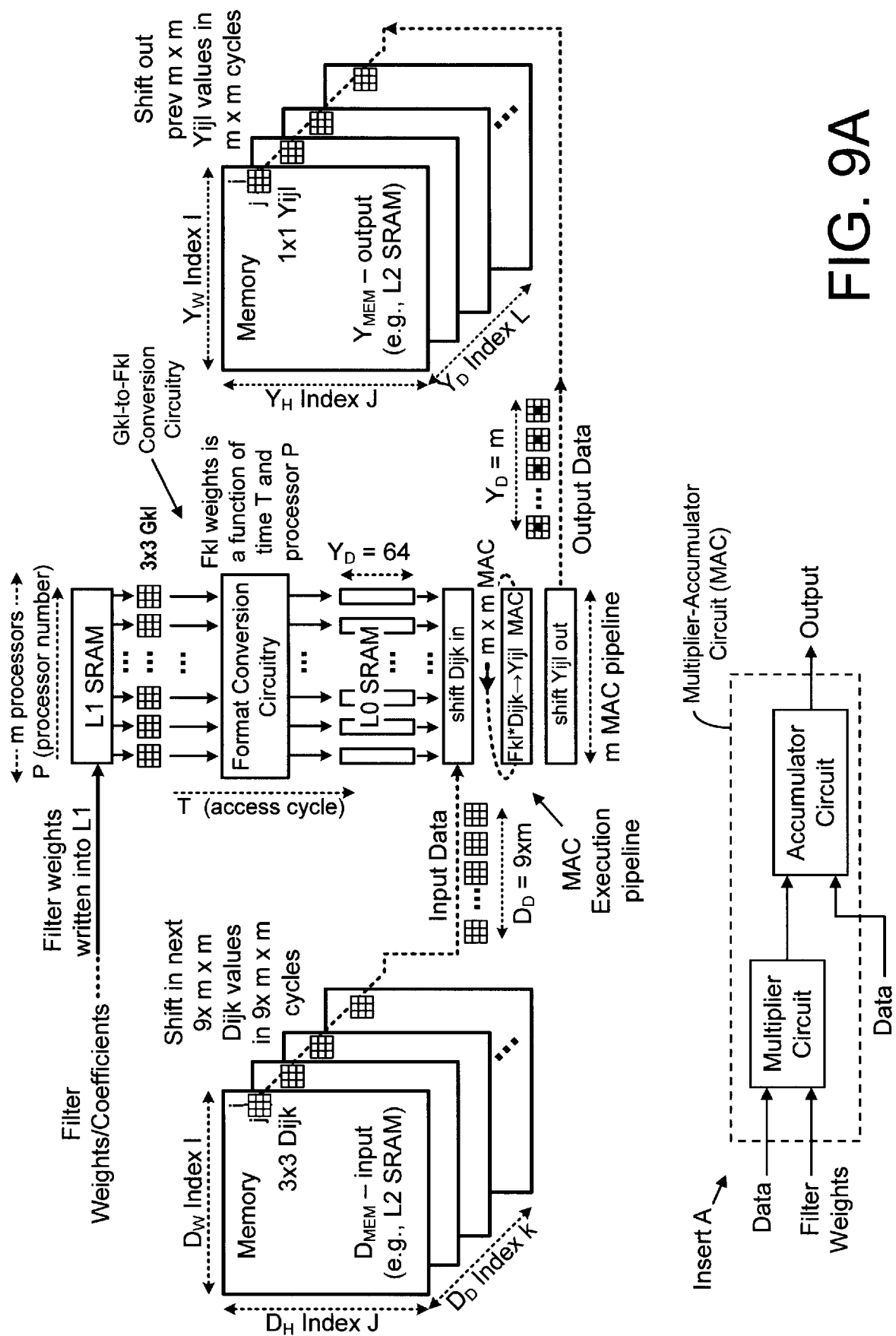
Figure 9B:
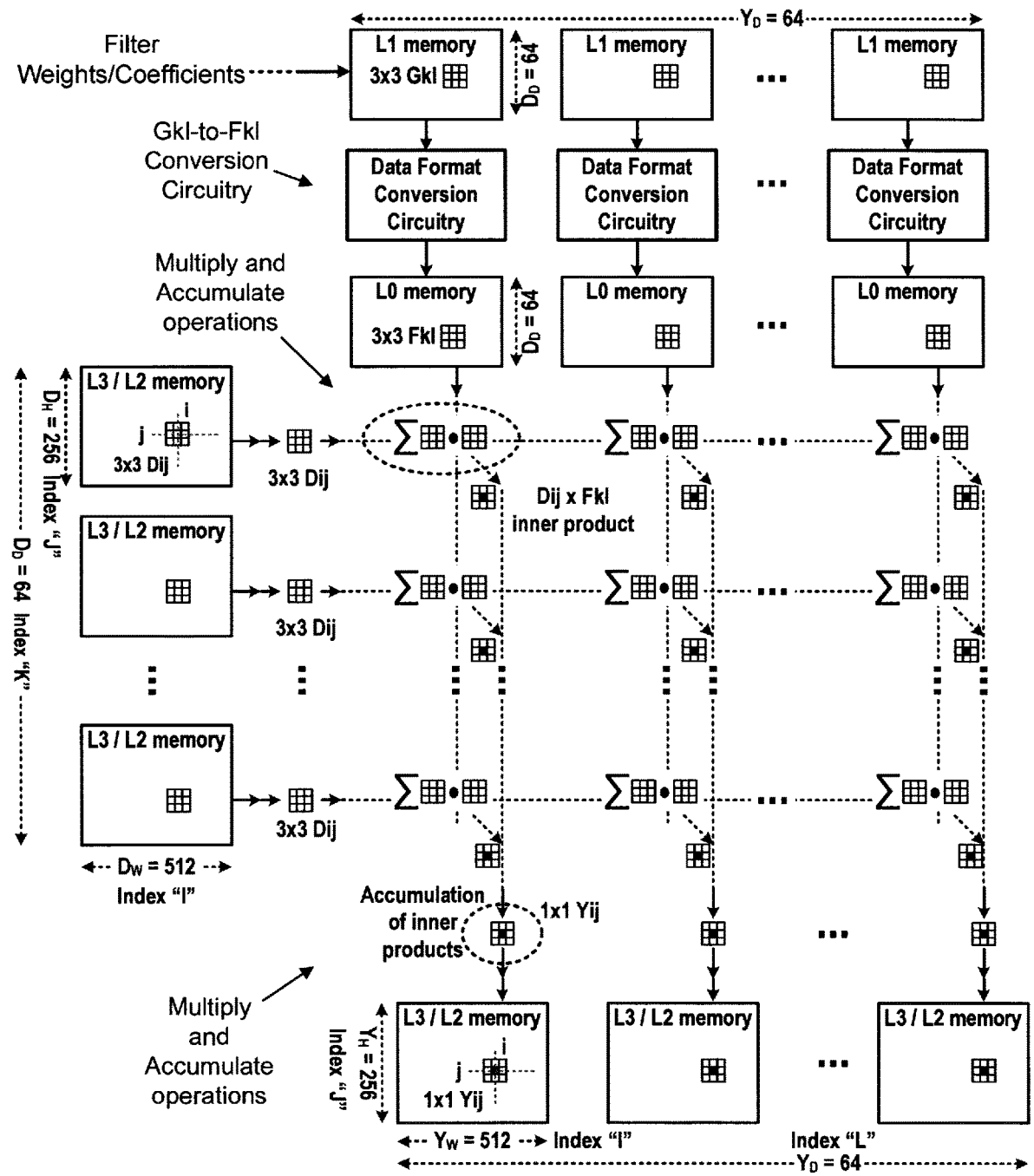
Figure 9C:
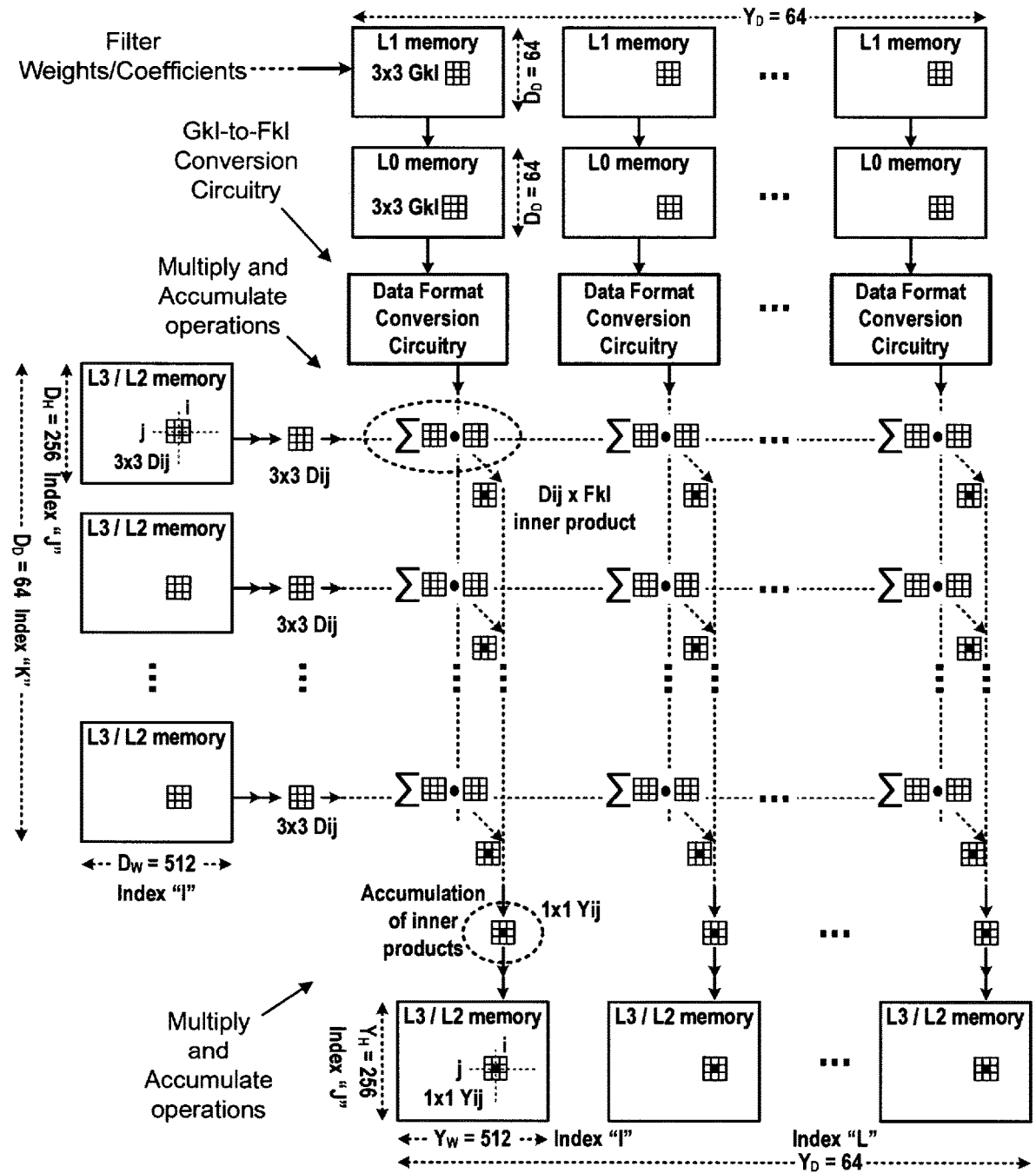
Figure 10A:
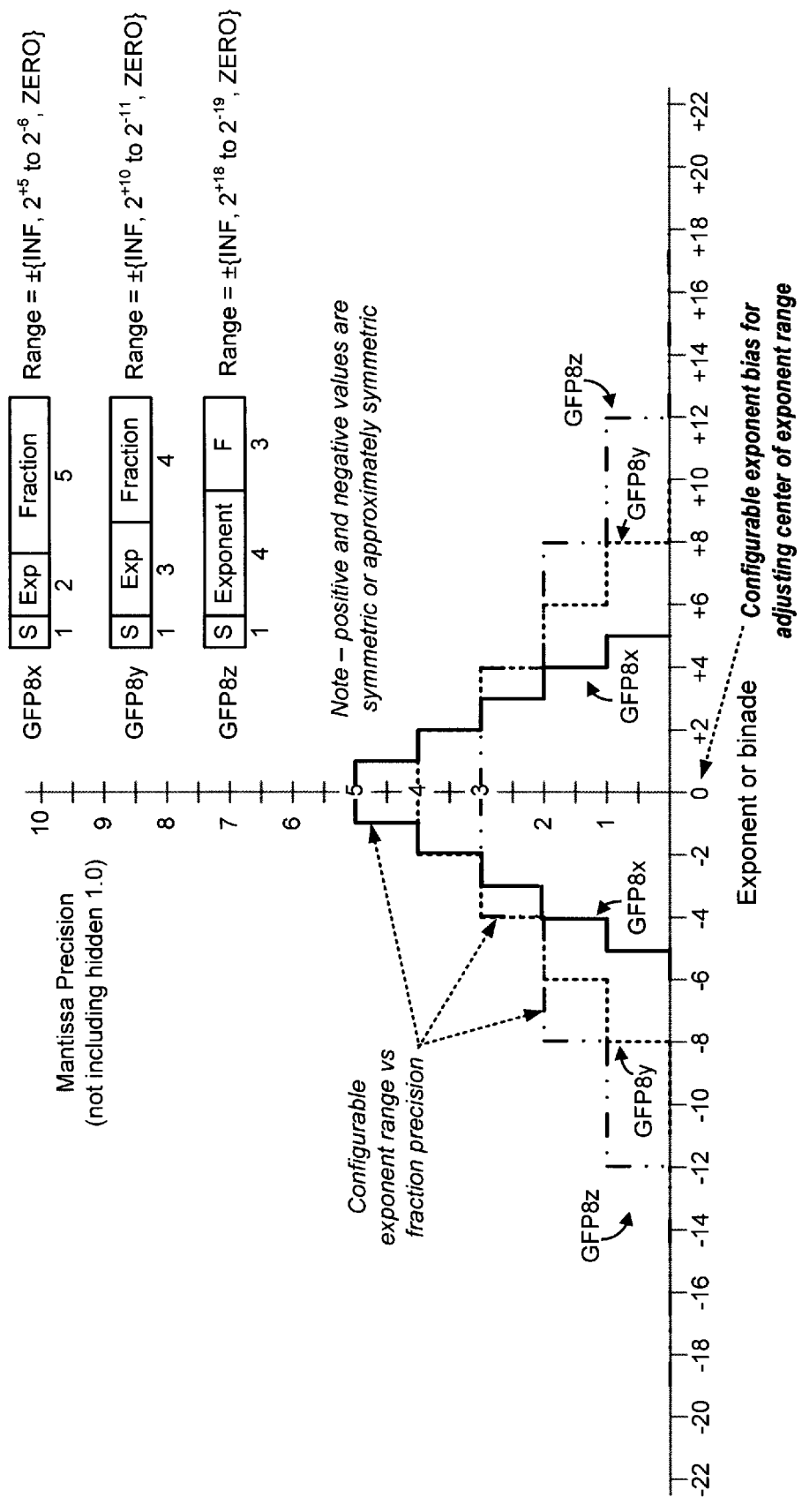
Figure 11:
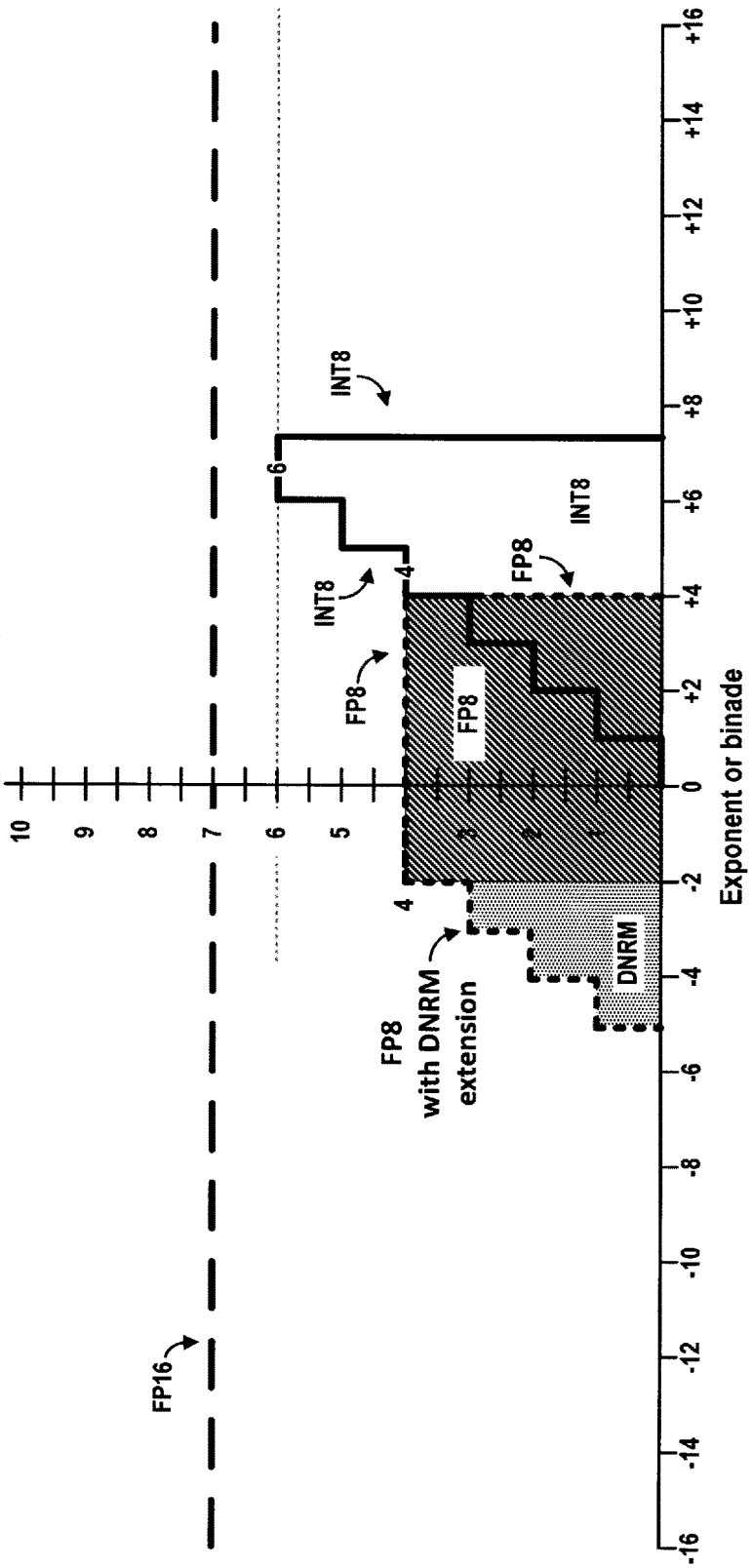
Figure 12A:
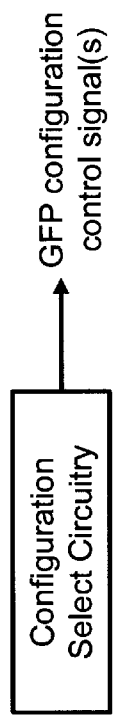
Figure 12B:
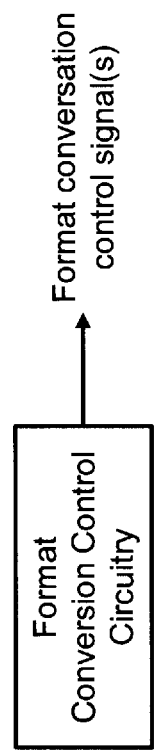
Figure 13A:
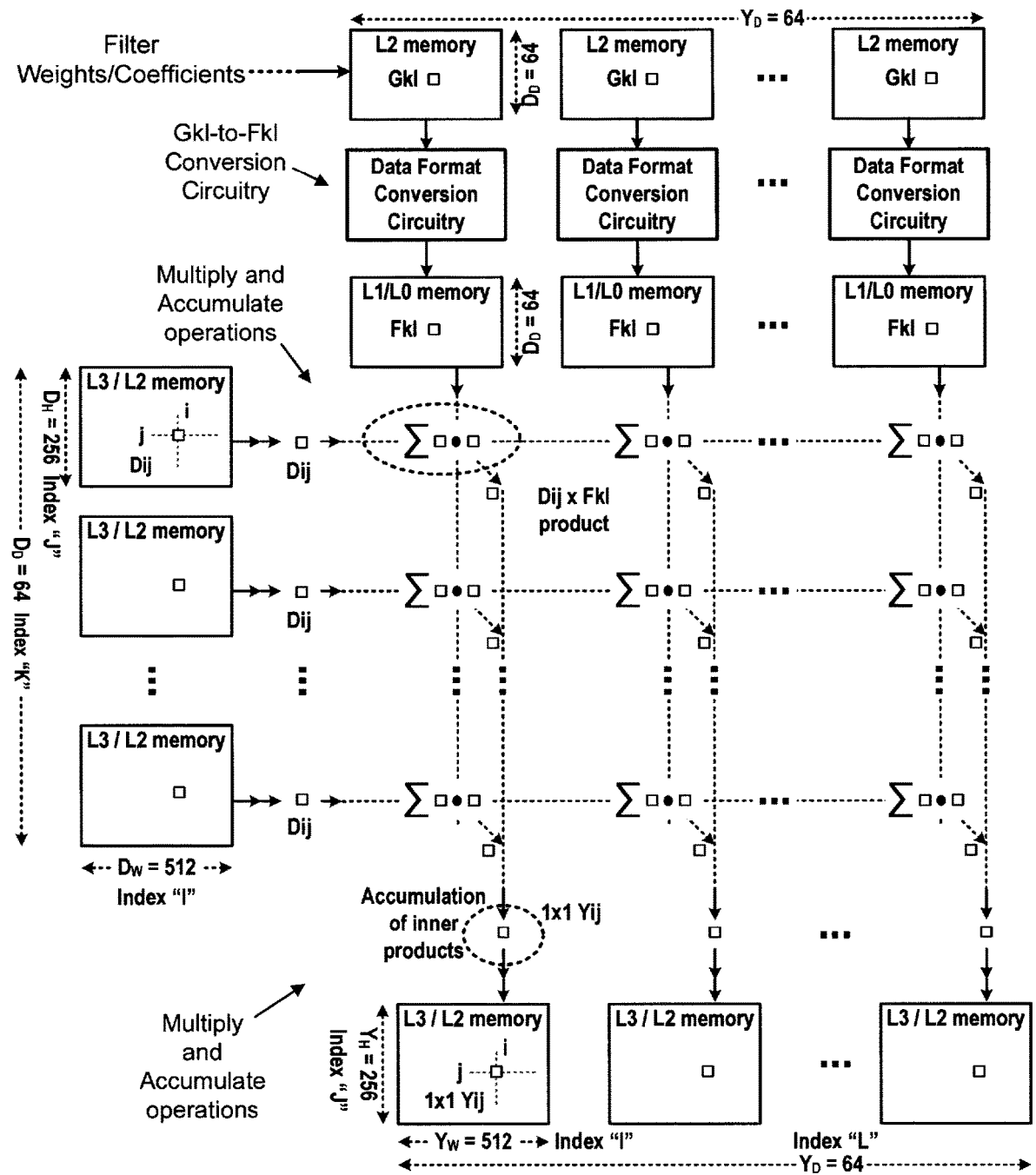
Figure 13B:
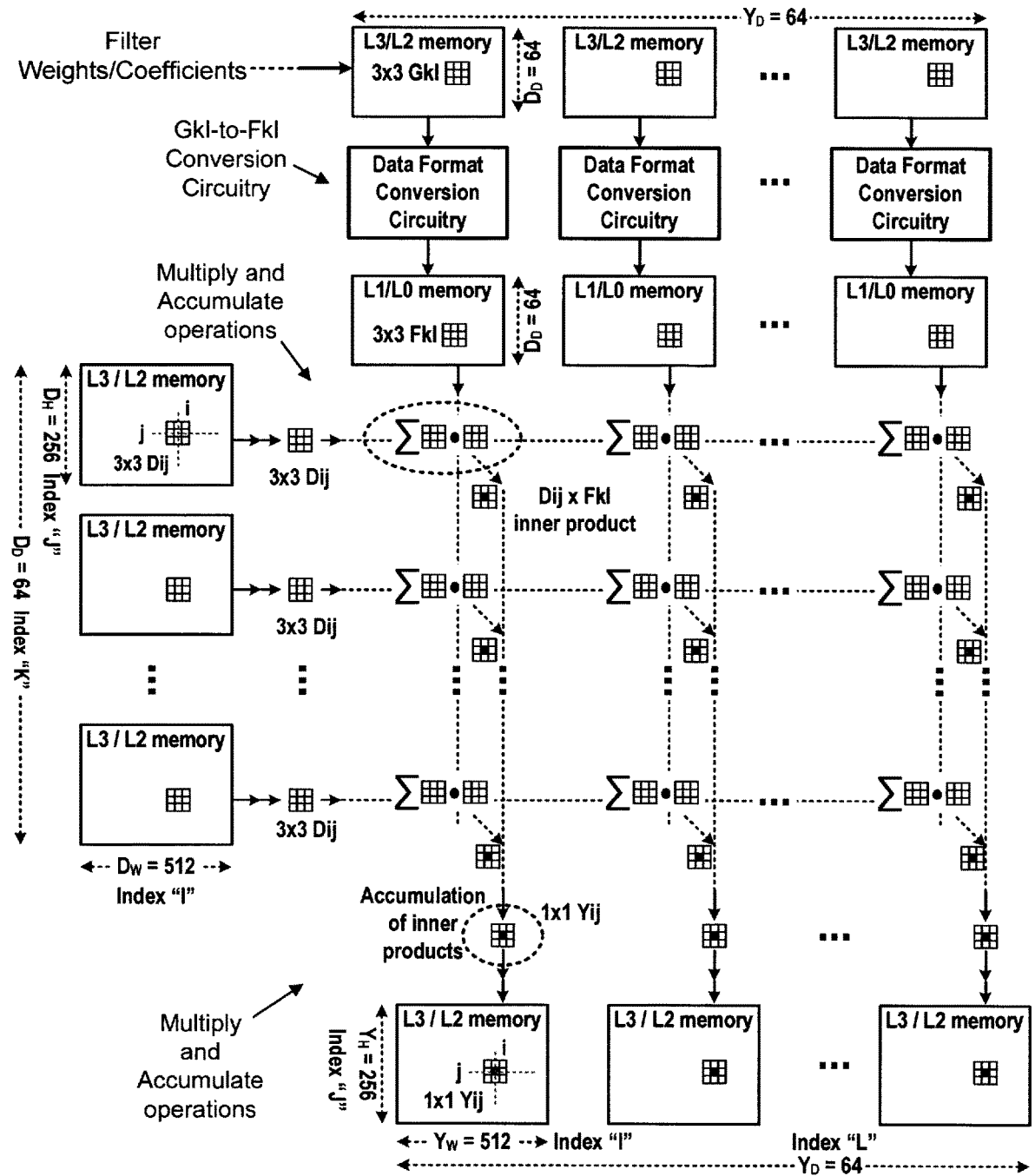
Figure 14A:
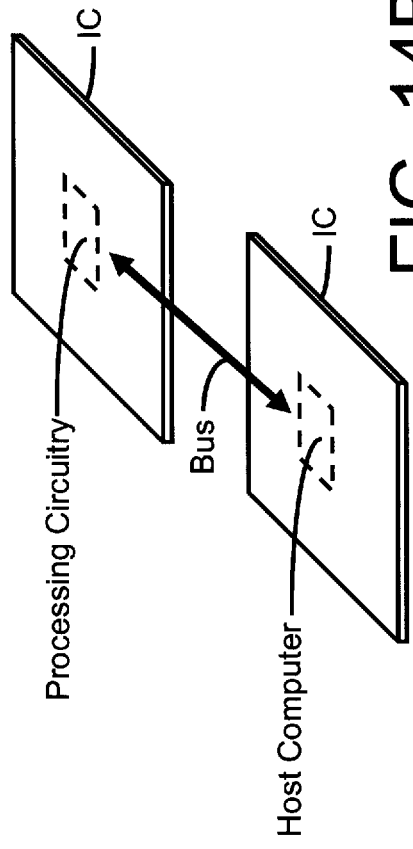
Figure 14B:
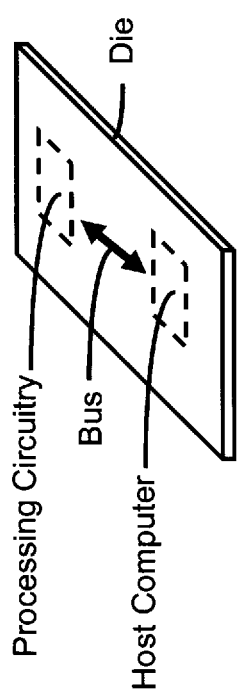
Figure 14C:
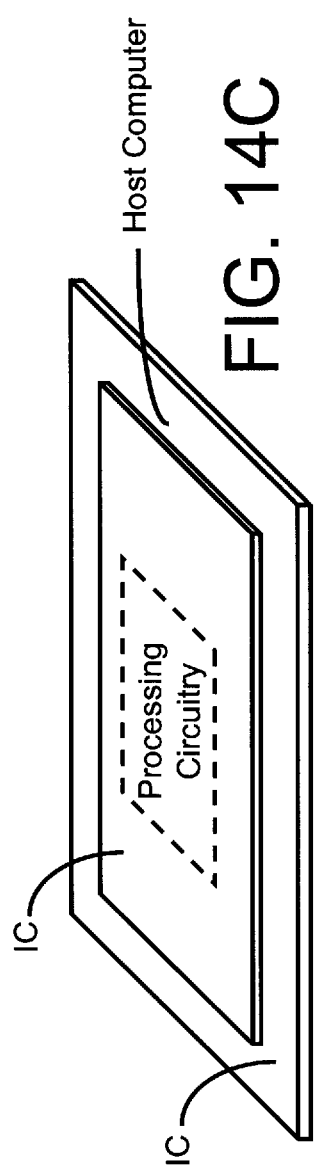
Figure 14D:
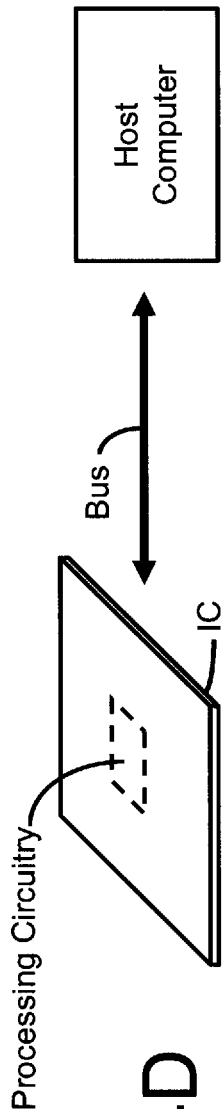

FIGS. 1A and 1B illustrate schematic block diagrams of logical overviews of an exemplary multiplier-accumulator execution pipelines connected in a linear pipeline configuration, according to one or more aspects of the present inventions, wherein the multiplier-accumulator processing or execution pipeline ("MAC pipeline") includes multiplier-accumulator circuitry having a plurality of multiplier-accumulator circuits ("MACs"), and data format conversion circuitry to convert the data format of the filter weights input (e.g., from external or internal memory) to the pipelines from a first format (e.g., floating point or fixed point data format) to a Gaussian floating point data format to a second data format (e.g., fixed point data format or floating point data format), via data format conversion circuitry, and thereafter to yet another data format (via conversion circuitry) that is correlated to the circuitry of the processing pipeline(s) wherein the filter weights may be stored in memory (e.g., L0 memory) before being available to the processing circuitry of the pipeline(s); in one embodiment, each MAC pipeline is associated with dedicated Gkl-to-Fkl conversion circuitry, having a data format conversion circuit; in another embodiment, each MAC of the MAC pipeline is associated with a dedicated data format conversion circuit of the Gkl-to-Fkl conversion circuitry; the plurality of MACs are is illustrated in block diagram form; an exemplary multiplier-accumulator circuit is illustrated in schematic block diagram form in Inset A; notably, in this exemplary embodiment, "m" (e.g., 64 in one illustrative embodiment) multiplier-accumulator circuits are connected in a linear execution pipeline to operate concurrently whereby the processing circuits perform m×m (e.g., 64×64) multiply-accumulate operations in each m (e.g., 64) cycle interval (here, a cycle may be nominally 1 ns); notably, each m (e.g., 64) cycle interval processes a Dd/Yd (depth) column of input and output pixels/data at a particular (i,j) location (the indexes for the width Dw/Yw and height Dh/Yh dimensions of this exemplary embodiment—Dw=512, Dh=256, and Dd=128, and the Yw=512, Yh=256, and Yd=64) wherein the m (e.g., 64) cycle execution interval is repeated for each of the Dw*Dh depth columns for this stage; in addition, in one embodiment, the filter weights or weight data are loaded into memory (e.g., L1/L0 SRAM memories) before the multiplier-accumulator circuitry starts processing (see, e.g., the '345 and '306 applications);

FIGS. 1C-1E illustrate schematic block diagrams of exemplary logical overviews of exemplary multiplier-accumulator execution or processing pipelines including a plurality of serially connected multiplier-accumulator circuits, wherein each multiplier-accumulator circuit includes a multiplier circuitry ("MUL") to perform/implement the multiply operations and accumulator circuitry ("ADD") to perform/implement the accumulate operations (e.g., in a concatenated manner), wherein the filter weights or filter coefficients, processed according to any of the embodiment described and/or illustrated herein, are provided, applied and/or available to the multiplier-accumulator circuits; in one embodiment, the multiplier circuitry of each MAC performs multiply operations in a floating point format and/or integer format wherein the filter weights, having a Gaussian floating point data format, are converted, prior to input into the multiplier circuitry, to such floating point format and/or integer format, via data format conversion circuitry; in one embodiment, the accumulator circuitry perform accumulation or addition operations in a floating point format; in this exemplary embodiment, the multiplier-accumulator circuit may include a plurality of memory banks (e.g., two SRAM memory banks) that are dedicated to the multiplier-accumulator circuit to store filter weights used by the multiplier circuitry of the associated multiplier-accumulator circuit (as described and illustrated in U.S. Provisional Patent Application No. 62/012,111 (filed Apr. 18, 2020), which is hereby incorporated by reference herein) wherein, in one embodiment, such memory store the filter weights after conversion from a Gaussian floating point data format to a floating point format and/or integer format (according to the data format upon which the multiplier circuitry is based); in one illustrative embodiment, the MAC execution or processing pipeline includes 64 multiplier-accumulator circuits (m=64); notably, in the logical overview of a linear pipeline configuration of this exemplary multiplier-accumulator execution or processing pipeline of FIG. 1D, a plurality of processing (MAC) circuits ("m") are connected in the execution pipeline and operate concurrently; for example, in one exemplary embodiment where m=64, the multiplier-accumulator processing circuits 64×64 multiply-accumulate operations in each 64 cycle interval; notably, the multiplier-accumulator circuits and circuitry of the present inventions may be interconnected or implemented in one or more multiplier-accumulator execution or processing pipelines including, for example, execution or processing pipelines as described and/or illustrated in U.S. Provisional Patent Application No. 63/012,111; as mentioned above, the '111 application is incorporated by reference herein in its entirety;

Figure 2B:
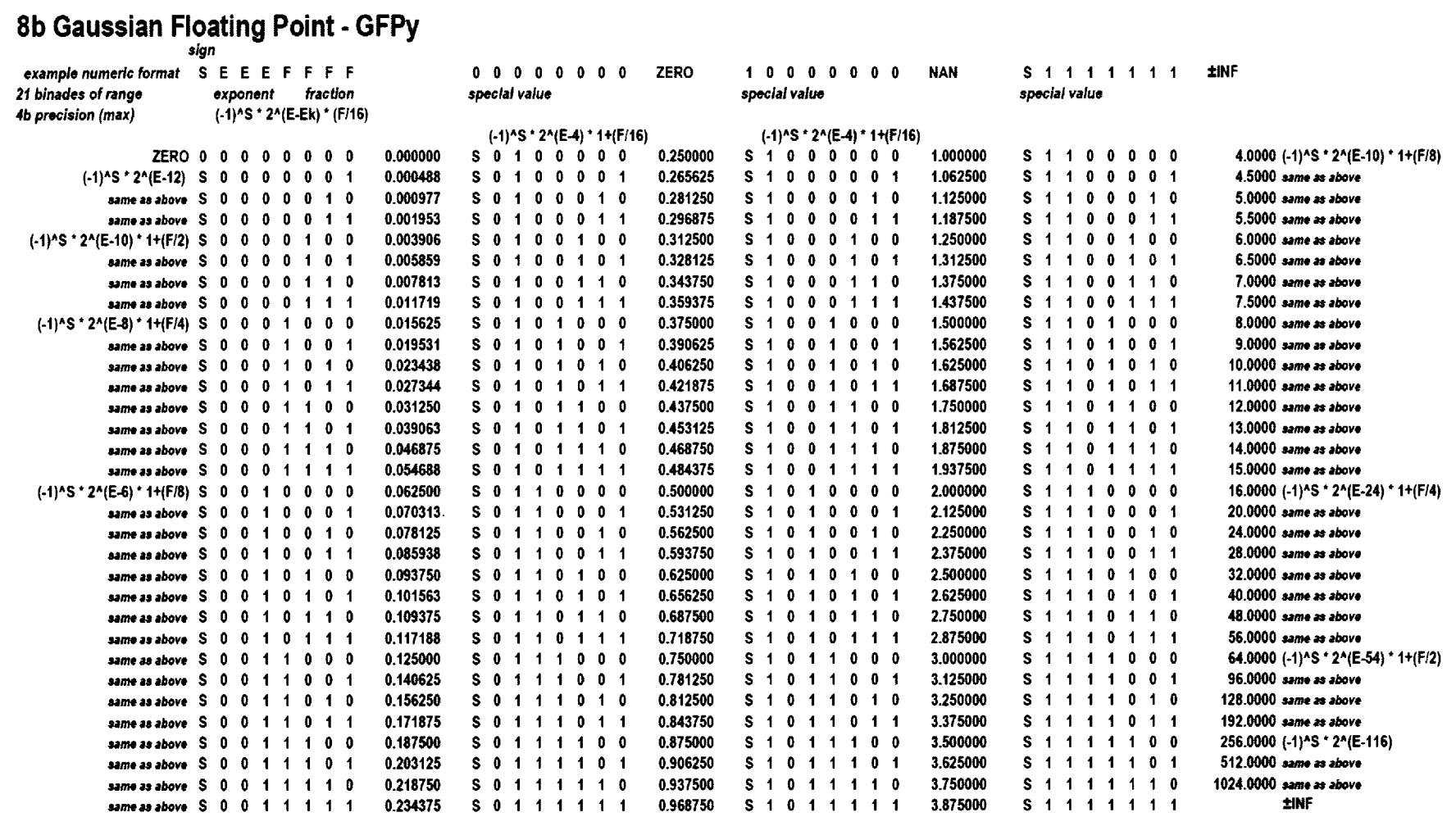

FIG. 2A illustrates an exemplary Gaussian floating point (GFP) format having a range and a precision to provide a fit to the set of data values that it is representing, according to one aspect of the present inventions; here, because of the symmetrical "falloff" from or characteristic relative to a maximum center-value is similar to the falloff of a gaussian distribution ($k*\exp(-((x-a)/s)^2)$), the "GFP" designation refers to "Gaussian floating point"; notably, the sign field is abbreviated, at times, as "S", the exponent field is abbreviated, at times, as "E", "Exp" or "Exponent", and the fraction field is abbreviated, at times, as "F" or "Fraction";

FIG. 2B represents an exemplary Gaussian floating point data format having a one bit sign field (S), a three bit exponent field (E, Exp or Exponent), and a four bit fraction field (F or Fraction), according to one embodiment of the present invention; notably, the sizes of these fields (based on a filter weight having 8 bit value) for the binades with a given precision wherein other binades increase/decrease the number of bits in the exponent field and will decrease/increase the number of bits of the fraction field; such difference may change the precision of these other binades; in this embodiment, the total number of bits (in this illustrative embodiment, 8 bits) of the GFP8 value remain constant across the range;

FIG. 3 illustrates a high-level block diagram layout of an integrated circuit or a portion of an integrated circuit (which may be referred to, at times, as an X1 component) including a plurality of multi-bit MAC execution pipelines, each pipeline having a plurality of multiplier-accumulator circuits—each of which implement multiply and accumulate operations, according to certain aspects of the present inventions; the multi-bit MAC execution pipelines and/or the plurality of multiplier-accumulator circuits may be configured to implement one or more processing architectures or techniques (singly or in combination with one or more X1 components) wherein the data format conversion circuitry of the present inventions is employed to convert the data format of the filter weights (which may be stored in memory such as L1 memory or L0 memory) from a GFP data format to a data format that is employed by the processing circuitry (e.g., floating point or fixed point data format); in this illustrative embodiment, the multi-bit MAC execution pipelines are organized into clusters (in this illustrative embodiment, four clusters wherein each cluster includes a plurality of multi-bit MAC execution pipelines (in this illustrative embodiment each cluster includes 16, 64-MAC execution pipelines (which may also be individually referred to below as MAC processors)); in one embodiment, the plurality of multiplier-accumulator circuitry are configurable or programmable (one-time or multiple times, e.g., at start-up and/or in situ) to implement one or more pipelining processing architectures or techniques (see, e.g., the expanded view of a portion of the high-level block diagram of FIG. 1B in the lower right is a single MAC execution pipeline (in the illustrative embodiment, including, e.g., 64 multiplier-accumulator circuits or MAC processors) which correlates to the schematic block diagram of a logical overview of an exemplary multiplier-accumulator circuitry arranged in a linear execution pipeline configuration—see FIG. 1A); the processing component in this illustrative embodiment includes memory (e.g., L2 memory, L1 memory and L0 memory (e.g., SRAM)), a bus interfaces (e.g., a PHY and/or GPIO) to facilitate communication with circuitry external to the component and memory (e.g., SRAM and DRAM) for storage and use by the circuitry of the component, and a plurality of switches/multiplexers which are electrically interconnected to form a switch interconnect network "Network-on-Chip" ("NOC") to facilitate interconnecting the clusters of multiplier-accumulator circuits of the MAC execution pipelines; in one embodiment, the NOC includes a switch interconnect network (e.g., a mixed-mode interconnect network (i.e., a hierarchical switch matrix interconnect network and a mesh, torus or the like interconnect network (hereinafter collectively "mesh network" or "mesh interconnect network")), associated data storage elements, input pins and/or look-up tables (LUTs) that, when programmed, determine the operation of the switches/multiplexers; in one embodiment, one or more (or all) of the clusters includes one or more computing elements (e.g., a plurality of multiplier-accumulator circuitry—labeled as "NMAX Rows"—see, e.g., the '345 and '306 applications); notably, in one embodiment, each MAC execution pipeline (which, in one embodiment, consists of a plurality of serially interconnected multiplier-accumulator circuits) is connected to an associated L0 memory (e.g., SRAM memory) that is dedicated to that processing pipeline; the associated L0 memory stores filter weights used by the multiplier circuitry of each multiplier-accumulator circuit of that particular MAC processing pipeline in performance of the multiply operations, wherein each MAC processing pipeline of a given cluster is connected to an associated L0 memory (which, in one embodiment, is dedicated to the multiplier-accumulator circuits of that MAC processing pipeline); a plurality (e.g., 16) MAC execution pipelines of a MAC cluster (and, in particular, the L0 memory of each MAC execution pipeline of the cluster) is coupled to an associated L1 memory (e.g., SRAM memory); here, the associated L1 memory is connected to and shared by each of the MAC execution pipelines of the cluster to receive filter weights to be stored in the L0 memory associated with each MAC execution pipeline of the cluster; in one embodiment, the associated L1 memory is assigned and dedicated to the plurality of pipelines of the MAC cluster; notably, the shift-in and shift-out paths of each 64-MAC execution pipeline is coupled to L2 memory (e.g., SRAM memory) wherein the L2 memory also couples to the L1 memory and L0 memory; the NOC couples the L2 memory to the PHY (physical interface) which may connect to L3 memory (e.g., external DRAM); the NOC also couples to a PCIe or PHY which, in turn, may provide interconnection to or communication with circuitry external to the X1 processing component (e.g., an external processor, such as a host processor); the NOC, in one embodiment, may also connect a plurality of X1 components (e.g., via GPIO input/output PHYs) which allow multiple X1 components to process related data (e.g., image data), as discussed herein, in accordance with one or more aspects of the present inventions;

FIG. 4A illustrates, in block diagram form, an exemplary embodiment of the circuitry and/or processes of the circuit or logical block diagram to convert filter weights or coefficients having an initial format (in this exemplary embodiment, floating point data format (e.g., FP16)) to filter weights having a Gaussian floating point data format (e.g., GFP8), according to one embodiment of the present inventions; notably, any manner of implementation of the circuitry and/or processes of FIG. 4A is intended to fall within the scope of the inventions (e.g., hardware and software implementations/embodiments, and/or data and/or instructions embodied in various computer-readable media);

FIGS. 4B and 4C illustrate, in circuit block diagram form, exemplary embodiments of the circuitry and/or processes of the circuit or logical block diagram block diagram (or portions thereof) illustrated in FIG. 4A, according to one embodiment of the present inventions; here again, any manner of implementation of the circuitry and/or processes of FIGS. 4B and 4C is intended to fall within the scope of the present inventions (e.g., hardware and software implementations/embodiments, and/or data and/or instructions embodied in various computer-readable media);

FIG. 5A illustrates a schematic block diagram of a logical overview of an exemplary multiplier-accumulator execution pipeline connected in a linear pipeline configuration, according to one or more aspects of the present inventions, wherein the multiplier-accumulator processing or execution pipeline ("MAC pipeline") includes multiplier-accumulator circuitry having a plurality of multiplier-accumulator circuits ("MACs"), and data format conversion circuitry of the present inventions is employed to convert the data format of the filter weights (which may be stored in L1 memory) from a GFP data format to a data format that is employed by the processing circuitry (e.g., floating point or fixed point data format); in one embodiment, each MAC pipeline is associated with dedicated Gkl-to-Fkl conversion circuitry, having a data format conversion circuit; in another embodiment, each MAC of the MAC pipeline is associated with a dedicated data format conversion circuit of the Gkl-to-Fkl conversion circuitry; the plurality of MACs are is illustrated in block diagram form; an exemplary multiplier-accumulator circuit is illustrated in schematic block diagram form in Inset A; notably, in this exemplary embodiment, "m" (e.g., 64 in one illustrative embodiment) multiplier-accumulator circuits are connected in a linear execution pipeline to operate concurrently whereby the processing circuits perform m×m (e.g., 64×64) multiply-accumulate operations in each m (e.g., 64) cycle interval (here, a cycle may be nominally 1 ns); in one embodiment, the filter weights or weight data are loaded into memory (e.g., L1/L0 SRAM memories) before the multiplier-accumulator circuitry starts processing (see, e.g., the '345 and '306 applications);

FIG. 5B illustrates a schematic/flow block diagram of a logical overview of an exemplary embodiment of a plurality of multiplier-accumulator circuit (MAC) execution or processing pipelines, for example, as illustrated in FIG. 5A, wherein data format conversion circuitry of the present inventions is employed to convert the data format of the filter weights, having a GFP data format (which may be stored in L1 memory), to filter weights having a data format that is consistent with the data format employed by the processing circuitry (e.g., floating point or fixed point data format); in this illustrative embodiment, the filter weights or coefficients having a GFP data format are stored in memory L1 (e.g., SRAM) (which may have been loaded/written into memory L1 from memory L2 where such filter weights or coefficients were stored in and read from), applied to data format conversion circuitry to convert filter weights or coefficients, having the GFP data format, to filter weights having a different data format (e.g., floating point data format (FP) or block-scaled fraction data format (BSF)) which are then applied to or input into the plurality of multiplier-accumulator circuits of the execution pipelines which implement/perform the multiply and accumulate operations to process the input data (Dij, e.g., image data) in, for example, a floating point data format regime; in one embodiment, each MAC pipeline is associated with a dedicated Gkl-to-Fkl conversion circuitry;

FIG. 6A illustrates, in block diagram form, an exemplary embodiment of the circuitry and/or processes of the circuit or logical block diagram to convert filter weights or coefficients, having a Gaussian floating point data format (in this exemplary embodiment, floating point data format (GFP8)), to filter weights having an exemplary floating point data format (e.g., FP16), according to one embodiment of the present inventions; in one embodiment, each MAC processing pipeline is associated with dedicated GFP-to-FP data format conversion circuitry, having a data format conversion circuit; in another embodiment, each MAC of the MAC processing pipeline is associated with a dedicated GFP-to-FP data format conversion circuit of the data format conversion circuitry; notably, any manner of implementation of the circuitry and/or processes of FIG. 6A is intended to fall within the scope of the present inventions (e.g., hardware and software implementations/embodiments, and/or data and/or instructions embodied in various computer-readable media);

FIG. 6B illustrates, in circuit block diagram form, an exemplary embodiment of the circuitry and/or processes of the circuit or logical block diagram block diagram (or portions thereof) illustrated in FIG. 6A, according to one embodiment of the present inventions; here again, any manner of implementation of the circuitry and/or processes of FIG. 6B is intended to fall within the scope of the present inventions (e.g., hardware and software (e.g., firmware) implementations or embodiments, and/or data and/or instructions embodied in various computer-readable media); in addition, in one embodiment, each MAC processing pipeline is associated with dedicated circuitry for the GFP-to-FP data format conversion, having a data format conversion circuit; in another embodiment, each MAC of the MAC processing pipeline is associated with a dedicated circuit for the GFP-to-FP data format conversion;

FIG. 7 illustrates an exemplary number space for a floating point data format (in this illustrative example, FP16) wherein the minimum and maximum exponent E[7:0] are reserved for special operands (NAN, INF, ZRO); a NAN value is generated when an undefined operation takes place (0*∞ or ∞−∞); ±INF values are the saturation value for exponent overflow; ±ZRO values are the saturation value for exponent underflow; in this embodiment, the ±DNRM values provide for gradual underflow between the smallest NRM value and the ZRO value;

FIG. 8A illustrates a schematic block diagram of a logical overview of an exemplary multiplier-accumulator execution pipeline connected in a linear pipeline configuration, according to one or more aspects of the present inventions, wherein the multiplier-accumulator processing or execution pipeline ("MAC pipeline") includes multiplier-accumulator circuitry having a plurality of multiplier-accumulator circuits ("MACs"), and data format conversion circuitry of the present inventions to convert the data format of the filter weights (which, in this illustrative embodiment, are stored in L0 memory) from a GFP data format to a data format that is employed by the processing circuitry (e.g., floating point or fixed point data format); in this embodiment, such format conversion circuitry converts the data format of the filter weights immediately prior to providing or applying the filter weights to the plurality of multiplier-accumulator circuits of the processing pipeline to implement or perform the multiply operations; here, the conversion of the filter weights from a Gaussian floating point data format to a fixed point or floating point data format (e.g., 16 bit floating point) is performed "on the fly"; the plurality of MACs are is illustrated in block diagram form; an exemplary multiplier-accumulator circuit is illustrated in schematic block diagram form in Inset A; notably, in this exemplary embodiment, "nn" (e.g., 64 in one illustrative embodiment) multiplier-accumulator circuits are connected in a linear execution pipeline to operate concurrently whereby the processing circuits perform m×m (e.g., 64×64) multiply-accumulate operations in each m (e.g., 64) cycle interval (here, a cycle may be nominally 1 ns); in one embodiment, the filter weights or weight data are loaded into memory (e.g., L1/L0 SRAM memories) before the multiplier-accumulator circuitry starts processing (see, e.g., the '345 and '306 applications); in one embodiment, each MAC pipeline is associated with dedicated Gkl-to-Fkl conversion circuitry, having a data format conversion circuit; in another embodiment, each MAC of the MAC pipeline is associated with a dedicated Gkl-to-Fkl data format conversion circuit of the data format conversion circuitry;

FIG. 8B illustrates a schematic/flow block diagram of a logical overview of an exemplary embodiment of a plurality of multiplier-accumulator circuit (MAC) execution or processing pipelines, for example, as illustrated in FIG. 8A, wherein the data format of the filter weights or coefficients are converted to from a GFP data format to a second data format (e.g., fixed point or floating point data format); in this illustrative embodiment, the filter weights or coefficients having a GFP data format are stored in memory L0 (e.g., SRAM) (which, in this illustrative embodiment, is loaded/written into memory L0 from memory L1), applied to data format conversion circuitry to convert the filter weights or coefficients, having the GFP data format, to filter weights having a second data format (e.g., FP) which are then applied to or input into the plurality of multiplier-accumulator circuits of the execution pipelines to implement/perform the multiply and accumulate operations to process the input data (Dij, e.g., image data) in, for example, a floating point data format regime;

FIG. 9A illustrates a schematic block diagram of a logical overview of an exemplary multiplier-accumulator execution pipeline connected in a linear pipeline configuration, according to one or more aspects of the present inventions, wherein the multiplier-accumulator processing or execution pipeline ("MAC pipeline") includes multiplier-accumulator circuitry having a plurality of multiplier-accumulator circuits ("MACs"), and data format conversion circuitry of the present inventions is employed to convert the data format of the filter weights (which may be stored in L1 memory) from a GFP data format to a data format that is employed by the processing circuitry (e.g., floating point or fixed point data format) and the filter weights are organized in groups of filter weights (correlated to the groups of associated input data), wherein each group includes a plurality of associated filter weights; in one embodiment, each MAC pipeline is associated with dedicated Gkl-to-Fkl conversion circuitry, having a data format conversion circuit; in another embodiment, each MAC of the MAC pipeline is associated with a dedicated Gkl-to-Fkl data format conversion circuit of the data format conversion circuitry; the plurality of MACs are is illustrated in block diagram form; an exemplary multiplier-accumulator circuit is illustrated in schematic block diagram form in Inset A; notably, in this exemplary embodiment, "m" (e.g., 64 in one illustrative embodiment) multiplier-accumulator circuits are connected in a linear execution pipeline to operate concurrently whereby the processing circuits perform m×m (e.g., 64×64) multiply-accumulate operations in each m (e.g., 64) cycle interval (here, a cycle may be nominally 1 ns); in one embodiment, the filter weights or weight data are loaded into memory (e.g., L0 SRAM memory of each MAC) before the multiplier-accumulator circuitry starts processing;

FIG. 9B illustrates a schematic/flow block diagram of a logical overview of an exemplary embodiment of a plurality of multiplier-accumulator circuit (MAC) execution or processing pipelines, for example, as illustrated in FIG. 9A, wherein data format conversion circuitry of the present inventions is employed to convert the data format of the filter weights, having a GFP data format (which may be stored in L1 memory), to filter weights having a data format that is consistent with the data format employed by the processing circuitry (e.g., floating point or fixed point data format); in this illustrative embodiment, the filter weights or coefficients having a GFP data format are stored in memory L1 (e.g., SRAM) (which may have been loaded/written into memory L1 from memory L2 where such filter weights or coefficients were stored in and read from), applied to data format conversion circuitry to convert a plurality of groups of associated filter weights or coefficients, having the GFP data format, to a plurality of groups of associated filter weights, having the data format that corresponds to the multiplier circuitry of the MACs of the MAC pipeline; in this embodiment, the plurality of groups of associated filter weights or coefficients are thereafter written to and stored in memory (in the illustrative example, L0 memory); the groups of associated filter weights, having the data format that corresponds to the multiplier circuitry of the MAC, are read from L0 memory and employed by the multiplier circuitry of the MACs to process associated groups of input data (Dij, e.g., image data) in, for example, a floating point data format regime; in one embodiment, each MAC pipeline is associated with a dedicated Gkl-to-Fkl conversion circuitry;

FIG. 9C illustrates a schematic/flow block diagram of a logical overview of an exemplary embodiment of a plurality of multiplier-accumulator circuit (MAC) execution or processing pipelines wherein the data format of the filter weights or coefficients are converted from a Gaussian floating point data format to a fixed point or floating point data format (e.g., 16 bit floating point) "on the fly"; in this embodiment, the multiplier circuitry of the MACs process the input data in groups wherein groups of associated filter weights, having the data format that corresponds to the multiplier circuitry of the MACs of the pipelines, are output from the data conversion circuitry and employed by the multiplier circuitry of the MACs of each pipeline to process associated groups of input data;

Figure 10B:
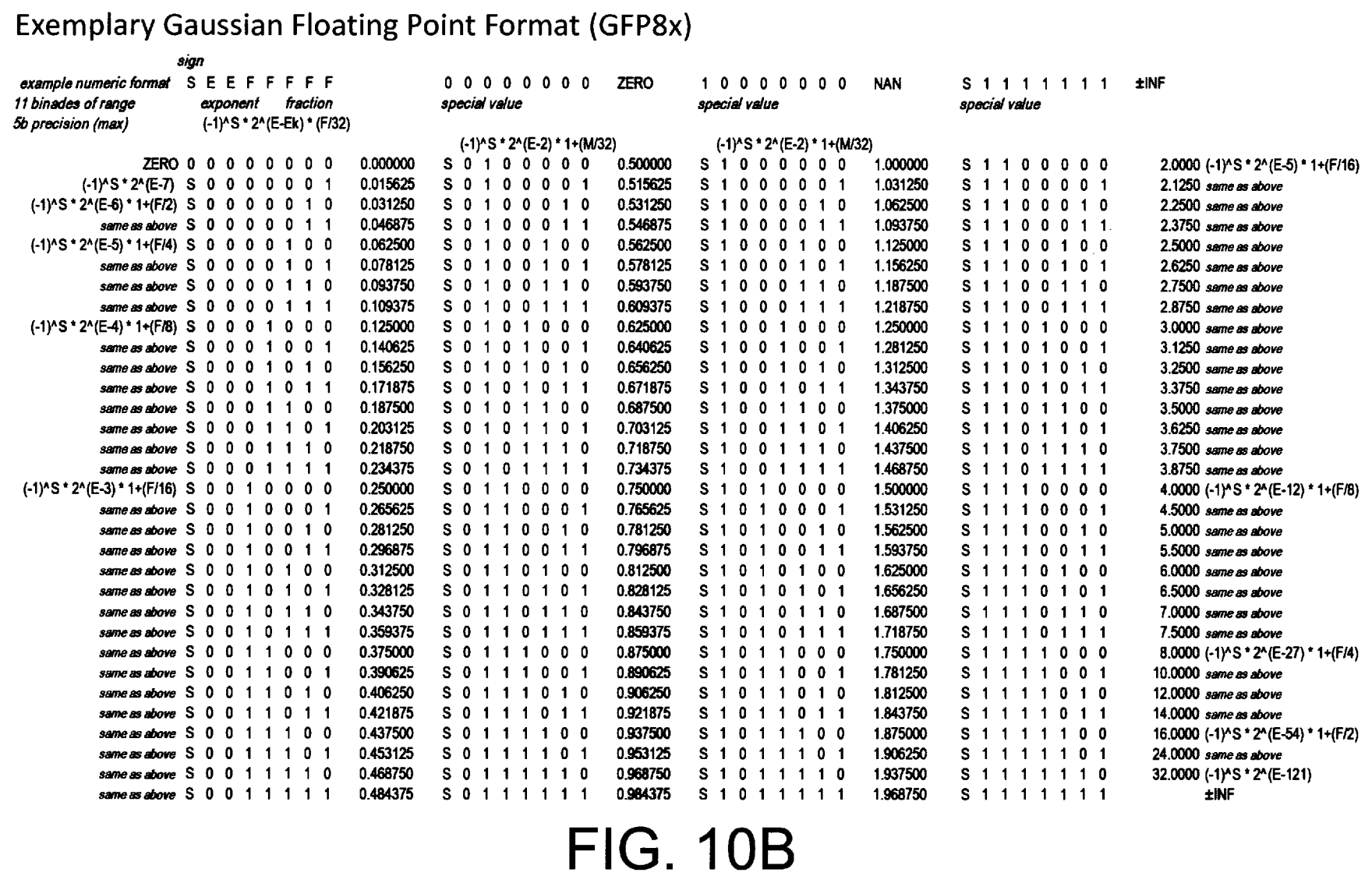
Figure 10C:
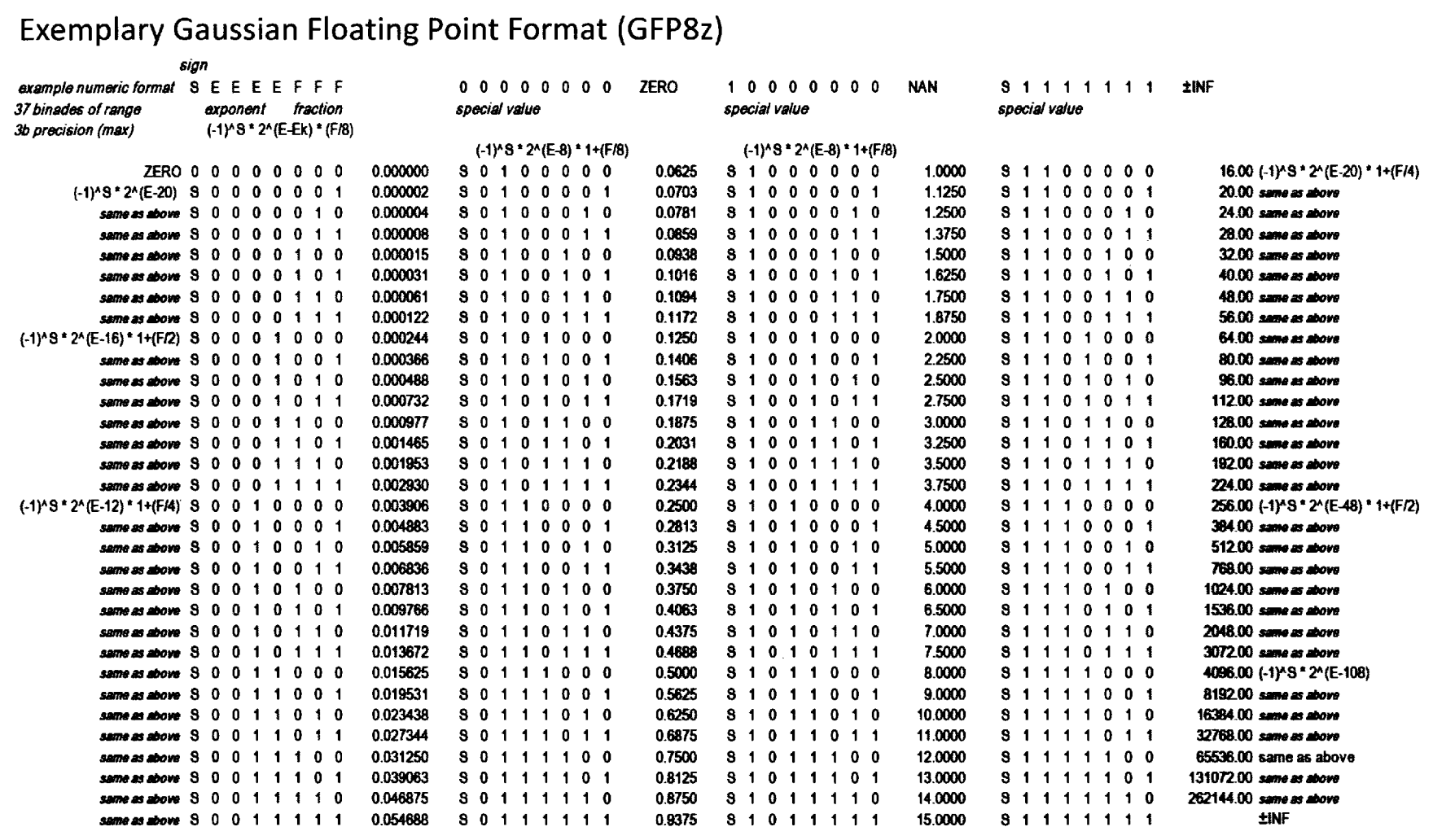

FIG. 10A illustrates exemplary alternative Gaussian floating point data formats (GFP8x, GF8Py, GFP8z) whose range and precision may be configured, in one embodiment, statically or, in another embodiment, dynamically to, for example, provide a better fit to the set of correlated input data values; the precisions of each of the exemplary Gaussian floating point data formats falls off symmetrically; GFP8x data format includes the center two binades (−1 to +1) and it has five (5) bits of precision (fraction field); GFP8x data format includes zero bits of precision (a single value) in the binade from −5 to −6 and at the binade at +5; the GFP8y data format includes the center two binades (−1 to +1) and it has four (4) bits of precision (fraction field); the GFP8y data format includes zero bits of precision (a single value) in the binade from −8 to −11 and in the binade from +8 to +10; the GFP8z data format includes the center eight binades (−4 to +4) and it has three (3) bit of precision including zero bits of precision (a single value) in the binades from −19 to −12 and in the binades from +12 to +18; notably, the sign field is abbreviated, at times, as "S", the exponent field is abbreviated, at times, as "E", "Exp" or "Exponent", and the fraction field is abbreviated, at times, as "F" or "Fraction";

FIG. 10B represents an exemplary Gaussian floating point data format (GFP8x) having a one bit sign field (S), a two bit exponent field (E), and a five bit fraction field (F), according to one embodiment of the present invention; notably, these are the field sizes (based on an 8 bit filter weight) for the binades with a given precision wherein other binades increase/decrease the number of bits in the exponent field (E) and will reduce/increase the number of bits of the fraction field (F); such difference may reduce/increase the precision of these other binades; in this embodiment, the total number of bits (in this illustrative embodiment, 8 bits) of the GFP8 value remain constant across the range;

FIG. 10C represents an exemplary Gaussian floating point data format (GFP8z) having a one bit sign field (S), a four bit exponent field (E), and a three bit fraction field (F), according to one embodiment of the present invention; notably, these are the field sizes (based on an 8 bit filter weight) for the binades with a given precision wherein other binades increase/decrease the number of bits in the exponent field (E) and will reduce/increase the number of bits of the fraction field (F); such difference may reduce/increase the precision of these other binades; in this embodiment, the total number of bits (in this illustrative embodiment, 8 bits) of the GFP8 value remain constant across the range;

FIG. 11 illustrates the range and precision of exemplary data formats of the filter weights, including an 8 bit integer data format (INT8—see solid line) and an 8 bit floating point data format (FP8—see dotted line), wherein the precisions of each of the exemplary data formats do not fall off symmetrically in the manner of the precisions of the exemplary Gaussian floating point data formats illustrated in FIG. 10A; notably, also illustrated is the range and precision of a 8 bit floating point data format (FP16—see dashed line);

FIG. 12A illustrates a block diagram of configuration selection circuitry which generates Gaussian floating point (GFP) configuration control signal(s), according to one embodiment of the present inventions, wherein, in one embodiment, the configuration selection circuitry controls, changes or selects the configuration of the Gaussian floating point data format of the filter weights;

FIG. 12B illustrates a block diagram of format conversion control circuitry which generates format conversion control signal(s) wherein, in one embodiment, the conversion control circuitry controls, changes or selects the data format of the output of the conversion circuitry configuration, according to one embodiment of the present inventions;

FIGS. 13A and 13B illustrate schematic/flow block diagrams of logical overviews of an exemplary embodiment of a plurality of multiplier-accumulator circuit (MAC) execution or processing pipelines, for example, as illustrated in FIGS. 8A and 9A, respectively, wherein the data format of the filter weights or coefficients are converted to from a GFP data format to a second data format (e.g., fixed point or floating point data format); in this illustrative embodiment, the filter weights or coefficients, having a GFP data format, are stored in memory L2 or L3 (e.g., SRAM), applied to data format conversion circuitry to convert a plurality of groups of associated filter weights or coefficients, having the GFP data format, to a plurality of groups of associated filter weights having a second data format (e.g., FP) which are then stored or written into L1 or L0 and subsequently available to be input into the plurality of multiplier-accumulator circuits of the execution pipelines to implement/perform the multiply and accumulate operations to process the input data (Dij, e.g., image data) in, for example, a floating point data format regime;

FIG. 14A illustrates a die including an integrated circuit, in accordance with aspects and/or embodiments of the present inventions, wherein a computer (e.g., host computer or processor) and processing circuitry (including MAC processing pipeline(s)), connected thereto, are disposed on or integrated in the same die; notably, although not separately illustrated, in addition thereto or in lieu thereof, the computer may be a processor, controller and/or logic circuitry; here, the bus provides a communication path between processing circuitry and computer, processor, controller, and/or logic circuitry, as described and illustrated herein;

FIG. 14B illustrates two separate die, in accordance with aspects and/or embodiments of the present inventions, wherein the computer (e.g., host computer or processor) may be disposed on a first die and processing circuitry is disposed on a second, different die; here, the layout of the dice is co-planar (i.e., side-by-side) wherein the bus provides a communication path therebetween; notably, similar to that described above with respect to FIG. 14A, although not separately illustrated, in addition thereto or in lieu thereof, the computer may be a processor, controller and/or logic circuitry;

FIG. 14C illustrates two separate die, in accordance with aspects and/or embodiments of the present inventions, in a stacked die architecture wherein the processing circuitry (including MAC processing pipeline(s)) is disposed in/on a first die which is attached or disposed on a second die including the computer (e.g., host computer or processor); here, the layout of the dice is stacked/vertical and the bus may be connected between the dice in any manner now known or later developed, to provide a communication path between the processing circuitry and the computer; notably, the dice may flipped wherein the die including the computer may be disposed or stacked on the die including the processing circuitry; similar to that described above with respect to FIGS. 14A and 14B, although not separately illustrated, in addition thereto or in lieu thereof, the computer may be a processor, controller and/or logic circuitry; and FIG. 14D illustrates a die including an integrated circuit, in accordance with aspects and/or embodiments of the present inventions, wherein the processing circuitry (including MAC processing pipeline(s)), is disposed thereon or integrated therein and the computer (e.g., host computer or processor) is separate therefrom; notably, although not separately illustrated, in addition thereto or in lieu thereof, the computer may be a processor, controller and/or logic circuitry; here, the bus provides a communication path between processing circuitry and computer, processor, controller, and/or logic circuitry, as described and illustrated herein.

Again, there are many inventions described and illustrated herein. The present inventions are not limited to illustrative exemplary embodiment including with respect to: (i) particular floating point data format(s), particular fixed point data format(s), block/data width or length, data path width, bandwidths, values, processes and/or algorithms illustrated, or (ii) the exemplary logical or physical overview configurations, exemplary circuitry configuration and/or exemplary Verilog code.

Moreover, the present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed or illustrated separately herein.

DETAILED DESCRIPTION

In a first aspect, the present inventions are directed to one or more integrated circuits having multiplier-accumulator circuitry (and methods of operating such circuitry) including processing or execution pipeline(s) for processing data (e.g., filtering image data) wherein the filter coefficients or weights, employed in the multiply operations, are converted from a first data format (e.g., fixed point data format or floating point data format) to a Gaussian floating point data format, via data format conversion circuitry, and thereafter written to and/or stored in memory (e.g., L2 memory or L1 memory, such as SRAM). The filter weights, having the Gaussian floating point data format, may then be read from memory and converted, via data format conversion circuitry, from the Gaussian floating point data format to a data format that correlates to the processing format of MAC circuit(s) (e.g., fixed point data format or floating point data format) of, for example, a MAC pipeline. Thereafter, the filter weights, in one embodiment, may be input directly into the MAC circuit(s) during operation/processing. In another embodiment, the filter weights, having the data format (e.g., fixed point data format or floating point data format) that correlates to the processing format of the MAC circuit(s) may be output from the data format conversion circuitry and written into memory (e.g., memory(ies) that is/are local to one or more (or each) MAC(s) of, for example, the MAC pipeline). The filter weights may then be read from the local memory, input into the MAC(s), and employed thereby during data processing.

In the context of image filtering applications, for example, the memory and execution resources are often configured to reduce, minimize and/or eliminate performance bottlenecks. It is true of not only the computation hardware, but also of the hierarchy/architecture of the memory that stores the data structures and the communication networks that interconnect that circuitry. The present inventions, in one aspect, employ a memory storage format and filter weight data format that improves and/or maximizes cost-efficiencies of the hardware resources (e.g., memory and memory bandwidth).

For example, where a MAC pipeline(s) are employed in image filtering applications, the accumulation operations (see, e.g., the Yijl values in FIG. 1A) have "high" (e.g., the highest) precision numeric data formats. The input data (see, e.g., the Dijk values in FIG. 1A) are stored in memory in "moderate" precision numeric formats—typically, for example, in L3 memory and/or L2 memory. The filter weights are often stored in memory in "low" precision numeric formats (e.g., 8 bit floating point data format or 8 bit integer format). Indeed, filter weights are often stored in the lowest precisions of all numeric formats of all data/values employed and/or generated in the data processing/image filtering. However, the filter weights used for the image filtering processing applications may have a significant impact on L3 memory and L2 memory capacity and bandwidth and employ a large fraction of the total available memory capacity and memory bandwidth at the L3 memory and L2 memory levels of the memory architecture and resources.

In one embodiment, the filter coefficients or weights, having the first format (e.g., fixed point data format or floating point data format), may be initially stored in memory (e.g., L3 memory, such as DRAM) resident on the one or more integrated circuits having multiplier-accumulator circuitry. In another embodiment, the filter coefficients or weights, having the first format (e.g., fixed point data format or floating point data format) may be input to the integrated circuit and, before storing the filter weights in memory, apply such weights to data format conversion circuitry to generate filter coefficients or weights having the Gaussian floating point data format.

Notably, filter coefficients or weights having a Gaussian floating point data format include a more symmetrical distribution from a maximum center-value (relative to other data formats, e.g., fixed point data format or floating point data format) and, as such, may provide a suitable tradeoff between range and precision. For example, in contrast to an 8 bit Gaussian floating point data formats (GFP8), the precisions of an 8 bit integer data format (INT8) and an 8 bit floating point data format (FP8) do not fall off symmetrically in the manner of the precisions of the exemplary Gaussian floating point data formats. (See, e.g., FIGS. 10A and 11). Moreover, the symmetrically distributive nature of the Gaussian floating point data format may reduce the memory allocation/size attributed to the filter weights to a number of bits, in view of the available memory on the one or more integrated circuits, that provides an appropriate range and precision thereof in connection with the filtering operations (e.g., image filtering).

With reference to FIGS. 1A and 1B, in one embodiment, filter coefficients having an initial data format, (e.g., floating point consisting of 16 or 32 bits (i.e., FP16 or FP32) are generated external to the one or more integrated circuits (e.g., a processor of the host computer) and input/provided to the circuitry associated with an execution pipeline for implementing data processing operations. In one embodiment, the filter weights or coefficients, in an initial data format that is different from Gaussian floating point data format, are received and converted by format conversion circuitry (GFP conversion circuitry) to Gaussian floating point ("GFP") data format. (See FIG. 1A). Here, the format conversion circuitry converts the data format of the filter weights to Gaussian floating point data format and stores the filter weights, having the Gaussian floating point data format, in memory disposed on the integrated circuit (e.g., L2 memory—e.g., SRAM). (See FIG. 1A). Thereafter, the filter weights in the Gaussian floating point data format may be written to and are stored in a second memory disposed on the integrated circuit (in this embodiment, L1 memory—e.g., SRAM)).

In another embodiment, the filter coefficients, having an initial data format (e.g., FP16 or FP32), are input/provided to the circuitry associated with an execution pipeline and initially stored in memory (e.g., L2 memory). (See FIG. 1B). In this embodiment, before providing the filter weights to the multiplier-accumulator circuit(s), the filter weights, having the initial data format, are read from memory which is disposed on the integrated circuit and input into format conversion circuitry (GFP conversion circuitry) wherein the data format of the filter weights is converted to the Gaussian floating point data format. The output of the format conversion circuitry is written into and stored in a second memory (e.g., L1 memory). (See FIG. 1B). Here, the GFP conversion circuitry converts the data format of the filter weights to the Gaussian floating point data format. The GFP conversion circuitry outputs the filter weights, having the Gaussian floating point data format, which are then written to and stored in a second memory disposed on the integrated circuit (in this embodiment, L1 memory—e.g., SRAM)).

With continued reference to FIGS. 1A and 1B, the filter coefficients, having the Gaussian floating point data format, are read from memory (L1 memory) and applied to or input into format conversion circuitry (Gkl-to-Fkl conversion circuitry) which converts the filter coefficients, having the Gaussian floating point data format, to filter coefficients having a data format that correlates to the processing format of MAC circuit(s) (e.g., fixed point data format or floating point data format) of, for example, a MAC pipeline. The output of the Gkl-to-Fkl conversion circuitry (i.e., filter weights, having the data format that correlates to the processing format of MAC circuit) are written into and stored in a memory (L0 memory, such as SRAM) that is local and/or dedicated to a given MAC circuit. Thereafter, the filter weights, having the data format that correlates to the processing format of MAC circuit, are read from memory (L0 memory in this exemplary embodiment) and provided to the MAC circuit during operation/processing of the input data (D).

Briefly, the MAC or MAC circuit includes a multiplier circuit and an accumulator circuit. With reference to FIGS. 1C-1E, the MAC circuit(s) may be configured or interconnected (for example, in a serially) to form one or more MAC processing pipeline which implement the multiply operations (via multiplier circuitry (MUL)) and accumulate operations (via accumulator circuitry (ADD)). The MAC pipeline facilitates concatenating the multiply and accumulate operations thereby allowing a plurality of multiplier-accumulator circuits to perform such operations more quickly. The present inventions may employ any MAC and/or MAC pipeline now known or later developed. In one embodiment, the present inventions employ one or more of the MACs that are described and/or illustrated in the exemplary embodiments of U.S. patent application Ser. No. 16/545,345 and U.S. Provisional Patent Application No. 62/725,306. In another embodiment, the present inventions employ one or more of the MAC pipelines that are described and/or illustrated in U.S. Provisional Patent Application No. 63/012,111; again, the '111 application is incorporated by reference herein in its entirety.

As noted above, the filter coefficients or weights in a Gaussian floating point data format provide a more symmetrical distribution from a maximum center-value and, as such, may provide a suitable tradeoff between range and precision. (See, e.g., FIG. 2A wherein, in this exemplary embodiment, an 8 bit GFP filter coefficient includes 3 bits allocated to the exponent value, 4 bits allocated to the fraction value and one bit allocated as a sign bit (positive or negative)). The symmetrically distributive nature of the Gaussian floating point data format may reduce the memory allocation/size attributed to the filter weights to a number of bits, in view of the available memory on the one or more integrated circuits, that provides an appropriate range and precision thereof in connection with the data processing operations including filtering (e.g., image filtering).

With reference to FIG. 2A, a Gaussian floating point (GFP) format includes a symmetrical "falloffs" from or characteristic relative to a maximum center-value that is similar to the falloff of a Gaussian distribution (e.g., $k*\exp(-((x-a)/s)^2)$). The range and precision of the GFP format is defined by the number of bits of the exponent field and the number of bits of the fraction field. The GFP format is centered—in this exemplary embodiment, via four binades (−2 to +2). Further it includes a precision determined by the 4 bits of the fraction field. Here, unlike the floating point data format or fixed point data format (e.g., FP8 or INT8, respectively—see FIG. 11), the precision of the GFP8 format "falls off" from a center symmetrically. There are zero bits of precision (a single value) in the three binades from −11 to −8 and in the three binades from +8 to +10.

Notably, the symmetrical characteristic of GFP is, in one embodiment, similar to a falloff in the distribution of data weight values for certain image filtering applications. As such, the symmetrical characteristic of GFP may present an advantageous data format for most of the data values for a data set of such image filtering applications wherein most of the data values fall in the binades with the most bits of precision. Moreover, the GFP data format may provide an advantageous "soft" saturation at both edges of the range. In contrast to exemplary Gaussian floating point data formats, the precisions of an 8 bit integer data format and an 8 bit floating point data format do not fall off symmetrically in the manner of the precisions of the exemplary Gaussian floating point data formats. Compare the illustrations of the GFP data format in FIGS. 2A and 10A with the illustrations of the 8 bit integer data format (INT8—see solid line) and an 8 bit floating point data format (FP8—see dotted line) in FIG. 11.

With reference to FIG. 2B, a Gaussian floating point data format, in one embodiment, includes a one bit sign field (S), a three bit exponent field (E), and a four bit fraction field (F). These are the field sizes (based on an 8 bit filter weight) for the binades with a higher precision. Other binades increase the number of bits in the exponent field (E) and will reduce the number of bits of the fraction field (F). Such difference will reduce the precision of these other binades. As noted above, in this embodiment, the total number of bits of the GFP8 value (8 bits) will remain constant across the range.

With continued reference to FIG. 2B, the GFP8 binades with maximum precision are in the two center columns—the 3 bit exponent field (E) is equal to {010, 011, 100, and 101}. The value of these GFP8 encodings is $(-1)^S*2^{(E-Ek)}*(1+F/16)$, where S is the sign bit, E is the three bit field, and F is the four bit fraction field. Note that there is a hidden/implicit bit with a value of one that is always added to the fraction field.

The exponent bias value Ek is equal to four in this range. The four exponent field values {010, 011, 100, and 101} will create scaling values of $\{2^{(-2)}, 2^{(-1)}, 2^{(0)}, 2^{(+1)}\}$. This exponent bias value is configurable. Changing it will change the center-point of the GFP8y range of binade values. The exponent bias values for all the binades must be changed together so that no gap regions or overlap regions are introduced between the binade ranges.

The column on the upper right of FIG. 2B illustrates the next two larger binades (with lower precisions). The 4 bit exponent field (E) is equal to {1100, 1101}. The value of these GFP8 encodings is $(-1)^S*2^{(E-Ek)}*(1+F/8)$, where S is the sign bit, E is the four bit field, and F is the three bit fraction field. The exponent bias value Ek is equal to 10 in this range.

Notably, the next two larger binades (with lower precisions) have a 5 bit exponent field (E) equal to {11100, 11101}. The value of these GFP8 encodings is $(-1)^S*2^{(E-Ek)}*(1+F/4)$, where S is the sign bit, E is the five bit field, and F is the two bit fraction field. The exponent bias value Ek is equal to 24 in this range.

The next two larger binades (with lower precisions) have a 6 bit exponent field (E) equal to {111100, 111101}. The value of these GFP8 encodings is $(-1)^S*2^{(E-Ek)}*(1+F/2)$, where S is the sign bit, E is the six bit field, and F is the one bit fraction field. The exponent bias value Ek is equal to 54 in this range.

The next three larger binades (with lower precisions) have a seven bit exponent field (E) is equal to {1111100, 1111101, 1111110}. The value of these GFP8 encodings is $(-1)^S*2^{(E-Ek)}*(1)$, where S is the sign bit, E is the seven bit field, and F is the zero bit fraction field. The exponent bias value Ek is equal to 116 in this range.

With continued reference to FIG. 2B, the column on the lower left of the figure shows the next two smaller binades (with lower precisions). The 4 bit exponent field (E) is equal to {0010, 0011}. The value of these GFP8 encodings is $(-1)^S*2^{(E-Ek)}*(1+F/8)$, where S is the sign bit, E is the four bit field, and F is the three bit fraction field. The exponent bias value Ek is equal to 6 in this range.

The next two smaller binades (with lower precisions) have a 5 bit exponent field (E) equal to {00010,00011}. The value of these GFP8 encodings is $(-1)^S*2^{(E-Ek)}*(1+F/4)$, where S is the sign bit, E is the five bit field, and F is the two bit fraction field. The exponent bias value Ek is equal to 8 in this range.

The next two smaller binades (with lower precisions) have a 6 bit exponent field (E) equal to {000010, 000011}. The value of these GFP8 encodings is $(-1)^S*2^{(E-Ek)}*(1+F/2)$, where S is the sign bit, E is the six bit field, and F is the one bit fraction field. The exponent bias value Ek is equal to 10 in this range.

The next three smaller binades (with lower precisions) have a seven bit exponent field (E) is equal to {0000001, 0000010,0000011}. The value of these GFP8 encodings is $(-1)^S*2^{(E-Ek)}*(1)$, where S is the sign bit, E is the seven bit field, and F is the zero bit fraction field. The exponent bias value Ek is equal to 12 in this range.

With continued reference to FIG. 2B, in this exemplary embodiment, there are four additional encodings (out of 256 total) that are allocated to special values. Notably, the value 8'b00000000 represents zero (ZRO). This is the saturation value for positive or negative results that have exponent underflow (EUNFL). The value 8'b10000000 represents not-a-number (NAN). This is the result for an undefined operation. Further, the value 8'b01111111 represents positive infinity (+INF). This is the saturation value for positive results that have exponent overflow (EOVFL). In addition, the value 8'b11111111 represents negative infinity (−INF). This is the saturation value for negative results that have exponent overflow (EOVFL).

FIGS. 1A and 1B illustrate an exemplary embodiment of the data flow and processing of a plurality of multiplier-accumulator circuitry execution pipelines, according to certain aspects of the present inventions, wherein the filter weights or coefficients have an initial data format, applied to format conversion circuitry (GFP conversion circuitry) to convert the filter weights or coefficients having to a Gaussian floating point data format (e.g., a GFP8) which are then stored in memory.

With reference to FIGS. 1A and 1B, the multiply accumulator circuitry receives the filter weights in an initial data format (e.g., a floating point data format—such as FP16, which may have been generated in a host computer), converts the filter weights to Gaussian floating point data format via GFP conversion circuitry. In one embodiment, the format conversion circuitry receives the filter weights in an initial data format (e.g., floating point data format or fixed point data format), generates filter weights having Gaussian floating point data format, and thereafter stores/writes those filter weights into memory (L2, e.g., SRAM). (See FIG. 1A). In another embodiment, the filter weights are initially written into memory (L2, e.g., SRAM), thereafter input into format conversion circuitry wherein the filter weights, having the initial data format, are converted to filter weights, having a Gaussian floating point data format, and thereafter written into memory (L1, e.g., SRAM). (See FIG. 1B).

Notably, with reference to FIG. 3, in one embodiment, L2 memory may be associated with a plurality of MAC clusters (wherein each MAC cluster includes a plurality of MAC pipelines (e.g., associated MAC pipelines)), and L1 memory may be associated with and dedicated to one MAC cluster, and each MAC pipeline of a MAC cluster includes a plurality of MACs (e.g., serially connected MACs (see, e.g., FIG. 1D), wherein each MAC of a MAC pipeline is associated with one, dedicated L0 memory. (See, U.S. Provisional Patent Application 62/012,111, which is hereby incorporated by reference herein).

In one embodiment, L2, L1 and L0 are separate and distinct SRAM memories. As noted above, however, although the exemplary embodiments include a plurality of memories (e.g., L3 memory, L2 memory, L1 memory, L0 memory) which are assigned, allocated and/or used to store certain data and/or in certain organizations, one or more of memories may be added, and/or one or more memories may be omitted and/or combined/consolidated (e.g., L3 omitted, the L1 memory and L0 memory combined, or L1 or L0 omitted), and/or the organizations may be changed, supplemented and/or modified. The inventions are not limited to the exemplary embodiments of the memory organization and/or allocation set forth in the exemplary embodiments of the application.

FIG. 4A illustrates, in block diagram form, an exemplary embodiment of circuitry or process/software of the logical block diagram illustrated in FIGS. 1A and 1B employed to convert the filter weights or coefficients having the initial format (in this exemplary embodiment, FP16 format) to filter weights having a Gaussian floating point data format (in this exemplary embodiment, GFP8 having a sign bit, a three bit exponent field, and a four bit fraction field). FIGS. 4B and 4C illustrate, in circuit block diagram form, an exemplary embodiment of the block diagram illustrated in FIG. 4A. Notably, with respect to FIGS. 4A-4C, hardware and software implementations/embodiments, and/or data and/or instructions embodied in various computer-readable media are intended to fall within the scope of the present inventions. Indeed, in one embodiment, FP-GFP conversion processes illustrated in FIG. 4A may be implemented "offline" (not in situ or during performance of the data processing circuitry) as part of a training process (generally), and—as such, may have more relaxed performance constraints.

With continued reference to FIGS. 4A-4C, in one embodiment, the Gaussian floating point (GFP) conversion circuitry is configurable (e.g., in this exemplary embodiment between GFPx, GFPy, GFPz wherein each configuration includes a different number of bits in the exponent field and a different number of bits in the fraction field from the other configurations—for example, an 8 bit GFP is configurable between GFP8x (2 bit exponent field, 5 bit fraction field), GFP8y (3 bit exponent field, 4 bit fraction field), GFP8z (4 bit exponent field, 3 bit fraction field)). Thus, the GFP conversion circuitry includes a plurality of selectable configurations of the data format (via control signals SELx, SELy, SELz), each configuration including different precision and range relative to the other configurations. It should be noted, however, in one embodiment, the GFP conversion circuitry may include circuitry to convert the filter weights that is not selectable or dynamically configurable wherein the conversion is fixed (i.e., the number of bits in the exponent field and the number of bits of the fraction field are fixed or not programmable, configurable and/or selectable).

Briefly, with reference to FIGS. 4A-4C, the FP16 floating point operand of the filter weight is received in the top register with the 16 bit values "SklmnopqrABCDEFG". The "S" bit is the sign, "klmnopqr" are the eight exponent bits, and "ABCDEFG" are the seven fraction bits. The "klmnopqr" exponent bits are added to 8'b10000000 (the logical inversion of the FP16 exponent bias—which, in this embodiment, is configurable/programmable (e.g., in situ and/or at power-up/initialization) wherein the exponent bias value is a function of the FP16 bias value and the center value that is configured/programmed for the GFP format) with a carry-in of 1'b1. This produces a two's complement exponent EXP[7:0], which is aliased to the bits "KLMNOPQR". The bit "J" is the logical inversion of the "K" bit.

With reference to FIG. 4B, in this exemplary embodiment, there are also a set of control signals (labeled, SELx, SELy, SELz) which are configurable and one-hot encoded to select one of the three Gaussian floating point data formats (i.e., labeled GFP8x, GFP8y and GFP8z; or, in an abbreviated form, labeled as GFP8xyz) floating point data formats for the output of the GFP conversion circuitry. The "JKLMNOPQR" exponent bits are accepted by a three bit three-to-one multiplexer controlled by the three control signals (SELx, SELy, SELz) which select or enable one of the data formats—GFP8x, GSF8y and GFP8z, respectively. Here, the multiplexer/shift circuitry generates a three bit right shift value RS[2:0]. (See, right-shift circuitry of FIG. 4C). The "JK" exponent bits and "ABCDEFG" fraction bits are accepted by a seven bit three-to-one multiplexer controlled by the three control signals (SELx, SELy, SELz). The multiplexer generates a seven bit data value D[6:0].

The data value D[6:0] is shifted right by zero to seven bit places, according to the RS[2:0] value. (See, right-shift circuitry of FIG. 4C). The fill bits for the right shift are the "J" value. The lost bits could optionally be used to round the Q[6:0] result (not shown in this example—this could be added, if necessary). The data result is Q[6:0], and has the sign bit S appended to the most-significant bit position. This is the correctly merged sign, exponent and fraction field for the (GFP8x/GFP8y/GFP8z) result when the FP16 operand is a numeric value.

With continued reference to FIG. 4B, in this exemplary embodiment, there are two sets of eight bit three-to-one multiplexers controlled by the three control signals (SELx, SELy, SELz). These generate the exponent underflow threshold EUNFLth and exponent overflow threshold EOVFLth for the selected (GFP8x/GF8Py/GFP8z) result format. These threshold values are compared to the EXP[7:0] two's complement threshold. Notably, the eight bit exponent value wraps, so in an alternative embodiment, the threshold detection may be performed on the EXP[7:0] value; or the exponent field EXP[7:0] may, in one embodiment, be sign-extended to nine bits.

With continued reference to FIG. 4B, there is a decode circuit, on the left side of the circuit diagram, which detects four special values (ZRO, NAN, +INF, −INF) of the FP16 operand and responsively generates control signals based thereon. The control signals (plus the EUNFL and EOVFL control signals) are employed to adjust a set of three 2-to-1 multiplexers so that the proper special value is generated for the final result (GFP8x, GFP8y, GFP8z, or, in abbreviated form, GFP8xyz).

With reference to FIGS. 1A, 1B, 3, 5A and 6B, in one embodiment, "m" (e.g., 64 in the illustrative embodiment) MAC processing elements in the execution pipeline perform multiply and accumulate operations whereby the processing elements perform m×m (e.g., 64×64) multiply-accumulate operations in a data format different from Gaussian floating point. Briefly, in operation, input pixel/data (Do—e.g., 64) are output from memory into the circuitry of the execution pipeline. In addition, filter weights or coefficients are output from memory (illustrated, in this embodiment, as L1) into format conversion circuitry, which converts or translates the data format of the filter weights from the Gaussian floating point data format into a data format that is employed for the multiplication operation (e.g., FP16) which are, then provided to the execution pipeline during performance of the multiply and accumulate operations.

Briefly, in this exemplary embodiment, the execution or processing pipelines shift-in new input pixels/data (e.g., 64) and shift-out previous output pixels/data (purple) during the same m (e.g., 64) cycle interval. Notably, each m (e.g., 64) cycle interval processes a Dd/Yd (depth) column of input and output pixels/data at a particular (i,j) location (the indexes for the width Dw/Yw and height Dh/Yh dimensions). The m (e.g., 64) cycle execution interval is repeated for each of the Dw*Dh depth columns for this stage.

With continued reference to FIGS. 5A and 5B, in this exemplary embodiment, the filter weights or weight data, after conversion into the data format that is employed by the multiply-accumulate circuitry to implement the multiply operations via the format conversion circuitry (see Gkl-to-Fkl Conversion Circuitry), are written into or stored in memory (e.g., the L0 memory—e.g., SRAM). As mentioned above, in one embodiment, L1 memory may be associated with and dedicated to a plurality of MAC pipelines, and each MAC pipeline includes a plurality of MACs (e.g., serially connected MACs (see, e.g., FIG. 1D). The L0 memory may be associated with and dedicated to a particular MAC of a given MAC pipeline, wherein each MAC or a plurality of MACs (a subset of MACs of the MAC pipeline) are associated with one, dedicated L0 memory.

In one particular example, m=64 and the input stage has Dw=512, Dh=256, and Dd=128, and the output stage has Yw=512, Yh=256, and Yd=64. Note, 64 of the 128 Dd input planes are processed in each 64×64 MAC execution step. Notably, the present inventions may employ or implement aspects of the circuitry, architectures and integrated circuits that facilitate pipelining of the multiply and accumulate operations, as described and/or illustrated in U.S. patent application Ser. No. 16/545,345, filed on Aug. 20, 2019. Again, the '345 application is incorporated by reference herein in its entirety.

With continued reference to FIGS. 5A and 5B, the data processing flow illustrated may accommodate arbitrary image/data plane dimensions (Dw/Yw and Dh/Yh) by simply adjusting the number of iterations of the basic m×m MAC accumulation operation that are performed. The loop indices "I" and "j" are adjusted by control and sequencing logic circuitry to implement the dimensions of the image/data plane. Moreover, the data processing flow or method may also be adjusted and/or extended to handle a Yd column depth larger than the number of MAC processing elements (e.g., 64 in this illustrative example) in the execution pipeline. In one embodiment, this may be implemented by dividing the depth column of output pixels into blocks of 64, and repeating the 64×64 MAC accumulation of FIGS. 5A and 5B for each of these blocks.

Indeed, the data processing flow or method illustrated in FIGS. 5A and 5B may be further extended to handle a Dd column depth larger than the number of MAC processing elements (64 in this illustrative example) in the execution pipeline. This may be implemented, in one embodiment, by initially performing a partial accumulation of a first block of 64 of the input pixels Dijk into each output pixel Yijl. Then, on a second operation step, these partial accumulation values Yijl are read back into the execution pipeline as initial values for a continuing accumulation of the next block of 64 input pixels Dijk into each output pixel Yijl. The memory which stores or holds the continuing accumulation values (e.g., L2 memory) may be organized, partitioned and/or sized to accommodate any extra read/write bandwidth to support the operation.

In one exemplary embodiment, the 64-MAC execution pipeline receives the 64×64 Fkl filter weights (after data format conversion via the Gkl-to-Fkl conversion circuitry) and are input into the 64 L0 SRAMs (there is one L0 SRAM in each of the 64 MACs). In each execution cycle, 64 Fkl filter weight values are read from L0 memories and input into the MACs. The Dijk data values are held in one MAC during the 64 execution cycles after being loaded from the Dijk shifting chain. In one exemplary embodiment, the data format of the filter weights are converted, via format conversion circuitry (Gkl-to-Fkl Conversion Circuitry), from a GFP data format to a floating data (FP) format (e.g., FP16) and, thereafter, input into the MACs.

In this embodiment, before the filter weights or coefficients are written into memory that is directly accessible by the multiplier-accumulator circuitry of the execution or processing pipelines (e.g., L0 memory—e.g., SRAM), the filter weights, which are in the Gaussian floating point data format are converted to filter weights having a data format that is consistent with the format of the multiply-accumulate circuitry of the processing pipeline(s). With reference to FIGS. 5A and 5B, Gkl-to-Fkl conversion circuitry, in one embodiment, converts the data format of the filter weights having a Gaussian floating point data format to filter weights (Fkl) having a floating point data format, such as, for example, FP16 (at times, here and in the figures, identified as "FP" or "FPxx" "xx" indicates/reflects an exemplary data width). Here, the conversion circuitry is disposed before the memory (L0 memory) that is directly accessible by the multiplier-accumulator circuitry of the processing pipelines which performs the multiply and accumulate operations—for example, logically disposed between the L1 memory and L0 memory so that the filter weights are converted when the filter weights are read from L1 memory and written to L0 memory (which is directly accessible by the MACs of the MAC pipeline).

Notably, the Yijlk MAC values will be rotated through all 64 processing elements (MACs) during the 64 execution cycles after being loaded from the Yijk shifting chain and will be unloaded with the same shifting chain. Here, FIGS. 5A and 5B illustrates the looping performed by the control and sequencing logic associated with the MAC execution pipeline. This looping shows the accumulation of the products of Dijk input pixels and Fkl filter values into partial sums Yijl. In this embodiment, the partial sums Yijl are then accumulated into the final output pixel values Yijl.

With continued reference to FIG. 5A, in one embodiment, the processing stage utilizes additional 64-MAC execution pipelines in parallel to operate concurrently on other pixels/data (i,j) of the input frame or data layers. In this embodiment, additional L2 memory ports may be employed (e.g., by dividing, segmenting or splitting the L2 memory across multiple physical SRAM blocks). Here, the concurrent MAC execution pipeline operation duplicates the weight data (labeled as Fkl) across the memory (e.g., L0 memory) in the parallel execution pipelines. Notably, in the exemplary embodiment illustrated in FIG. 5A, the input stage has Dw=512, Dh=256, and Dd=128, and the output stage has Yw=512, Yh=256, and Yd=64.

FIG. 6A illustrates, in block diagram form, circuitry and processes/software of the logical block diagram employed to convert the data format conversion of filter weights, having a Gaussian floating point, to filter weights having a data format that is consistent with the processing circuitry of the MAC (in this exemplary embodiment, floating point data format—specifically, FP16). FIG. 6B illustrates, in circuit block diagram form, an exemplary embodiment of the functional block diagram illustrated in FIG. 6A. In one embodiment, the Gkl-to-Fkl conversion circuitry, having a Gkl-to-Fkl data format conversion circuit, is associated with and dedicated to a MAC processing pipeline (i.e., a plurality or all of the MAC of the pipeline). In another embodiment, a Gkl-to-Fkl data format conversion circuit of the data format conversion circuitry is associated with and dedicated to one MAC of the MAC processing pipeline. Notably, with respect to FIGS. 6A and 6B, hardware and software implementations/embodiments, and/or data and/or instructions embodied in various computer-readable media are intended to fall within the scope of the present inventions.

With reference to FIGS. 6A and 6B, in one embodiment, the Gkl-to-Fkl conversion circuitry includes a plurality of conversion paths (in this illustrative embodiment, 3 conversion paths)—each path pertaining to one of the configurations of the data format established or selected in the GFP conversion circuitry (SELx/GFP8x, SELy/GFP8y, SELz/GFP8z). It should be noted, however, the Gkl-to-Fkl conversion circuitry, in one embodiment, may include circuitry to convert the filter weights from only one fixed configuration (i.e., where the number of bits in the exponent field and the number of bits of the fraction field are fixed)—a data format configuration that is consistent with or correlates to the GFP conversion circuitry. The input filter weights (regardless of configuration) are collectively labeled or designated as "GFP8xyz" to, for example, represent the filter weights input into the format conversion circuitry (Gkl-to-Fkl conversion circuitry)—regardless of the actual configuration Gaussian floating point data format of the input filter weights.

With continued reference to FIG. 6B, the Gkl-to-Fkl conversion circuitry, in this exemplary embodiment, receives the GFP8xyz operand in the center register with the 8 bit values "SABCDEFG". The "S" bit is the sign, and "ABCDEFG" are the seven exponent/fraction bits. There are also a set of three control signals (SELx, SELy, SELz) which are one-hot encoded to select one of the three GFP8xyz floating point data formats correlating to the particular Gaussian floating point data format of the input filter weights.

The seven bits "ABCDEFG" are passed to a set of five 2-to-1 multiplexers each eight bits wide. These form a selection tree for sorting the seven bits "ABCDEFG" into four buses of widths three, one, one, and three bits.

These four buses are accepted by an eight bit three-to-one multiplexer controlled by the three control signals (SELx, SELy, SELz). As noted above, these control signals are configurable/programmable and one-hot encoded to select one of the Gaussian floating point data formats. It generates an eight bit coded exponent value. This coded value is inverted by the "A" bit of the original GFP8xyz operand, and the FP16 exponent bias is added to exponent bias value Ek. As noted above, the exponent bias value is a function of the FP16 bias value and the center value that is configured for the GFP format. The result EXP[7:0] is the correct FP16 exponent when the GFP8xyz operand is a numeric value.

These four buses are also accepted by a five bit three-to-one multiplexer controlled by the three control signals (SELx, SELy, SELz). It generates a five bit fraction value. This fraction value has 2'b00 appended to the least-significant positions to create a seven bit fraction value FRAC[1:7]. The hidden/implicit bit would be FRAC[0], but it is not needed for this conversion operation. The result FRAC[1:7] is the correct FP16 fraction when the GFP8xyz operand is a numeric value. The decode circuit on the right side of the FIG. 6B detects the four special values (ZRO, NAN, +INF, −INF) of the GFP8xyz operand and generates control signals in response to such detection(s). The control signals are employed to adjust a set of three 2-to-1 multiplexers so that the proper special value is generated for the final FP16 fields (S, E[7:0], F[1:7]).

Briefly, with reference to FIG. 7, the number space of the floating point data format (here, FP16) includes minimum and maximum exponent E[7:0], which are reserved for special operands (NAN, INF, DNRM, ZERO). A NAN value is generated when an undefined operation takes place (0*∞ or ∞−∞). The ±INF values are the saturation value for exponent overflow. The ±ZRO values are the saturation value for exponent underflow. The ±DNRM values provide for gradual underflow between the smallest NRM value and the ZRO value.

The floating point data format may utilize an exponent field E[7:0] with a bias of 127. A signed-magnitude numeric format is used for the sign field S and fraction field F[1:7]. Here, the fraction field F[1:7] has a most-significant weight of 0.5, and a hidden (implicit) bit F[0] with a weight of 1.0 is added (i.e. normalized fraction). A de-normalized fraction option DNRM is used with the minimum E[7:0] exponent value of 8'h00 and with no hidden (implicit) bit F[0].

As mentioned above, in one embodiment, the GFP-to-FP format conversion of the G-to-F circuitry reads and/or receives the filter weights (e.g., from memory), having a Gaussian floating point data format, and converts the data format of the filter weights to a floating point data format. The format conversion circuitry thereafter writes/stores the filter weight, having the floating point data format, in L0 memory (e.g., SRAM). (See, FIGS. 5A, 5B, 6A and 6B). In one embodiment, the filter coefficients are converted, via Gkl-to-Fkl conversion circuitry, from a Gaussian floating point data format (e.g., 8 bit) to a floating point data format (16 bit). Thereafter, the filter coefficients, having the floating point data format, are output to or read by the multiplier-accumulator circuitry in connection with the multiply and accumulate operations of the multiplier-accumulator circuitry which processes image data.

With reference to FIGS. 8A and 8B, in another embodiment, the filter coefficients, having a Gaussian floating point data format, are read from memory (in the illustrative embodiment, L0 memory), and output to the data format conversion circuitry (Gkl-to-Fkl conversion circuitry) which converts the filter coefficient from the Gaussian floating point data format to a data format that correlates to the data format of the MAC (e.g., floating point data format or fixed point data format). The data format conversion circuitry, in this embodiment, outputs the converted filter weights directly to the multiplier-accumulator circuitry whereby the MACs employ the filter weights, having the floating point data format or fixed point data format, in the multiply operations to process the input data (e.g., image data). In this embodiment, the Gkl-to-Fkl conversion circuitry converts filter weights, having a Gaussian floating point data format (e.g., 8 bit), "on-the-fly" to filter weights having, for example, a floating point data format (e.g., 16 bit) or fixed point data format (e.g., BSF format) depending on, for example, the data format of the multiply processing by the multiplier-accumulator circuitry.

With continued reference to FIGS. 8A and 8B, the format conversion circuitry is disposed between the multiplier-accumulator circuitry and memory (specifically, L0 memory in this embodiment). Notably, the format conversion circuitry may be implemented in the same manner as described above and illustrated in FIGS. 6A and 6B.

Thus, the data format conversion of the filter weights from Gaussian floating point to floating point data format or fixed point data format (e.g., block-scaled fraction (BSF) format which is suitable to employ Winograd processing techniques) may be performed between memory L1 and memory L0 (see, e.g., FIGS. 5A and 5B) and memory L0 and the multiplier-accumulator circuitry (see, e.g., FIGS. 8A and 8B), Indeed, in one embodiment, data format conversion of the filter weights from Gaussian floating point to floating point data format or fixed point data format may be performed between memory L2 and memory L1 (see FIGS. 13A and 13B).

In another embodiment, the processing circuitry may include an architecture/circuitry to process the input data in n×n data blocks, which are n×n (e.g., 3×3) blocks of associated input data (e.g., image data). Here, the input data is organized into a plurality of groups of a plurality of associated input data. In this embodiment, the filter weights are also organized into a plurality of groups of a plurality of associated filter weights (e.g., 3×3) block of filter weights. For example, in one embodiment, the filter coefficients, having an initial data format, may be generated by a host computer or processor and stored in memory (e.g., L3 memory such as DRAM or L2 memory such as SRAM). The initial data format may be an integer format (e.g., 8 bit) or floating point data format (e.g., 16 bit or 32 bit). The filter weights having the initial data format may be input into format conversion circuitry (GFP conversion circuitry—see FIGS. 1A and 1B) to generate filter coefficients having a Gaussian floating point data format (e.g., 8 bits). Thereafter, the filter coefficients, having a GFP data format, may be written to and stored in memory (e.g., L2 memory and/or L1 memory).

The data processing pipeline may, thereafter, organize or group pluralities of associated filter coefficients, each filter coefficient having a Gaussian floating point data format. In one embodiment, the associated filter coefficients include groups 9 or 16 filter coefficients, consistent with the group size of input data, wherein each group may be organized in a 3×3 matrix or 4×4 matrix, again consistent with the blocks of associated input data (e.g., image data). Here, each group of input data are concurrently processed, via the multiplier-accumulator circuitry, using an associated group of filter coefficients.

For example, with reference to FIGS. 9A-9C, the execution pipeline (having a plurality of MACs) may concurrently process a plurality of associated input data/values (e.g., nine or sixteen input data/values wherein the associated input data/values may be arranged in, input into the processing circuitry and/or employed as a matrix (e.g., a 3×3 or a 4×4) in conjunction with a plurality of associated filter weights (e.g., nine or sixteen values, which may also be arranged in, input into the processing circuitry and/or employed as a matrix (e.g., a 3×3 or a 4×4). The groups of filter coefficients, having a Gaussian floating point data format, are stored in memory (e.g., L1 memory) and thereafter input into the data format conversion circuitry wherein the data format of the filter coefficients are converted from a Gaussian floating point data format to a floating point data format or a fixed point data format—as discussed above in connection with other embodiments.

In one embodiment, the input data is processed concurrently in groups wherein each group includes a plurality of associated input data (16 associated input data in each group wherein each group may be arranged in and/or employed as a 4×4 matrix) using Winograd processing techniques. In this embodiment, a plurality of associated filter coefficients or weights are also arranged in or employed by and/or input into the processing circuitry in groups (e.g., 16 filter coefficients in each group wherein each group may be arranged in and/or employed as a 4×4 matrix)). Here, each group of input data/values is processed, via Winograd processing techniques and circuitry, using an associated group of associated filter weights. For example, the multiplier-accumulator circuitry of the present inventions may implement Winograd processing techniques to process the input data (e.g., image data) using filter weights, in a Winograd format, which may have a fixed point data format or a floating point data format—via circuitry, architectures, functions processes and operations of the multiplier-accumulator execution pipelines implementing Winograd processing techniques that are described and/or illustrated in U.S. Non-Provisional patent application Ser. No. 16/796,111 and/or U.S. Provisional Patent Application No. 62/823,161. In addition thereto, or in lieu thereof, the multiplier-accumulator circuitry of the present inventions may implement Winograd processing techniques (including the circuitry, structures, architectures, function and operation of the multiplier-accumulator execution pipelines implementing Winograd processing techniques) to process the image data described and/or illustrated in U.S. Non-Provisional patent application Ser. No. 17/031,631 and/or U.S. Provisional Patent Application No. 62/909,293. The aforementioned four (4) patent applications are incorporated herein by reference (i.e., the '111 application, '161 application, '631 application and '293 application).

Indeed, in embodiment, the filter weights, having a Gaussian floating point data format, may include a sign, a value and an exponent (e.g., 8 bits in total). Where the filter weights are organized into groups, wherein each group includes a plurality of filter weights, and each filter weight includes an exponent field and fraction field, the exponent field (and value therein), in one embodiment, may be common to all of the associated filter coefficients. In this embodiment, the memory allocation or footprint associated with group of filter weights facilitates a greater precision or range. Here, the present inventions may use the circuitry and techniques described and/or illustrated in U.S. patent application Ser. No. 17/074,670 and U.S. Provisional Patent Application No. 62/930,601 to, for example, enhance the dynamic range of the filter weights or coefficients by using a common exponent associated with a group of filter weights (e.g., 9-3×3 or 16-4×4) wherein the input data associated with such group of filter weights is processed as a group together with the associated filter weights. Notably, the '670 and '601 applications are incorporated herein by reference in their entirety.

Notably, where the image processing implements a Winograd processing technique, the Gkl-to-Fkl conversion circuitry converts the Gaussian floating point data format (e.g., 8 bit) to a block-scaled fraction format (e.g., BSF12), thereafter converted to a Winograd data format, and, in one embodiment, then to a floating point data format—wherein the multiplier-accumulator circuitry may implement Winograd processing techniques to process the image data, for example, as described and/or illustrated in the aforementioned four (4) patent applications (i.e., the '111 application, '161 application, '631 application and '293 application).

In one embodiment, the Gaussian floating point data format of the filter weights is dynamically configurable, via control circuitry (which may be fully or partially external to the one or more integrated circuits (e.g., in a host computer or processor) or internal/resident thereon). For example, while maintaining the total number of bits assigned to or available for each filter weight (e.g., 8 bits), the Gaussian floating point data format of the filter weights may be dynamically configured or modified between a plurality of configurations—for example, a first configuration (having a first precision and a first range) to a second configuration (having a second precision and a second range). That is, the precision of the filter weights may be modified (e.g., increased by using, assigning or designating more of the total number of bits (e.g., 8 bits) for the fraction value) and/or the range of the filter weights may be modified (e.g., increased by using, assigning or designating more of the total number of bits (e.g., 8 bits) for the exponent value) to, for example, modify and/or improve the filtering operation based on the particular characteristics of the filter weights (e.g., the range of the filter weights). Thus, the configuration of the Gaussian floating point data format of the filter weights having a fixed number of data bits (e.g., 8) may be constituted, changed or set between a plurality of configurations—for example, controlling, adjusting and/or changing number of bits assigned to (i) the fraction value and/or (ii) the exponent value—wherein each configuration of the Gaussian floating point data format of the filter weights has the same total number of bits and/or the same or relatively the same storage footprint/allocation in memory.

With reference to FIG. 10A, the range and precision of each configuration may be controlled or adjusted by modifying or changing the allocation of the total number of bits (which is fixed between the plurality of configurations) of the Gaussian floating point data format of the filter weights between (i) the fraction value and (ii) the exponent value. In this exemplary illustrative embodiment, an 8 bit GFP data format may include a first configuration of GFP8x which includes 5 fraction bits and 2 exponent bits, a second configuration of GFP8y which includes 4 fraction bits and 3 exponent bits, or a third configuration of GFP8z which includes 3 fraction bits and 4 exponent bits. In this exemplary embodiment, each 8 bit GFP data format configuration offers different ranges and different precisions than the other configurations. Notably, the data width of the filter weights is not limited to 8 bits; moreover, where the data width of the filters is greater than 8 bits (e.g., GFP10, GFP12 or GFP16), more configurations of the filter weights are available and may be employed.

With continued reference to FIG. 10A, exemplary alternative Gaussian floating point data formats (GFP8x, GF8Py, GFP8z) are illustrated depicting range and precision which may be configured, for example, dynamically, to, for example, provide a better or more suitable fit to the correlated input data values. Briefly, the range and precision of the GFP8y data format is described in detail above (see FIGS. 2A and 2B, and text associated therewith). The GFP8x data format includes the center two binades (−1 to +1) and it has one more bit of precision (5 bits) than the GFP8y data format. Like GFP8y data format, the precision of the GFP8x data format falls off symmetrically. There are zero bits of precision (a single value) in the binade from −5 to −6 and at the binade at +5. The GFP8z data format includes the center eight binades (−4 to +4) and it has one less bit of precision (3 bits) than the GFP8y data format. The precision of the GFP8x data format also format falls off symmetrically—wherein there are zero bits of precision (a single value) in the binades from −19 to −12 and in the binades from +12 to +18.

In particular, with reference to FIG. 10B, the GFP8x format includes a 1 bit sign field (S), a 2 bit exponent field (E), and a 5 bit fraction field (F). The GFP8x data format include field sizes for the binades having a maximum precision (relative to the other illustrative configurations of 8 bit GFP format). The other binades increase the number of bits in the exponent field (E) and will reduce the number of bits of the fraction field (F). This will reduce the precision of the other binades. The total number of bits of the GFP8x value (8 bits) remains constant across the range.

The GFP8x binades with maximum precision are in the two center columns of FIG. 10B—the 2 bit exponent field (E) is equal to 101, and 10). The value of these GFP8x encodings is $(-1)^S*2^{(E-Ek)}*(1+F/32)$, where S is the sign bit, E is the 2 bit field, and F is the 5 bit fraction field. Note, there is a hidden/implicit bit with a value of 1 that is always added to the fraction field.

With continued reference to FIGS. 10A and 10B, the exponent bias value Ek is equal to two in this range. The two exponent field values {01, and 10} will create scaling values of {$2^{(-1)}, 2^{(0)}$}. This exponent bias value is configurable. Changing it will change the center-point of the GFP8x range of binade values. The exponent bias values for all the binades should be changed together so that no gap regions or overlap regions are introduced between the binade ranges.

The column on the upper right of FIG. 10B illustrates the next larger binade (with lower precision). The 3 bit exponent field (E) is equal to {110}. The value of these GFP8x encodings is $(-1)^S*2^{(E-Ek)}*(1+F/16)$, where S is the sign bit, E is the 3 bit field, and F is the 4 bit fraction field. The exponent bias value Ek is equal to 5 in this range.

With continued reference to FIGS. 10A and 10B, the next larger binade (with lower precision) has a 4 bit exponent field (E) equal to {1110} The value of these GFP8x encodings is $(-1)^S*2^{(E-Ek)}*(1+F/8)$, where S is the sign bit, E is the 4 bit field, and F is the 3 bit fraction field. The exponent bias value Ek is equal to 12 in this range.

The next larger binade (with lower precision) has a 5 bit exponent field (E) equal to {11110} The value of these GFP8x encodings is $(-1)^S*2^{(E-Ek)}*(1+F/4)$, where S is the sign bit, E is the 5 bit field, and F is the 2 bit fraction field. The exponent bias value Ek is equal to 27 in this range.

The next larger binade (with lower precisions) has a 6 bit exponent field (E) equal to {111110}. The value of these GFP8x encodings is $(-1)^S*2^{(E-Ek)}*(1+F/2)$, where S is the sign bit, E is the 6 bit field, and F is the 1 bit fraction field. The exponent bias value Ek is equal to 54 in this range.

With continued reference to FIGS. 10A and 10B, the next larger binade (with lower precisions) has a 7 bit exponent field (E) equal to {1111110}. The value of this GFP8x encodings is $(-1)^S*2^{(E-Ek)}*(1)$, where S is the sign bit, E is the 7 bit field, and F is the zero bit fraction field. The exponent bias value Ek is equal to 121 in this range.

The column on the lower left of FIG. 10B illustrates the next smaller binade (with lower precisions). The 3 bit exponent field (E) is equal to {001}. The value of these GFP8x encodings is $(-1)^S*2^{(E-Ek)}*(1+F/16)$, where S is the sign bit, E is the 3 bit field, and F is the 4 bit fraction field. The exponent bias value Ek is equal to 3 in this range.

The next smaller binade (with lower precision) has a 4 bit exponent field (E) equal to {0001}. The value of these GFP8x encodings is $(-1)^S*2^{(E-Ek)}*(1+F/8)$, where S is the sign bit, E is the 4 bit field, and F is the 3 bit fraction field. The exponent bias value Ek is equal to 4 in this range.

The next smaller binade (with lower precision) has a 5 bit exponent field (E) equal to {00001}. The value of these GFP8x encodings is $(-1)^S*2^{(E-Ek)}*(1+F/4)$, where S is the sign bit, E is the 5 bit field, and F is the 2 bit fraction field. The exponent bias value Ek is equal to 5 in this range.

With continued reference to FIGS. 10A and 10B, the next smaller binade (with lower precision) has a 6 bit exponent field (E) is equal to {000001}. The value of these GFP8x encodings is $(-1)^S*2^{(E-Ek)}*(1+F/2)$, where S is the sign bit, E is the 6 bit field, and F is the 1 bit fraction field. The exponent bias value Ek is equal to 6 in this range.

The next smaller binade (with lower precision) has a 7 bit exponent field (E) equal to {0000001}. The value of this GFP8x encodings is $(-1)^S*2^{(E-Ek)}*(1)$, where S is the sign bit, E is the 7 bit field, and F is the zero bit fraction field. The exponent bias value Ek is equal to 7 in this range.

This completes a summary of the 252 encodings used for numeric values as illustrated in FIG. 10B. There are four additional encodings (out of 256 total) that are allocated to special values. The value 8'b00000000 represents zero (ZRO). This is the saturation value for positive or negative results that have exponent underflow (EUNFL). The value 8'b10000000 represents not-a-number (NAN). This is the result for an undefined operation. The value 8'b01111111 represents positive infinity (+INF). This is the saturation value for positive results that have exponent overflow (EOVFL). The value 8'b11111111 represents negative infinity (-INF). This is the saturation value for negative results that have exponent overflow (EOVFL).

With reference to FIG. 10C, the GFP8z format includes a 1 bit sign field (S), a 4 bit exponent field (E), and a 3 bit fraction field (F). These field sizes provide for the binades with maximum precision (relative to the other illustrative configurations of 8 bit GFP format). The other binades increase the number of bits in the exponent field (E) and will reduce the number of bits of the fraction field (F). This will reduce the precision of these other binades. The total number of bits of the GFP8z value (8 bits) will remain constant across the range.

With reference to FIGS. 10A and 10C, the GFP8z binades with maximum precision are in the two center columns of FIG. 10C—the 4 bit exponent field (E) is equal to {0100, 0101, 0110, 0111, 1000, 1001, 1010, and 1011}. The value of these GFP8z encodings is $(-1)^S*2^{(E-Ek)}*(1+F/8)$, where S is the sign bit, E is the 4 bit field, and F is the 3 bit fraction field. Note that there is a hidden/implicit bit with a value of one that is always added to the fraction field.

The exponent bias value Ek is equal to 8 in this range. The four exponent field values {0100, 0101, 0110, 0111, 1000, 1001, 1010, and 1011} will create scaling values of {$2^{(-4)}$, $2^{(-3)}$, $2^{(-2)}$, $2(-1)$, $2^{(0)}$, $2^{(+1)}$, $2^{(+2)}$, $2^{(+3)}$, $2^{(+4)}$}. This exponent bias value is configurable. Changing it will change the center-point of the GFP8z range of binade values. The exponent bias values for all the binades should be changed together so that no gap regions or overlap regions are introduced between the binade ranges.

The column on the upper right of FIG. 10C illustrates the next 4 larger binades (with lower precisions). The 5 bit exponent field (E) is equal to {11000, 11001, 11010, 11011}. The value of these GFP8z encodings is $(-1)^S*2^{(E-Ek)}*(1+F/4)$, where S is the sign bit, E is the 5 bit field, and F is the 2 bit fraction field. The exponent bias value Ek is equal to 20 in this range.

With continued reference to FIGS. 10A and 10C, the next 4 larger binades (with lower precisions) have a 6 bit exponent field (E) equal to {111000, 111001, 111010, 111011}. The value of these GFP8z encodings is $(-1)^S*2^{(E-Ek)}*(1+F/2)$, where S is the sign bit, E is the 6 bit field, and F is the 1 bit fraction field. The exponent bias value Ek is equal to 48 in this range.

The next 8 larger binades (with lower precisions) have a 7 bit exponent field (E) equal to {1111000 thru 1111110}. The value of these GFP8z encodings is $(-1)^S*2^{(E-Ek)}*(1)$, where S is the sign bit, E is the 7 bit field, and F is the zero bit fraction field. The exponent bias value Ek is equal to 108 in this range. Although not illustrated, the final 7 encodings {1111000 thru 1111110} could have a 6 bit exponent and a 1 bit fraction.

The column on the lower left of FIG. 10C illustrates the next four smaller binades (with lower precisions). The 5 bit exponent field (E) is equal to {00100, 00101, 00110, 00111}. The value of these GFP8z encodings is $(-1)^S*2^{(E-Ek)}*(1+F/4)$, where S is the sign bit, E is the 5 bit field, and F is the 2 bit fraction field. The exponent bias value Ek is equal to 12 in this range.

With continued reference to FIGS. 10A and 10C, the next four smaller binades (with lower precisions) have a 6 bit exponent field (E) equal to {000100, 000101, 000110, 000111}. The value of these GFP8z encodings is $(-1)^S*2^{(E-Ek)}*(1+F/2)$, where S is the sign bit, E is the six bit field, and F is the one bit fraction field. The exponent bias value Ek is equal to 16 in this range.

The next 7 smaller binades (with lower precisions) have a seven bit exponent field (E) is equal to {0000001 thru 0000111}. The value of these GFP8z encodings is $(-1)^S*2^{(E-Ek)}*(1)$, where S is the sign bit, E is the seven bit field, and F is the zero bit fraction field. The exponent bias value Ek is equal to 20 in this range. Again, although not illustrated, the final 7 encodings {0000001 thru 0000111}, in one embodiment, may have a 6 bit exponent and a 1 bit fraction.

This completes a summary of the 252 encodings used for numeric values as illustrated in FIG. 10C. There are, however, four additional encodings (out of 256 total) that are allocated to special values. The value 8'b00000000 represents zero (ZRO). This is the saturation value for positive or negative results that have exponent underflow (EUNFL). The value 8'b10000000 represents not-a-number (NAN). This is the result for an undefined operation. The value 8'b01111111 represents positive infinity (+INF). This is the saturation value for positive results that have exponent overflow (EOVFL). The value 8'b11111111 represents negative infinity (-INF). This is the saturation value for negative results that have exponent overflow (EOVFL).

With reference to FIGS. 10A and 11, in contrast to exemplary Gaussian floating point data formats, the precisions of an 8 bit integer data format (INT8—see solid line) and an 8 bit floating point data format (FP8—see dotted line) do not fall off symmetrically in the manner of the precisions of the exemplary Gaussian floating point data formats. In this regard, the INT8 data format includes a seven binade range for positive values and a seven binade range for negative values—the two ranges are approximately symmetric; as such, only the positive range is illustrated in FIG. 11. Although the range is symmetric, the precision (fraction or mantissa of a numeric data format) is not and is somewhat like a LOG 2 of the number of representable values within each binade (notably, a binade is a 2×range). Moreover, the range versus precision of an INT8 data format is the stairstep function shown.

Further, FP8 data format includes a six binade range for positive values and a six binade range for negative values—the two ranges are symmetric; as such, only the positive range is illustrated in FIG. 11. The range versus precision of FP8 is flat at 4 bits across this six binade range. The range at the lower end of the 8 bit floating point data format may be extended by three binades using DNRMs (with a stairstep precision)—however, this may be a reasonable approach with a standard eight bit exponent (like FP16, with 254 binades of range), although that may not be the case in the context of FP8 with a 3 bit exponent. Notably, the 8 bit floating point data format has a similar structure relative to the FP16 data format (see FIG. 7)—however, the exponent would be reduced by 5 bits and the fraction or mantissa would be reduced by 3 bits.

Control circuitry to implement the programmability (whether dynamic or otherwise) may be partially or entirely resident on the integrated circuit of the processing circuitry or external thereto (e.g., in a host computer or on a different integrated circuit from the MAC circuitry and execution pipelines). With reference to FIG. 12A, control circuitry may control, change or select the configuration of the Gaussian floating point data format of the filter weights. The control signals output by the configuration select circuitry may be applied to the format conversion circuitry to control the format configuration of the conversion of the data format of the filter weights to Gaussian floating point data format. For example, the configuration select circuitry may output control signals SELx, SELy, SELz which control circuitry of the GFP conversion circuitry illustrated in FIGS. 4A and 4B. Similarly, with reference to FIG. 12B, the control signals SELx, SELy, SELz may also control circuitry of the format conversion circuitry of the Gkl-to-Fkl conversion circuitry illustrated in FIGS. 6A and 6B and, as such, the conversion of the data format of the filter weights from Gaussian floating point data format to a format employed by the multiply-accumulate circuitry to implement the data processing (in the illustrative embodiment, floating point data format). In one embodiment, the control circuitry of FIGS. 12A and 12B are the same circuitry.

As noted above, the configuration of the Gaussian floating point data format may be user or system defined and/or may be one-time programmable (e.g., at manufacture) or more than one-time programmable (e.g., (i) at or via power-up, start-up or performance/completion of the initialization sequence/process sequence, and/or (ii) in situ (i.e., during operation of the integrated circuit), at manufacture, and/or at or during power-up, start-up, initialization, re-initialization, configuration, re-configuration or the like. In one embodiment, control circuitry may evaluate the input data and, based thereon, implement or select a configuration of the Gaussian floating point data format to narrow/broaden the range and/or increase/decrease the precision of the resultant multiplication—with little to no change in the total number of bits (e.g., 8 bits, 16 bits, etc.) of each filter weights and/or storage allocation therefor. In response, the conversion circuitry may receive configuration instruction signals from internal or external circuitry (i.e., external to the one or more integrated circuits-for example, a host computer/processor) including one or more data storage elements (e.g., one or more memory cells, register, flip-flop, latch, block/array of memory), one or more input pins/conductors, a look-up table LUT (of any kind), a processor or controller and/or discrete control logic. The conversion circuitry, in response thereto, may employ such signal(s) to implement the selected/defined configuration (e.g., in situ and/or at or during power-up, start-up, initialization, re-initialization, configuration, re-configuration or the like) of the data format of the Gaussian floating point filter weights.

Notably, an advantage of the programmability of the configuration of the Gaussian floating point data format is the ability to select, control and/or improve the trade-off between range and precision of the image filter coefficient values in light of input data values—which may reduce rounding error and saturation error of the multiply operations of image data processing operations performed by the multiply-accumulate circuitry. Thus, the flexibility and programmability of implementing or controlling the configuration of the Gaussian floating point data formats (in this exemplary embodiment, GFP8x, GF8Py, GFP8z), in a dynamic manner, facilitates improving the range and precision of the processing, for example, via limiting or reducing rounding and saturation error during imaging processing.

Notably, although not illustrated, where the exponent bias values (Ek) are adjusted for a particular format, in one embodiment, the precision distribution may be shifted to the left or right (of the 0 exponent or binade—see FIG. 2A) to correlate to or match an image data set distribution. Here, although many of the illustrative embodiments reflect an exponent bias value that includes a center-point at zero (e.g., see FIG. 2A—wherein four exponent field values {010, 011, 100, and 101} provides values of {2^(-2), 2(-1), 2^(0), 2^(+1)}), the exponent bias value (Ek) may be programmable or configurable so that the distribution is shifted to the left or right of the binade values at zero. In that way, that GFP format no longer includes a center-point of the GFP range of binade values at zero. Changing exponent bias value (Ek) will change the center-point of the GFP range of binade values—however, it may be advantageous to change the exponent bias values for all the binades together so that no gap regions or overlap regions are introduced between the binade ranges.

Moreover, in one embodiment, two of the configuration formats may be combined, so that the precision distribution is asymmetric about the center point. Again, such an implement may be advantageous in view of the distribution of a particular image data—for example, which may also be asymmetric about a particular the center point or window.

Importantly, although the illustrative and exemplary embodiments hereof are directed to a Gaussian floating point data formats are described in relation to a total number of 8 bits, the present inventions are not limited to a particular total number of bits of the Gaussian floating point data format (e.g., 8 bits). The present inventions may employ Gaussian floating point data formats that are more or less than 8 bits. That is, although the encoding methods/circuitry of the Gaussian floating point data formats are described in relation to a total number of 8 bits, more than 8 bits may be employed—for example, 16 bits, 24 bit, 32 bits, etc. Here, the three different formats may be extended to Gaussian floating point data formats with greater than 8 bits (e.g., GFP16x/GF16Py/GFP16z) which provides more alternatives and differences in trade-off between range and precision (relative to the 8 bit implementation) given the additional 8 bits (relative to GFP8) in the alternative/various configurations of the Gaussian floating point data formats of the filter weights. Similarly, less than 8 bits of the Gaussian floating point data formats of the filter weights may also be implemented. That is, the encoding methods/circuitry of the Gaussian floating point data formats may be employ a total of less than 8 bits—for example, 6 bits.

Moreover, although several of the exemplary embodiments and features of the inventions are described and/or illustrated in the context of certain size or length filter weights or coefficients (e.g., Gaussian floating point data format (GFPxx), floating point data format (FPxx), integer format (INTxx), and fixed point data format (e.g., BSFxx)), the embodiments and inventions are applicable to other formats, precisions and/or lengths. For the sake of brevity, those other formats, precisions or lengths will not be illustrated separately but will be quite clear to one skilled in the art based on, for example, this application. The present inventions are not limited to (i) particular floating point data format(s), particular fixed point data format(s), operations (e.g., addition, subtraction, etc.), block/data width or length, data path width, bandwidths, values, processes and/or algorithms illustrated, nor (ii) the exemplary logical or physical overview configurations, exemplary module/circuitry configuration and/or exemplary Verilog code. Moreover, the present inventions are not limited to conversion of the filter weights to/from Gaussian floating point data format from/to a floating point data format or a fixed point data format. The embodiments set forth herein are merely examples of the present inventions.

In addition, the data format conversion circuitry may also, in addition to converting the data format of the filter weights to and/or from the Gaussian floating point data format (via GFP conversion circuitry and/or Gkl-to-Fkl conversion circuitry), convert, adjust or modify the data width, length or size of the filter coefficients or weights (relative to the width and allocation of the Gaussian floating point data format) and/or the configuration of the data format via allocation of such bits, for example, between the fraction field and exponent field. For example, the filter coefficients or weights, having the Gaussian floating point data format (8 bits), may be converted and/or modified to a block-scaled-fraction format or floating point data format having a data length of the filter coefficients that is different (e.g., 12, 16 or 24 bits).

In addition, the allocation of the bits between fraction and exponent fields, after conversion from Gaussian floating point data format to a new/different data format (e.g., floating point) may also change (e.g., more bits allocated to the fraction field/value and less bits allocated to the exponent field/value—or vice versa). Here, the configuration of the filter weights, having the data format that correlated to the processing circuitry (i.e., after conversion by the Gkl-to-Fkl conversion circuitry) may be dynamically configurable (for example, user definable or system definable)—for example, the precision and the range of the filter weights are configurable via configurable allocation of the number of bits assigned to (i) the fraction field and/or (ii) the exponent field. Such configuration may be implemented and/or controlled in situ and/or upon power-up/initialization. Circuitry (see, e.g., FIGS. 12A and 12B) may control, change or select the configuration of the data format of the filter weights converted by the Gkl-to-Fkl conversion circuitry. The control signals output by the configuration select circuitry may be applied to the format conversion circuitry (Gkl-to-Fkl conversion circuitry) to control the format configuration of the conversion of the data format of the filter weights from a Gaussian floating point data format to a format employed by the multiply-accumulate circuitry to implement the data processing (e.g., floating point or fixed point).

For example, with reference to FIG. 6B, in one embodiment, the precision of the filter weights may be modified (e.g., increased by using, assigning or designating more of the total number of bits (e.g., 16 bits) for the fraction value) and/or the range of the filter weights may be modified (e.g., increased by using, assigning or designating more of the total number of bits (e.g., 16 bits) for the exponent value) to, for example, modify and/or improve the filtering operation based on the particular characteristics of the filter weights (e.g., the range of the filter weights). Thus, the configuration of the floating point data format of the filter weights, output by the GFP-to-FP conversion circuitry of FIG. 6B, may be changed or set between a plurality of configurations—for example, controlling, adjusting and/or changing number of bits assigned to (i) the fraction value and/or (ii) the exponent value—wherein each configuration of the floating point data format of the filter weights has the same total number of bits and/or the same or relatively the same storage footprint/allocation in memory.

Notably, the filter coefficients, having the new/different data format (and the modified data length and/or configuration), may be stored in memory (e.g., L0) and thereafter output to the multiplier-accumulator circuitry of the execution pipeline during implementation or performance of the multiply and accumulate operations. Alternatively, the filter coefficients, having the new/different data format (and the modified data length and/or configuration), may be immediately available (i.e., "on the fly" data format conversion, as discussed herein—see, e.g., FIGS. 8A and 9C) to the multiplier-accumulator circuitry of the execution pipeline in connection with the multiply and accumulate operations during data processing.

In one embodiment, the circuitry of the execution pipelines may concurrently process data to increase throughput of the pipeline. For example, in one implementation, the present inventions may include a plurality of separate multiplier-accumulator circuits (referred to herein (including the text/figures of the applications incorporated by reference), at times, as "MAC") and a plurality of registers (including, in one embodiment, a plurality of shadow registers) that facilitate pipelining of the multiply and accumulate operations wherein the circuitry of the execution pipelines concurrently process data to increase throughput of the pipeline.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

For example, although the illustrative embodiments include multiple memories (e.g., L3 memory, L2 memory, L1 memory, L0 memory), one or more of these memories may be omitted and/or combined/consolidated-for example, the L3 memory or L2 memory. As such, the inventions are not limited to the illustrative embodiments set forth herein.

Moreover, the generation of filter weights having a Gaussian floating point data format may be implemented on-chip/ internal to the integrated circuit including the MAC processing circuitry (e.g., FIGS. 1A, 1B and 3) or off-chip (i.e., external to the integrated circuit including the MAC processing circuitry). Where the filter weights are provided to the integrated circuit in a Gaussian floating point data format (e.g., the GFP conversion circuitry is off-chip/external to the integrated circuit), the L2 memory may store the filter weights more directly from the input data bus of the integrated circuit. For example, a training system may generate filter weights (e.g., FP32 and/or FP16) offline and thereafter convert the filter weights to the Gaussian floating point data format. The filter weights, in the Gaussian floating point data format, may then be provided to the image processing circuitry for storage in memory resident on the integrated circuit. This may allow for a more compact GFP8 to be stored (and moved into and out of) the memories resident on the integrated circuit (e.g., L3 memory, L2 memory, etc.).

Further, the format conversion circuitry to convert the filter weights to the Gaussian floating point data format to a data format employed by the multiply-accumulator circuitry may be implemented between L2 memory and L1 memory (see, Gkl-to Fkl conversion circuitry in FIGS. 13A and 13B). As such, the conversion from Gaussian floating point data format may be implemented, for example, immediately before the filter weights are stored in L1 memory, immediately before the filter weights are stored in L0 memory or immediately before the filter weights are provided to the multiply-accumulator circuitry.

Notably, although in certain embodiments the conversion processes of the format and/or width, length or size of the filter coefficients or weights is described as being implemented in the host computer (e.g., via a processor therein) and/or in the multiplier-accumulator processing circuitry (which includes the execution pipeline for filtering image data via the multiplier-accumulator circuitry), such conversion processes may be partially or fully implemented via circuitry any of the integrated circuits of, for example, the system. All combinations and permutations of which circuitry implements or performs one or more, or all conversion processes are intended to fall within the scope of the present inventions.

Further, in one embodiment, the host computer (including processor) and multiplier-accumulator circuitry are integrated in/on one integrated circuit and/or separate integrated circuits that are electrically interconnected (for example, stacked ICs))—see, for example, FIGS. 14A-14C; in another embodiment, the host computer is connected to a multiplier-accumulator processing circuitry (which includes the execution pipeline for filtering image data via the multiplier-accumulator circuitry)—see, for example, FIG. 14D. All combinations and permutations system architecture, integration and/or interconnection are intended to fall within the scope of the present inventions.

As noted above, the GFP format conversion circuitry, and processes implemented thereby, may be disposed or implemented in the host computer (e.g., via a processor) and/or in discrete logic and/or in an integrated circuitry (e.g., the multiplier-accumulator processing circuitry which includes the execution pipeline for filtering image data via the multiplier-accumulator circuitry). Here, the filter weights or coefficients in an initial format are converted, via the GFP format conversion circuitry, to filter weights or coefficients in a Gaussian floating point data format. As such, the conversion circuitry may be a processor (as properly programmed) that also is employed to calculate/generate the initial filter weights or coefficients (for example, after the learning phase of the start-up or initialization processes of the system).

As noted herein, although the filter weight data format conversion circuitry, in the illustrative exemplary embodiments, describes a bit width of the Gaussian floating point data format or floating point data format, such bit width(s) is/are exemplary. As noted herein, although several of the exemplary embodiments and features of the inventions are described and/or illustrated in the context of certain size or length filter weights or coefficients (e.g., floating point data format (FPxx), integer data format (INTxx), and fixed point data format (e.g., BSFxx) where: xx is an integer and is greater than or equal to 8, 10, 12, 16, 24, etc.), the embodiments and inventions are applicable of other precisions or lengths. For the sake of brevity, those other contexts and precisions will not be illustrated separately but are quite clear to one skilled in the art based on, for example, this application. Thus, the present inventions are not limited to (i) particular Gaussian floating point data format (GFPxx) or floating point data format (FPxx), block/data width, data path width, bandwidths, values, processes and/or algorithms illustrated, nor (ii) the exemplary logical or physical overview configurations of the particular circuitry and/or overall pipeline, and/or exemplary module/circuitry configuration, overall pipeline and/or exemplary Verilog code.

Notably, the present inventions may also be employed or be implemented in conjunction with the circuitry and techniques multiplier-accumulator execution or processing pipelines (and methods of operating such circuitry)—for example, as described and/or illustrated in U.S. Provisional patent application Ser. No. 17/019,212, filed on Sep. 12, 2020, and U.S. Provisional Patent Application No. 62/900,044, filed on Sep. 13, 2019. The '212 and '044 applications are hereby incorporated by reference herein in their entirety.

Moreover, in addition thereto, or in lieu thereof, the present inventions may employ the circuitry, function and operation of logarithmic addition-accumulator circuitry (and methods of operating such circuitry) described and/or illustrated in U.S. patent application Ser. No. 17/092,175, filed Nov. 6, 2020, and U.S. Provisional Patent Application No. 62/943,336, filed on Dec. 4, 2019. That is, the present inventions may be incorporated in or use the circuitry and techniques to process image data as set forth in the '175 and '336 applications, which are hereby incorporated by reference herein in their entirety.

Notably, various circuits, circuitry and techniques disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, circuitry, layout and routing expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits, circuitry and techniques disclosed herein may be represented via simulations using computer aided design and/or testing tools. The simulation of the circuits, circuitry, layout and routing, and/or techniques implemented thereby, may be implemented by a computer system wherein characteristics and operations of such circuits, circuitry, layout and techniques implemented thereby, are imitated, replicated and/or predicted via a computer system. The present inventions are also directed to such simulations of the inventive circuits, circuitry and/or techniques implemented thereby, and, as such, are intended to fall within the scope of the present inventions. The computer-readable media corresponding to such simulations and/or testing tools are also intended to fall within the scope of the present inventions.

For example, in one embodiment, the present inventions are directed to circuitry and/or a method of performing and/or a method of defining or specifying, in a hardware description language (e.g., Verilog) to design circuitry and/or logic that:

performs filtering operations on input data using filter weights wherein the filter weights include:
numeric values are represented in a Gaussian floating point format which includes:
an exponent bit field E
a shared bit field F that is includes additional exponent bits and fraction bits
the shared field F is dynamically configured by the value of the exponent bit field E.

Notably, the floating point format may also include a single bit sign field S. Further, the Gaussian floating point format may include:
a numeric value can be encoded one of at least two floating point formats which have different E and F field sizes, but in which the sum of E+F is the same, and
the set of Eb[E] bias values and the set of Fs[E] scaling values that are used are different for the at least two floating point formats.

Indeed, in one embodiment, the formats that are utilized may include at least two of the following:
a 1st floating point format uses a one bit sign field S, a two bit E field, and a five bit F field (GFP8x),
a 2nd floating point format uses a one bit sign field S, a three bit E field, and a four bit F field (GFP8y), and
a 3rd floating point format uses a one bit sign field S, a four bit E field, and a three bit F field (GFP8z).

Moreover, a value of exponent bit field E and a value of the shared field F specify a special numeric value. Indeed, in one embodiment where the value of exponent bit field E and a value of the shared field F specify a special numeric value, the combination of S field, E field and F field all set to "0" encode the special numeric value of ZERO,
the combination of E field and F field all set to "1" encode the special numeric value of INF, with the S field specifying ±INF, and
the combination of S field set to "1", and E field and F field all set to "0" encode the special numeric value of NAN.

In one embodiment, numeric values are represented in a Gaussian floating point format which includes:
the effective exponent field Ex is formed by concatenating the E field and part of the F field; i.e. $Ex=E//Fx$,
the effective fraction field Fy is formed by the remaining part of the F field, where $F=Fx//Fy$, and
the numeric value of a floating point number is $(-1)^S * 2^{(Ex-Eb[E])} * (1+Fy/Fs[E])$, where the E field value determines the Eb[E] bias value that is used, and also determines the Fs[E] scaling value that is used.

Notably, reference herein to "one embodiment" or "an embodiment" (or the like) means that a particular feature, structure, or characteristic described in connection with the embodiment may be included, employed and/or incorporated in one, some or all of the embodiments of the present inventions. The usages or appearances of the phrase "in one embodiment" or "in another embodiment" (or the like) in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, an embodiment or implementation described herein as "exemplary" is not to be construed as ideal, preferred or advantageous, for example, over other embodiments or implementations; rather, it is intended convey or indicate the embodiment or embodiments are example embodiment(s).

Although the present inventions have been described in certain specific aspects, many additional modifications and variations would be apparent to those skilled in the art. It is therefore to be understood that the present inventions may be practiced otherwise than specifically described without departing from the scope and spirit of the present inventions. Thus, embodiments of the present inventions should be considered in all respects as exemplary and not restrictive.

The terms "comprises," "comprising," "includes," "including," "have," and "having" or any other variation thereof, are intended to cover a non-exclusive inclusion, such that a process, method, circuit, article, or apparatus that comprises a list of parts or elements does not include only those parts or elements but may include other parts or elements not expressly listed or inherent to such process, method, article, or apparatus. Further, use of the terms "connect", "connected", "connecting" or "connection" herein should be broadly interpreted to include direct or indirect (e.g., via one or more conductors and/or intermediate devices/elements (active or passive) and/or via inductive or capacitive coupling)) unless intended otherwise (e.g., use of the terms "directly connect" or "directly connected").

The terms "a" and "an" herein do not denote a limitation of quantity, but rather denote the presence of at least one of the referenced item. Further, the terms "first," "second," and the like, herein do not denote any order, quantity, or importance, but rather are used to distinguish one element/circuit/feature from another.

In addition, the term "integrated circuit" means, among other things, any integrated circuit including, for example, a generic or non-specific integrated circuit, processor, controller, state machine, gate array, SoC, PGA and/or FPGA. The term "integrated circuit" also means any integrated circuit (e.g., processor, controller, state machine and SoC)—including an embedded processor, controller, state machine, PGA and/or FPGA.

Further, the term "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like).

Notably, the limitations of the claims are not written in means-plus-function format or step-plus-function format. It is applicant's intention that none of the limitations be interpreted pursuant to 35 USC § 112, ¶6 or § 112(f), unless such claim limitations expressly use the phrase "means for" or "step for" followed by a statement of function and is void of any specific structure.

What is claimed is:

1. An integrated circuit comprising:
a multiplier-accumulator execution pipeline to receive (i) input data and (ii) filter weights, wherein the multiplier-accumulator execution pipeline includes a plurality of multiplier-accumulator circuits to process the input data, using associated filter weights, via a plurality of multiply operations and a plurality of accumulate operations;
first memory to store filter weights having a Gaussian floating point data format and a first bit length;
data format conversion circuitry, (i) having inputs connected to outputs of the first memory, to receive the filter weights having the Gaussian floating point data format and the first bit length, and (ii) coupled to inputs of the multiplier-accumulator execution pipeline, wherein the data format conversion circuitry further includes:
a data format conversion circuit, coupled to the inputs of the data format conversion circuitry, to receive the filter weights having the Gaussian floating point data format and the first bit length, to convert the filter weights from the Gaussian floating point data format and the first bit length to filter weights having a data format and a bit length that are different from the Gaussian floating point data format and the first bit length, and
outputs, coupled to the inputs of the multiplier-accumulator execution pipeline, to output the filter weights having the data format and the bit length that are different from the Gaussian floating point data format and the first bit length, respectively; and
wherein, in operation, the multiplier-accumulator circuits of the multiplier-accumulator execution pipeline are configured to perform the plurality of multiply operations using (a) the input data and (b) the filter weights having the data format and the bit length that are different from the Gaussian floating point data format and the first bit length, respectively.

2. The integrated circuit of claim 1 wherein:
the data format that is different from the Gaussian floating point data format is a floating point data format.

3. The integrated circuit of claim 1 wherein the Gaussian floating point data format spans a numeric range and is characterized by a numeric precision that varies within the numeric range, the numeric precision being maximized at a center value within the numeric range and progressively declining along the numeric range in either direction from the center value.

4. The integrated circuit of claim 1 further including:
second memory, coupled to the outputs of data format conversion circuitry, to receive and store the filter weights having the data format and the bit length that are different from the Gaussian floating point data format and the first bit length, wherein, in operation, the multiplier-accumulator circuits of the multiplier-accumulator execution pipeline receive, from the second memory, the filter weights having the data format and the bit length that are different from the Gaussian floating point data format and the first bit length.

5. The integrated circuit of claim 1 further including:
a plurality of second memories coupled to the outputs of data format conversion circuitry and configured to receive and store the filter weights having the data format and the bit length that are different from the Gaussian floating point data format and the first bit length, wherein, in operation, the multiplier-accumulator circuits of the multiplier-accumulator execution pipeline receive, respectively from the plurality of second memories, the filter weights having the data format and the bit length that are different from the Gaussian floating point data format and the first bit length.

6. The integrated circuit of claim 1 wherein:
the data format that is different from the Gaussian floating point data format is a fixed point data format.

7. An integrated circuit comprising:
a multiplier-accumulator execution pipeline to receive (i) input data and (ii) filter weights, wherein the multiplier-accumulator execution pipeline includes a plurality of multiplier-accumulator circuits to process the input data, using associated filter weights, via a plurality of multiply operations and a plurality of accumulate operations;
first memory to store the filter weights having a first data format and a first bit length;
first data format conversion circuitry, coupled to outputs of the first memory, (i) to receive the filter weights having the first data format and the first bit length, and, in operation, (ii) to convert the filter weights from the first data format and the first bit length to a Gaussian floating point data format having a second bit length;
second memory, coupled to outputs of the first data format conversion circuitry, to receive and store the filter weights having the Gaussian floating point data format and the second bit length;

second data format conversion circuitry, coupled to inputs of the multiplier-accumulator execution pipeline, including:
  inputs coupled to outputs of the second memory to receive the filter weights having the Gaussian floating point data format and the second bit length,
  a Gaussian floating point format conversion circuit, coupled to the inputs of the second data format conversion circuitry, to convert the filter weights from the Gaussian floating point data format and the second bit length to a floating point data format having a bit length that is different from the second bit length, and
  outputs, coupled to the inputs of the multiplier-accumulator execution pipeline, to output the filter weights having the floating point data format and the bit length that is different from the second bit length; and
wherein, in operation, the multiplier-accumulator circuits of the multiplier-accumulator execution pipeline are configured to perform the plurality of multiply operations using (a) the input data and (b) the filter weights having the floating point data format and the bit length that is different from the second bit length.

8. The integrated circuit of claim 7 further including:
third memory, coupled to the outputs of the second data format conversion circuitry, to receive and store the filter weights having the floating point data format and the bit length that is different from the second bit length, wherein, in operation, the multiplier-accumulator circuits of the multiplier-accumulator execution pipeline receive the filter weights having the floating point data format and the bit length that is different from the second bit length from the third memory.

9. The integrated circuit of claim 7 further including:
a plurality of third memories, coupled to the outputs of the second data format conversion circuitry, is configured to receive and store the filter weights having the floating point data format and the bit length that is different from the second bit length, wherein, in operation, the multiplier-accumulator circuits of the multiplier-accumulator execution pipeline receive the filter weights, having the floating point data format and the bit length that is different from the second bit length, from an associated third memory of the plurality of third memories.

10. The integrated circuit of claim 7 wherein:
the Gaussian floating point data format includes an exponent field having a bit length and a fraction field having a bit length, and
the first data format conversion circuitry further includes configuration circuitry to, in response to configuration control signals, define the bit length of the exponent field and the bit length of the fraction field of the Gaussian floating point data format output by the first data format conversion circuitry, wherein the configuration control signals determine the configuration of the Gaussian floating point data format of the filter weights output by the first data format conversion circuitry between a plurality of configurations of the Gaussian floating point data format, each configuration having a different bit length of the exponent field and the bit length of the fraction field.

11. The integrated circuit of claim 10 wherein:
the configuration circuitry of the first data format conversion circuitry is more than one-time programmable to responsively define the bit length of the exponent field and the bit length of the fraction field of the Gaussian floating point data format.

12. The integrated circuit of claim 11 wherein:
the configuration circuitry of the first data format conversion circuitry is more than one-time programmable in situ or during initialization.

13. The integrated circuit of claim 10 wherein:
the Gaussian floating point format conversion circuit of the second data format conversion circuitry converts the filter weights from the Gaussian floating point data format and the second bit length to the floating point data format having the bit length that is different from the second bit length using the configuration control signals which define the bit length of the exponent field and the bit length of the fraction field of the configuration of the Gaussian floating point data format.

14. An integrated circuit comprising:
a multiplier-accumulator execution pipeline to receive (i) input data and (ii) filter weights, wherein the multiplier-accumulator execution pipeline includes a plurality of multiplier-accumulator circuits to process the input data, using associated filter weights, via a plurality of multiply operations and a plurality of accumulate operations;
first memory to store the filter weights having a first data format and a first bit length;
first data format conversion circuitry, coupled to outputs of the first memory, (i) to receive the filter weights having the first data format and the first bit length, and, in operation, (ii) to convert the filter weights from the first data format and the first bit length to a Gaussian floating point data format having a second bit length;
second memory, coupled to outputs of the first data format conversion circuitry, to receive and store the filter weights having the Gaussian floating point data format and the second bit length;
second data format conversion circuitry, coupled to inputs of the multiplier-accumulator execution pipeline, including:
  inputs to receive filter weights of a plurality of sets of filter weights, wherein each set of filter weights includes a plurality of associated filter weights wherein each associated filter weight includes the Gaussian floating point data format and the second bit length,
  Gaussian floating point format conversion circuit, coupled to the inputs of the second data format conversion circuitry, to convert the plurality of associated filter weights of each set of filter weights from the Gaussian floating point data format and the second bit length to a data format and a bit length that are different from the Gaussian floating point data format and the second bit length, respectively, and
  outputs, coupled to the inputs of the multiplier-accumulator execution pipeline, to output each filter weight having the data format and the bit length that are different from the Gaussian floating point data format and the second bit length, respectively; and
wherein, in operation, the multiplier-accumulator circuits of the multiplier-accumulator execution pipeline are configured to perform the plurality of multiply operations using (a) the input data and (b) the plurality of associated filter weights of each set of filter weights having the data format and the bit length that are different from the Gaussian floating point data format and the second bit length, respectively.

15. The integrated circuit of claim 14 further including: third memory, coupled to the outputs of the second data format conversion circuitry, to receive and store the plurality of associated filter weights of each set of filter weights having the data format and the bit length that are different from the Gaussian floating point data format and the second bit length, respectively, wherein, in operation, the multiplier-accumulator circuits of the multiplier-accumulator execution pipeline receive the plurality of associated filter weights of each set of filter weights from the third memory.

16. The integrated circuit of claim 14 further including: a plurality of third memories, coupled to the outputs of the second data format conversion circuitry, is configured to receive and store the plurality of associated filter weights of each set of filter weights having the data format and the bit length that are different from the Gaussian floating point data format and the second bit length, respectively, wherein, in operation, the multiplier-accumulator circuits of the multiplier-accumulator execution pipeline receive the plurality of associated filter weights of each set of filter weights from an associated third memory of the plurality of third memories.

17. A method of operation within an integrated circuit device having multiply-accumulate circuitry, first data format conversion circuitry, second data format conversion circuitry, first storage circuitry and second storage circuitry, the method comprising:
receiving a plurality of filter weights from the first storage circuitry, each of the filter weights having a first data format and a first bit length;
converting within the first data format conversion circuitry, each of the filter weights having the first data format and the first bit length to a filter weight having a Gaussian floating point data format and a second bit length;
storing, within the second storage circuitry, each of the filter weights having the Gaussian floating point data format and the second bit length;
converting within the second data format conversion circuitry, each of the filter weights having the Gaussian floating point data format and the second bit length to a filter weight having a floating point data format and a third bit length, the third bit length being different from the second bit length; and
executing a plurality of multiply and accumulate operations within the multiply-accumulate circuitry, including multiplying input data with the filter weights having the floating point data format and the third bit length.

18. The method of claim 17 wherein the third bit length is at least twice the second bit length.

19. The method of claim 17 wherein each of the filter weights having the Gaussian floating point data format includes an exponent field constituted by a first number of bits and a fraction field constituted by a second number of bits, the method further comprising programming one or more values within a configuration register to set the first number of bits and the second number of bits.

20. The method of claim 19 wherein programming the one or more values within the configuration register to set the first number of bits and the second number of bits comprises programming the one or more values within the configuration register more than once during operation of the integrated circuit device.

\* \* \* \* \*